(12) United States Patent
Yamazaki

(10) Patent No.: US 9,859,117 B2
(45) Date of Patent: Jan. 2, 2018

(54) OXIDE AND METHOD FOR FORMING THE SAME

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 45 days.

(21) Appl. No.: 14/740,560

(22) Filed: Jun. 16, 2015

(65) Prior Publication Data
US 2016/0118254 A1 Apr. 28, 2016

(30) Foreign Application Priority Data

Oct. 28, 2014 (JP) .................. 2014-218907
Oct. 28, 2014 (JP) .................. 2014-218908
Dec. 11, 2014 (JP) .................. 2014-250574

(51) Int. Cl.
*H01L 21/02* (2006.01)
*C23C 14/08* (2006.01)
(Continued)

(52) U.S. Cl.
CPC ........ *H01L 21/02631* (2013.01); *C23C 14/08* (2013.01); *C23C 14/086* (2013.01);
(Continued)

(58) Field of Classification Search
CPC ......... H01L 21/02631; H01L 21/02554; H01L 21/02565; C23C 14/08; C23C 14/086;
(Continued)

(56) References Cited

U.S. PATENT DOCUMENTS

| 5,528,032 A | 6/1996 | Uchiyama |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

International Search Report (Application No. PCT/IB2015/054337) dated Oct. 6, 2015.

(Continued)

*Primary Examiner* — Mark Kopec
*Assistant Examiner* — Danny N Kang
(74) *Attorney, Agent, or Firm* — Fish & Richardson P.C.

(57) ABSTRACT

An oxide that can be used for a semiconductor in a transistor or the like is formed. After a sputtering gas is supplied to a deposition chamber, a plasma including ions of the sputtering gas in the vicinity of a target. The ion of the sputtering gas is accelerated and collides with a target, so that flat-plate particles and atoms included in the target are separated from the target. Surfaces of the plurality of flat-plate particles are negatively charged in plasma. One of the flat-plate particles negatively charged is deposited with a surface facing a substrate. Another flat-plate particle is deposited in a region apart from the one flat-plate particle over the substrate while repelling the one flat-plate particle. An atom and an aggregate of atoms are inserted in a gap between the one flat-plate particle and the another flat-plate particle and grow in the lateral direction in the gap between the flat-plate particles, so that the gap between the one flat-plate particle and the another flat-plate particle is filled.

21 Claims, 51 Drawing Sheets

(51) Int. Cl.
- *H01J 37/32* (2006.01)
- *C23C 14/58* (2006.01)
- *C23C 14/34* (2006.01)
- *C23C 14/35* (2006.01)
- *C23C 14/56* (2006.01)
- *H01J 37/34* (2006.01)

(52) U.S. Cl.
CPC .......... *C23C 14/3414* (2013.01); *C23C 14/35* (2013.01); *C23C 14/566* (2013.01); *C23C 14/5806* (2013.01); *H01J 37/345* (2013.01); *H01J 37/3408* (2013.01); *H01L 21/02554* (2013.01); *H01L 21/02565* (2013.01)

(58) Field of Classification Search
CPC ... C23C 14/3414; C23C 14/35; C23C 14/566; H01J 37/3408; H01J 37/345
USPC ....................................................... 252/500
See application file for complete search history.

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,202,365 B2 | 6/2012 | Umeda et al. |
| 8,274,078 B2 | 9/2012 | Itagaki et al. |
| 8,293,661 B2 | 10/2012 | Yamazaki |
| 8,319,218 B2 | 11/2012 | Yamazaki et al. |
| 8,492,758 B2 | 7/2013 | Yamazaki et al. |
| 8,530,285 B2 | 9/2013 | Yamazaki et al. |
| 8,669,556 B2 | 3/2014 | Yamazaki et al. |
| 8,748,215 B2 | 6/2014 | Yamazaki |
| 8,765,522 B2 | 7/2014 | Yamazaki |
| 8,871,565 B2 | 10/2014 | Yamazaki et al. |
| 8,987,728 B2 | 3/2015 | Honda et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0180217 A1* | 9/2004 | Inoue ................... C23C 14/086 428/432 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0062436 A1 | 3/2011 | Yamazaki et al. |
| 2011/0127579 A1* | 6/2011 | Yamazaki ......... H01L 21/02472 257/192 |
| 2012/0153364 A1 | 6/2012 | Yamazaki et al. |
| 2012/0261657 A1 | 10/2012 | Takahashi et al. |
| 2012/0267622 A1 | 10/2012 | Yamazaki et al. |
| 2012/0312681 A1 | 12/2012 | Yamazaki et al. |
| 2013/0009147 A1 | 1/2013 | Koyama et al. |
| 2013/0153889 A1 | 6/2013 | Yamazaki et al. |
| 2014/0001032 A1 | 1/2014 | Yamazaki |
| 2014/0021036 A1 | 1/2014 | Yamazaki |
| 2014/0042014 A1 | 2/2014 | Yamazaki |
| 2014/0042018 A1 | 2/2014 | Yamazaki |
| 2014/0042674 A1 | 2/2014 | Yamazaki |
| 2014/0045299 A1 | 2/2014 | Yamazaki |
| 2014/0097428 A1 | 4/2014 | Yamazaki |
| 2014/0102877 A1 | 4/2014 | Yamazaki |
| 2014/0145183 A1 | 5/2014 | Yamazaki |
| 2014/0183527 A1 | 7/2014 | Yamazaki et al. |
| 2014/0299873 A1 | 10/2014 | Yamazaki |
| 2014/0346500 A1 | 11/2014 | Yamazaki |

(56) References Cited

U.S. PATENT DOCUMENTS

| | | |
|---|---|---|
| 2015/0034475 A1 | 2/2015 | Yamazaki |
| 2015/0034947 A1 | 2/2015 | Yamazaki et al. |
| 2015/0107988 A1 | 4/2015 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 4415062 | 2/2010 |
| JP | 2010-177431 | 8/2010 |
| JP | 4571221 | 10/2010 |
| JP | 2011-135064 A | 7/2011 |
| JP | 2014-129590 A | 7/2014 |
| TW | 201140700 | 11/2011 |
| WO | WO97/06554 | 2/1997 |
| WO | WO-2004/114391 | 12/2004 |
| WO | WO2008/133345 | 11/2008 |
| WO | WO-2011/065210 | 6/2011 |

OTHER PUBLICATIONS

Written Opinion (Application No. PCT/IB2015/054337) dated Oct. 6, 2015.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, 2957-2959.

Dembo.H et al., "RFCPUS on Glass and Plastic Substrates Fabricated by TFT Transfer Technology", IEDM 05: Techical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technology Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317 ECS.

Kimizuka.N. et al., "Spinel,YbFe2O4, and Yb2Fe3O7 Types of Structures for Compounds in the In2O3 and Sc2O3—A2O3-Bo Systems [A; Fe, Ga, or Al; B: Mg, Mn, Fe, Ni, Cu, or Zn]at Temperatures Over 1000° C.", Journal of Solid State Chemistry, 1985, vol. 60, 382-384.

Kimizuka.N. et al., "Syntheses and Single-Crystal Data of Homologous Compounds, In2O3(ZnO)m (m=3, 4, and 5), InGaO3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IgZo Oxide TFT", SID Digest D8 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn-Oxide TFTs With a Novel Passivation Layer"SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GiZo (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IgZo Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Yamazaki.S et al., "Back-channel-etched thin-film transistor using c-axis-aligned crystal In—Ga—Zn oxide", Journal of the Society for Information Display, 2014, vol. 22, No. 1, pp. 55-67.

(56) References Cited

OTHER PUBLICATIONS

Yamazaki.S et al., "Properties of crystalline In—Ga—Zn-oxide semiconductor and its transistor characteristics", Japanese Journal of Applied Physics, 2014, vol. 53, No. 04ED18-1-04ED18-10.

Yamazaki.S et al., "Back-channel-etched thin-film transistor using c-axis-aligned crystal In—Ga—Zn oxide", Journal of the Society for Information Display, 2014.

Kamiya.T et al., "Electron-Beam-Induced Crystallization of Amorphous In—Ga—Zn—O Thin Films Fabricated by UHV Sputtering", IDW '13 : Proceedings of the 20th International Display Workshops, 2013, pp. 280-281.

Yamazaki.S, "Crystalline Oxide Semiconductor Using CAAC-IGZO and its Application", ECS Transactions, 2014, vol. 64, No. 10, pp. 155-164.

Hosemann. R, "Crystalline and Paracrystalline Order in High Polymers", Journal of Applied Physics, 1963, vol. 34, No. 1, pp. 25-41.

\* cited by examiner

FIG. 1A
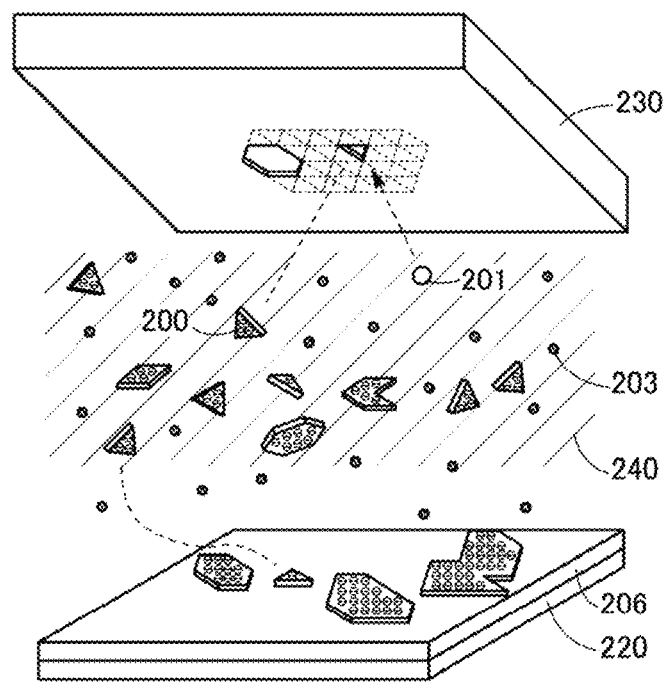
FIG. 1B
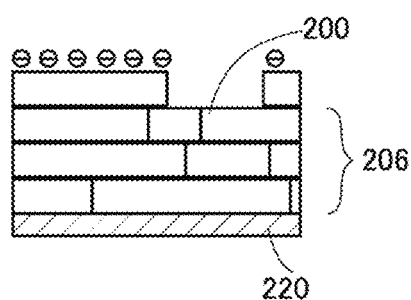
FIG. 1C
FIG. 1D
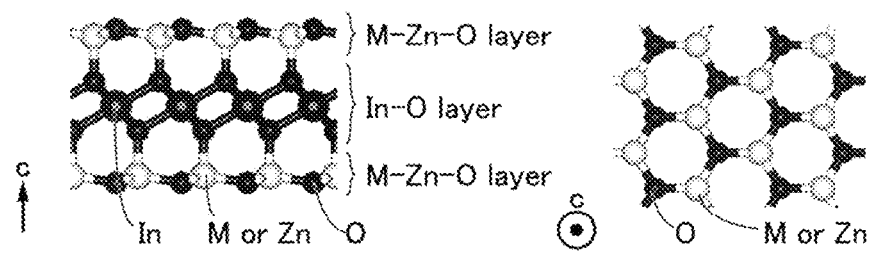

crystal structure of InMZnO4

FIG. 9A
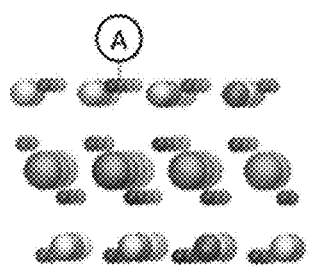
FIG. 9B
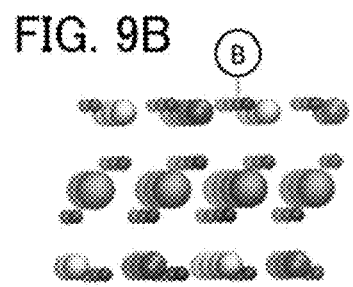
FIG. 9C
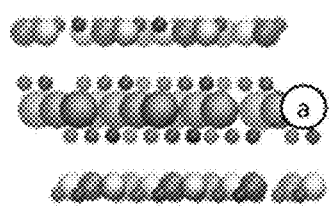
FIG. 9D
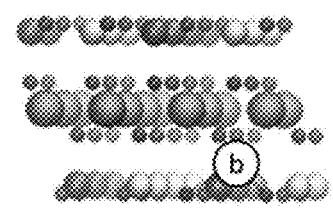
FIG. 9E
FIG. 9F
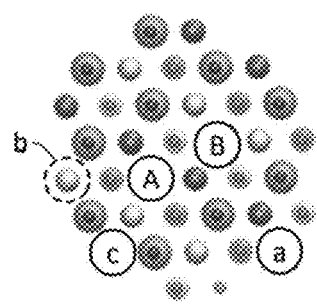
FIG. 9G
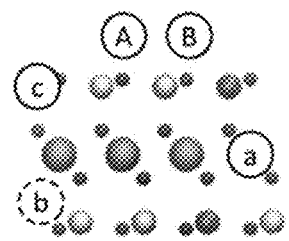
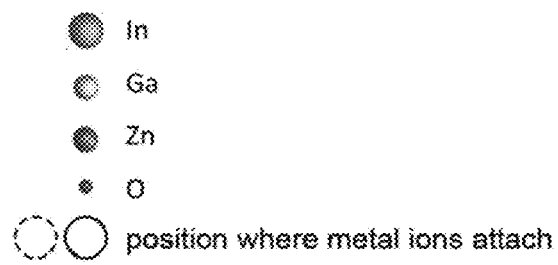

- In
- Ga
- Zn
- O
- position where metal ions attach

FIG. 15A
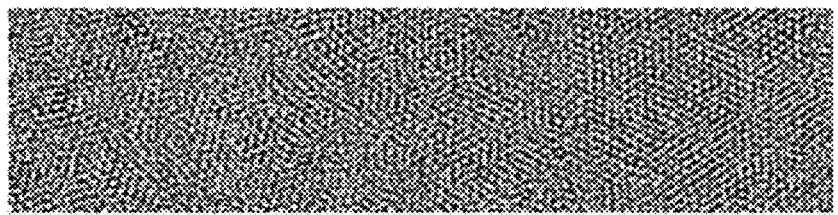
FIG. 15B
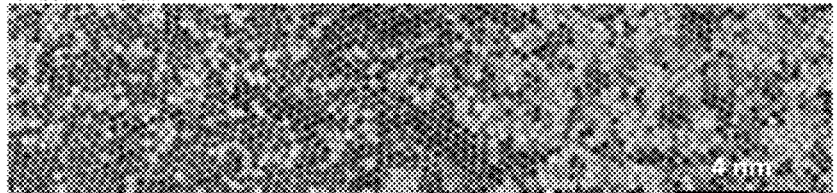
FIG. 15C 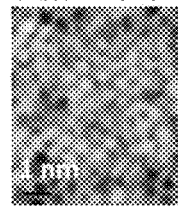 FIG. 15D 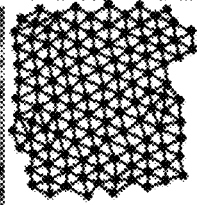 FIG. 15E 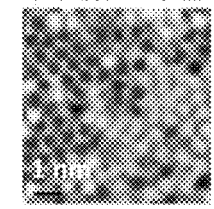 FIG. 15F 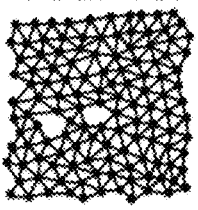
FIG. 15G
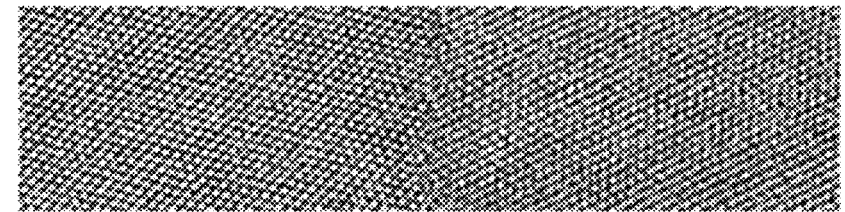
FIG. 15H
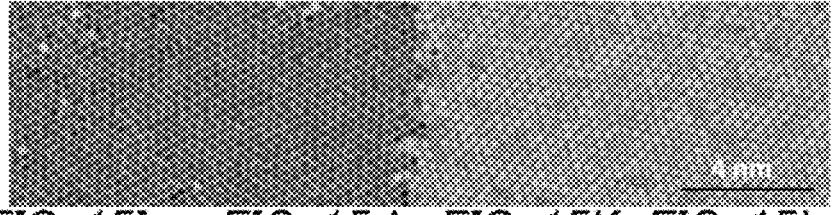
FIG. 15I  FIG. 15J 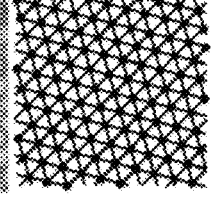 FIG. 15K 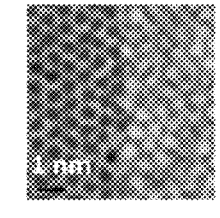 FIG. 15L 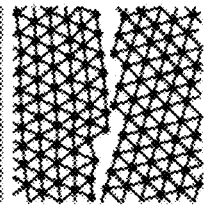
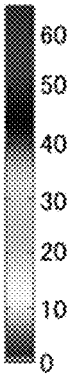

CAAC-OS nc-OS probe diameter
1 nm probe diameter
10 nm probe diameter
20 nm probe diameter
30 nm probe diameter
1 nm probe diameter
1 nm

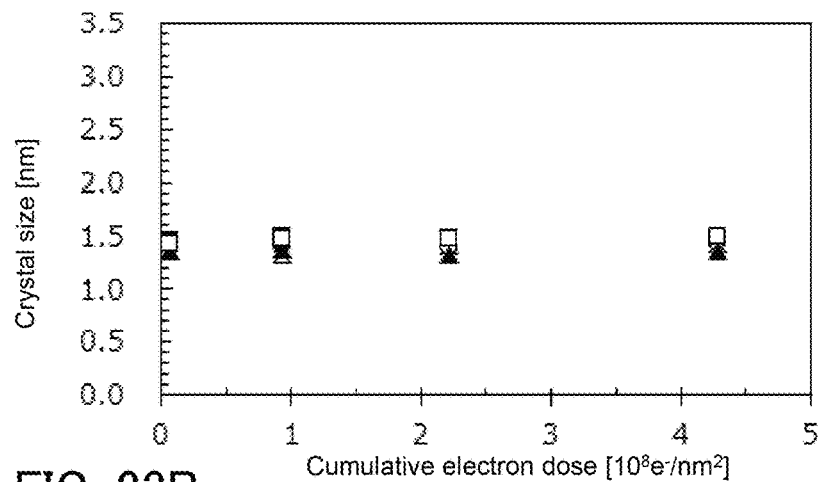
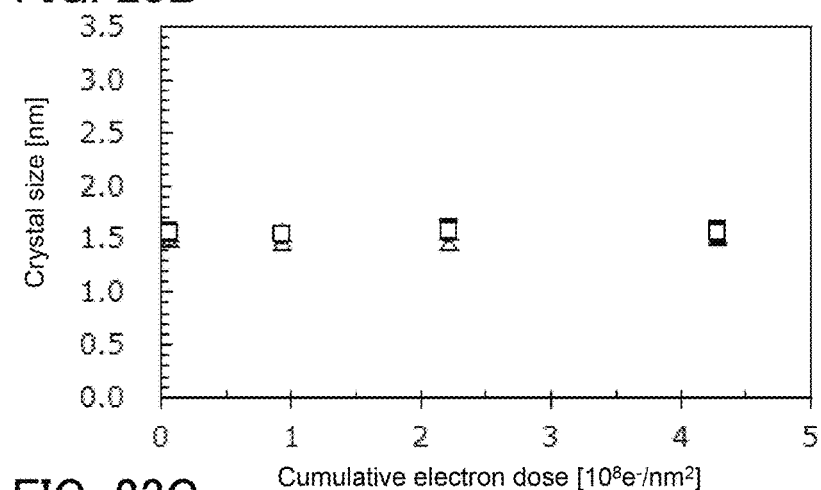
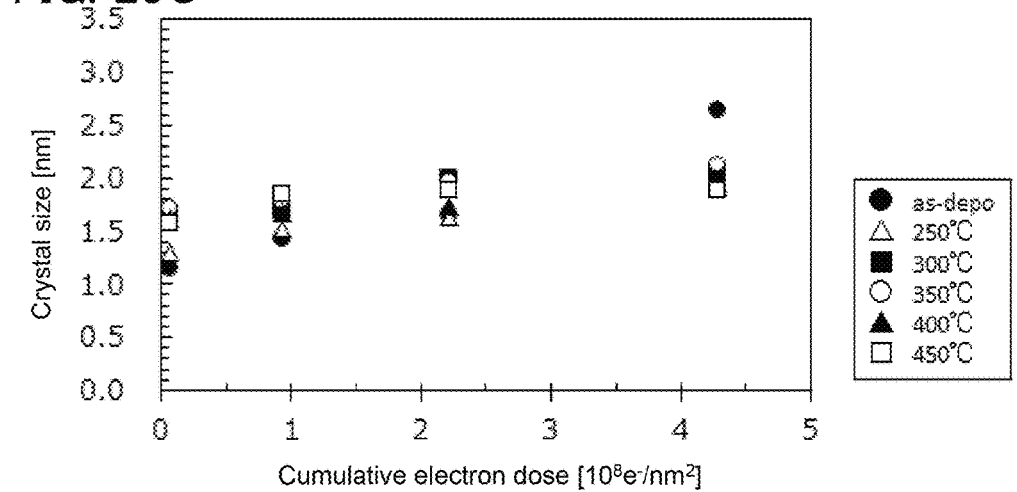

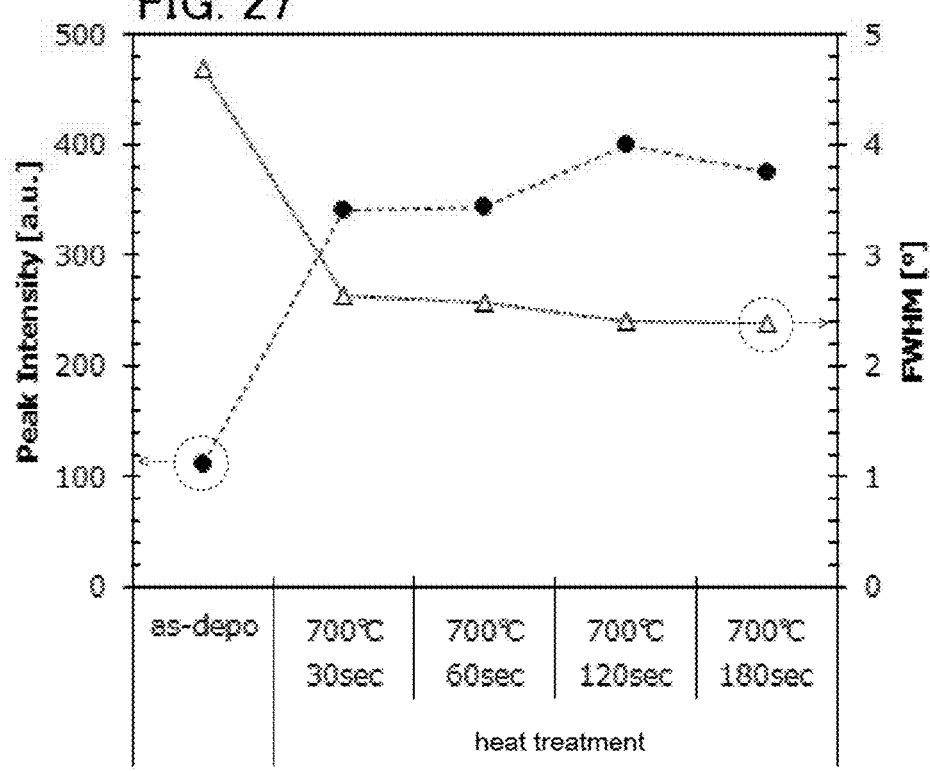

2200   2100

2200   2100

FIG. 47A1
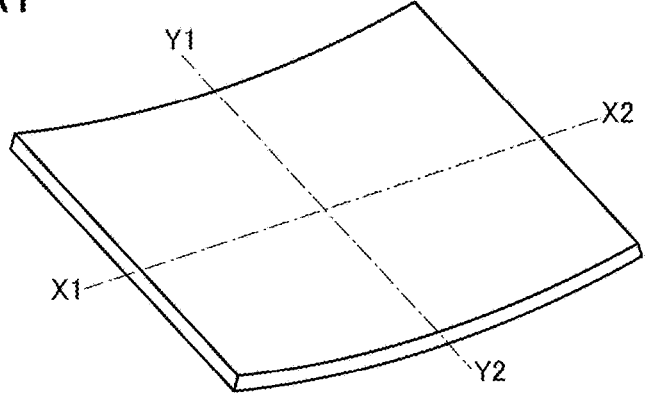
FIG. 47A2
FIG. 47A3
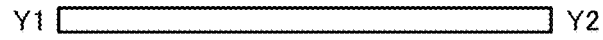
FIG. 47B1
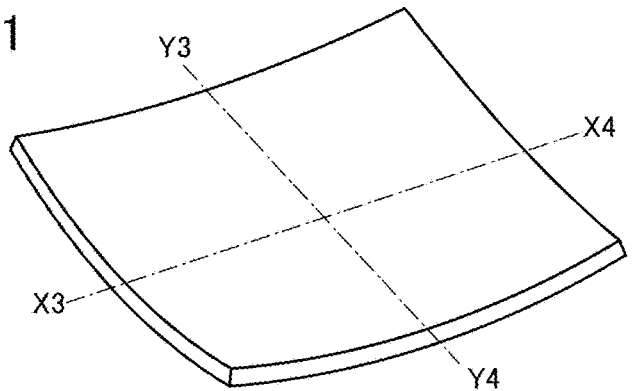
FIG. 47B2
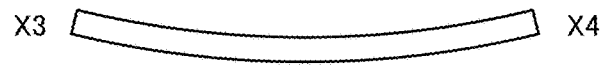
FIG. 47B3
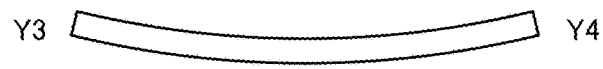

OXIDE AND METHOD FOR FORMING THE SAME

TECHNICAL FIELD

The present invention relates to, for example, an oxide, a transistor, a semiconductor device, and manufacturing methods thereof. Furthermore, the present invention relates to, for example, an oxide, a display device, a light-emitting device, a lighting device, a power storage device, a memory device, a processor, and an electronic device. The present invention relates to a method for forming an oxide, a display device, a liquid crystal display device, a light-emitting device, a memory device, and an electronic device. Furthermore, the present invention relates to a driving method of a semiconductor device, a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, and a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. On the other hand, in the case of a transistor included in a high-performance display device where a driver circuit and a pixel circuit are formed over the same substrate, it is preferable to use polycrystalline silicon, which can be used to form a transistor having a high field-effect mobility. As a method for forming polycrystalline silicon, high-temperature heat treatment or laser light treatment which is performed on amorphous silicon has been known.

In recent years, transistors using oxide semiconductors (typically, In—Ga—Zn oxide) have been actively developed.

Oxide semiconductors have been researched since early times. In 1988, there was a disclosure of a crystal In—Ga—Zn oxide that can be used for a semiconductor element (see Patent Document 1). In 1995, a transistor using an oxide semiconductor was invented, and its electrical characteristics were disclosed (see Patent Document 2).

In 2013, one group reported that an amorphous In—Ga—Zn oxide whose crystallization is promoted by irradiation with an electron beam has an unstable structure (see Non-Patent Document 1). According to the report, the amorphous In—Ga—Zn oxide formed by the group has no ordering in observation with a high-resolution transmission electron microscope.

In 2014, it was reported that a transistor including a crystalline In—Ga—Zn oxide has more excellent electrical characteristics and higher reliability than a transistor including an amorphous In—Ga—Zn oxide (see Non-Patent Document 2, Non-Patent Document 3, and Non-Patent Document 4). These documents report that a crystal boundary is not clearly observed in an In—Ga—Zn oxide including a c-axis aligned crystalline oxide semiconductor (CAAC-OS).

As a kind of a structure of polymer crystal, a concept of "paracrystal" is known. A paracrystal seemingly has a trace of crystal lattice; however, compared with an ideal single crystal, the paracrystal has a distorted crystal structure (see Non-Patent Document 5).

REFERENCE

Patent Document

[Patent Document 1] Japanese Published Patent Application No. S63-239117
[Patent Document 2] Japanese translation of PCT international application No. H11-505377

Non-Patent Document

[Non-Patent Document 1] T. Kamiya, Koji Kimoto, Naoki Ohashi, Katsumi Abe, Yuichiro Hanyu, Hideya Kumomi, and Hideo Hosono, Proceedings of *The 20th International Display Workshops,* 2013, AMD2-5L
[Non-Patent Document 2] S. Yamazaki, H. Suzawa, K. Inoue, K. Kato, T. Hirohashi, K. Okazaki, and N. Kimizuka, *Japanese Journal of Applied Physics,* Vol. 53, 2014, 04ED18
[Non-Patent Document 3] S. Yamazaki, T. Hirohashi, M. Takahashi, S. Adachi, M. Tsubuku, J. Koezuka, K. Okazaki, Y. Kanzaki, H. Matsukizono, S. Kaneko, S. Mori, and T. Matsuo, *Journal of the Society for Information Display,* 8 Apr. 2014, 211
[Non-Patent Document 4] S. Yamazaki, *The Electrochemical Society Transactions,* 2014, vol. 64(10), pp. 155-164
[Non-Patent Document 5] Rolf Hosemann, *Journal of Applied Physics,* 1963 January, vol. 34, number. 1, pp. 25-41

DISCLOSURE OF INVENTION

An object of the present invention is to provide a method for forming an oxide that can be used as a semiconductor of a transistor or the like. In particular, an object of the present invention is to provide a method for forming an oxide with fewer defects such as grain boundaries.

Another object of the present invention is to provide a semiconductor device using an oxide as a semiconductor. Another object of the present invention is to provide a module that includes a semiconductor device using an oxide as a semiconductor. Another object is to provide an electronic device including a semiconductor device using an oxide as a semiconductor or a module including a semiconductor device using an oxide as a semiconductor.

Another object is to provide a transistor with favorable electrical characteristics. Another object is to provide a transistor having stable electrical characteristics. Another object is to provide a transistor with high frequency characteristics. Another object is to provide a transistor having low off-state current. Another object is to provide a semiconductor device including the transistor. Another object is to provide a module including the semiconductor device. Another object is to provide an electronic device including the semiconductor device or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

Means for Solving the Problems (1)

One embodiment of the present invention is a method for forming an oxide with a sputtering method with use of a deposition chamber, a target in the deposition chamber, and a substrate. The method includes the following steps: a step of, after supplying a sputtering gas containing oxygen and/or a rare gas into the deposition chamber, generating a potential difference between the target and the substrate, thereby generating plasma including an ion of the sputtering gas in the vicinity of the target; a step of accelerating the ion of the sputtering gas moving toward the target by the potential difference; a step of separating a plurality of flat-plate particles of a compound containing a plurality of elements, an atom included in the target, and an aggregate of the atoms included in the target from the target by collision of the accelerated ion of the sputtering gas with the target; a step of negatively charging surfaces of the plurality of flat-plate particles that receive negative charge from an oxygen ion while flying in the plasma; a step of depositing one of the negatively-charged flat-plate particles with a surface facing the substrate; a step of depositing another negatively-charged flat-plate particle in a region apart from the one negatively-charged flat-plate particle while repelling the one negatively-charged flat-plate particle over the substrate; a step of inserting the atom and the aggregate of the atoms in a gap between the one negatively-charged flat-plate particle and the another negatively-charged flat-plate particle; and a step of growing the atom and the aggregate of the atoms in the lateral direction in the gap between the flat-plate particles, so that the gap between the one negatively-charged flat-plate particle and the another negatively-charged flat-plate particle is filled with the atom and the aggregate of the atoms.

(2)

Another embodiment of the present invention is the method for forming an oxide described in (1), where the atom and the aggregate of the atoms grows in the lateral direction from the flat-plate particle so as to have the same composition with the flat-plate particle, so that the gap between the flat-plate particles is filled.

(3)

Another embodiment of the present invention is the method for forming an oxide described in (1) or (2), where the flat-plate particles are stacked to form a thin film structure.

(4)

Another embodiment of the present invention is the method for forming an oxide described in any one of (1) to (3), where after formation of the oxide, thermal annealing or RTA is performed at a temperature that is higher than a temperature at which the oxide is formed and that is lower than a temperature at which the oxide is turned into a different material, so that the oxide is made to have a high density or to be a single crystal.

(5)

Another embodiment of the present invention is the method for forming an oxide described in (4), where the temperature of the thermal annealing or RTA is higher than 300° C. and lower than 1500° C.

(6)

Another embodiment of the present invention is the method for forming an oxide described in any one of (1) to (5), where the oxide is formed on a surface having an amorphous structure.

(7)

Another embodiment of the present invention is the method for forming an oxide described in any one of (1) to (6), where the target includes indium, zinc, an element M (M is any one of aluminum, gallium, yttrium, and tin), and oxygen, and the target has a region with a polycrystalline structure.

(8)

Another embodiment of the present invention is an oxide including indium, zinc, an element M (M is any one of aluminum, gallium, yttrium, and tin), and oxygen, and where in an image of lattice point extracted from a planar image obtained with a transmission electron microscope, the oxide has a distortion or fluctuation compared with an ideal crystal structure.

(9)

Another embodiment of the present invention is the oxide described in (8), where in the image of extracted lattice point, a grain boundary is not observed clearly.

(10)

Another embodiment of the present invention is the oxide described in (8) or (9), where in the image of extracted lattice point, an orientation of the crystal is gently changed.

(11)

Another embodiment of the present invention is the oxide described in any one of (8) to (10), where the oxide is formed on a surface having an amorphous structure.

It is possible to provide a method for forming an oxide that can be used as a semiconductor of a transistor or the like. In particular, it is possible to provide a method for forming an oxide with fewer defects such as grain boundaries.

It is possible to provide a semiconductor device using an oxide as a semiconductor. It is possible to provide a module that includes a semiconductor device using an oxide as a semiconductor. It is possible to provide a semiconductor device using an oxide as a semiconductor or an electronic device including a module including a semiconductor device using an oxide as a semiconductor.

A transistor with favorable electrical characteristics can be provided. A transistor having stable electrical characteristics can be provided. A transistor with high frequency characteristics can be provided. It is possible to provide a transistor with low off-state current. A semiconductor device including the transistor can be provided. A module including the semiconductor device can be provided. An electronic device including the semiconductor device or the module can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

FIGS. 1A to 1D illustrate a deposition method of a CAAC-OS.

FIGS. 9A to 9G are diagrams showing positions where a particle is attached to a pellet.

FIGS. 15A to 15L show plan-view TEM images, FFT filtering images, and lattice point extraction images of oxide semiconductors.

FIGS. 23A to 23C are each a graph showing a change in crystal size by irradiation on an oxide semiconductor with an electron beam.

FIG. 27 is a graph showing structure analysis of an oxide semiconductor by XRD.

FIGS. 47A1, 47A2, 47A3, 47B1, 47B2, and 47B3 are perspective views and cross-sectional views of semiconductor devices according to one embodiment of the present invention.

BEST MODE FOR CARRYING OUT THE INVENTION

Figure 2A:
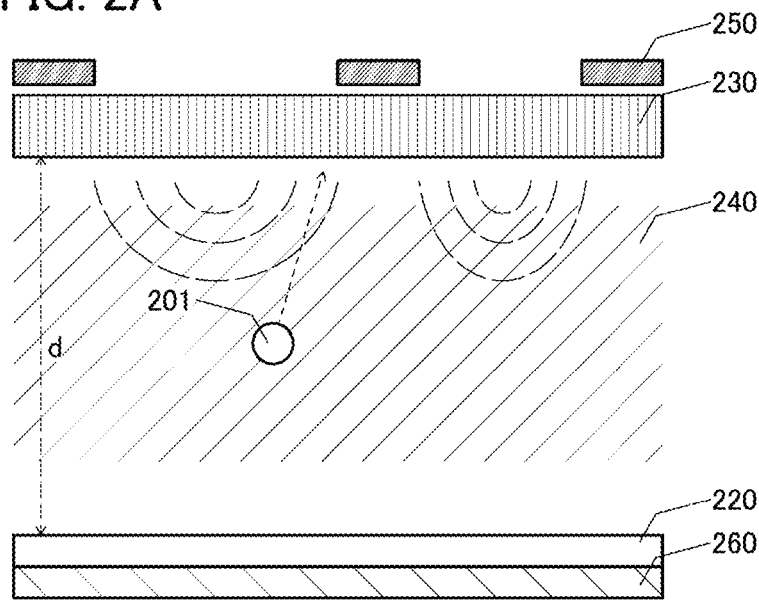
FIGS. 2A and 2B illustrate a deposition method of a CAAC-OS.

Hereinafter, embodiment of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Furthermore, when the semiconductor layer is silicon, examples of an impurity which changes the characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed in a top view. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases.

For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be alternately referred to as the description "one of end portions of A is positioned on an outer side than one of end portions of B".

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

<Film Formation Method>

An example of a method for forming a CAAC-OS film will be described below.

FIG. 1A is a schematic view of the inside of a deposition chamber. The CAAC-OS can be deposited by a sputtering method. First, a concept of deposition model is briefly described with FIG. 1A, and the detail explanation is made later.

As shown in FIG. 1A, a substrate 220 and a target 230 are arranged to face each other. Plasma 240 is generated between the substrate 220 and the target 230. The plasma 240 includes an ion 201 generated by ionization of a composition of a sputtering gas.

The ion 201 is accelerated to move toward the target 230, and when the ion 201 collides with the target 230, a pellet 200 that is a pellet-like particle is separated from the target 230. At that time, a particle 203 formed from an atom contained in the target 230 is concurrently separated. Then, the pellet 200 and the particle 203 receive electric charge in the plasma 240 and thus are charged. For example, the pellet 200 and the particle 203 may be negatively charged by an oxygen ion ($O^{2-}$).

An oxide thin film 206 has been already deposited over the substrate 220. After reaching a surface of the oxide thin film 206, the pellet 200 and the particle 203 are deposited to avoid another pellet 200. This deposition is caused by repelling force (repulsive force) generated on the surfaces of the pellets 200 that are electrically charged with the same polarity (negative in this case). Note that the substrate 220 is heated, and the pellet 200 and the particle 203 that are deposited migrate over the surface of the substrate 220.

The oxide thin film 206 and the pellet 200 over the substrate 220 have cross-sectional shapes shown in FIG. 1B.

Note that the pellet 200 has a shape obtained by cleavage of the target 230. For example, an In-M-Zn oxide (M is an element such as aluminum, gallium, yttrium, or tin) has a cross-sectional shape shown in FIG. 1C and a top surface shape shown in FIG. 1D.

A deposition model of the CAAC-OS is described in detail below.

The substrate 220 is placed to face the target 230, and the distance d (also referred to as a target-substrate distance (T-S distance)) is greater than or equal to 0.01 m and less than or equal to 1 m, preferably greater than or equal to 0.02 m and less than or equal to 0.5 m (see FIG. 2A). The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a constant value or higher to the target 230, and the plasma 240 is observed. The magnetic field forms a high-density plasma region in the vicinity of the target 230. In the high-density plasma region, the deposition gas is ionized, so that the ion 201 is generated. Examples of the ion 201 include an oxygen cation ($O^+$) and an argon cation ($Ar^+$). A heating mechanism 260 is under the substrate 220.

The target 230 is attached to a backing plate (not illustrated in the drawing). A plurality of magnets 250 are provided to face the target 230 with the backing plate positioned therebetween. A sputtering method in which the disposition speed is increased by utilizing a magnetic field of magnets is referred to as a magnetron sputtering method.

Figure 3:
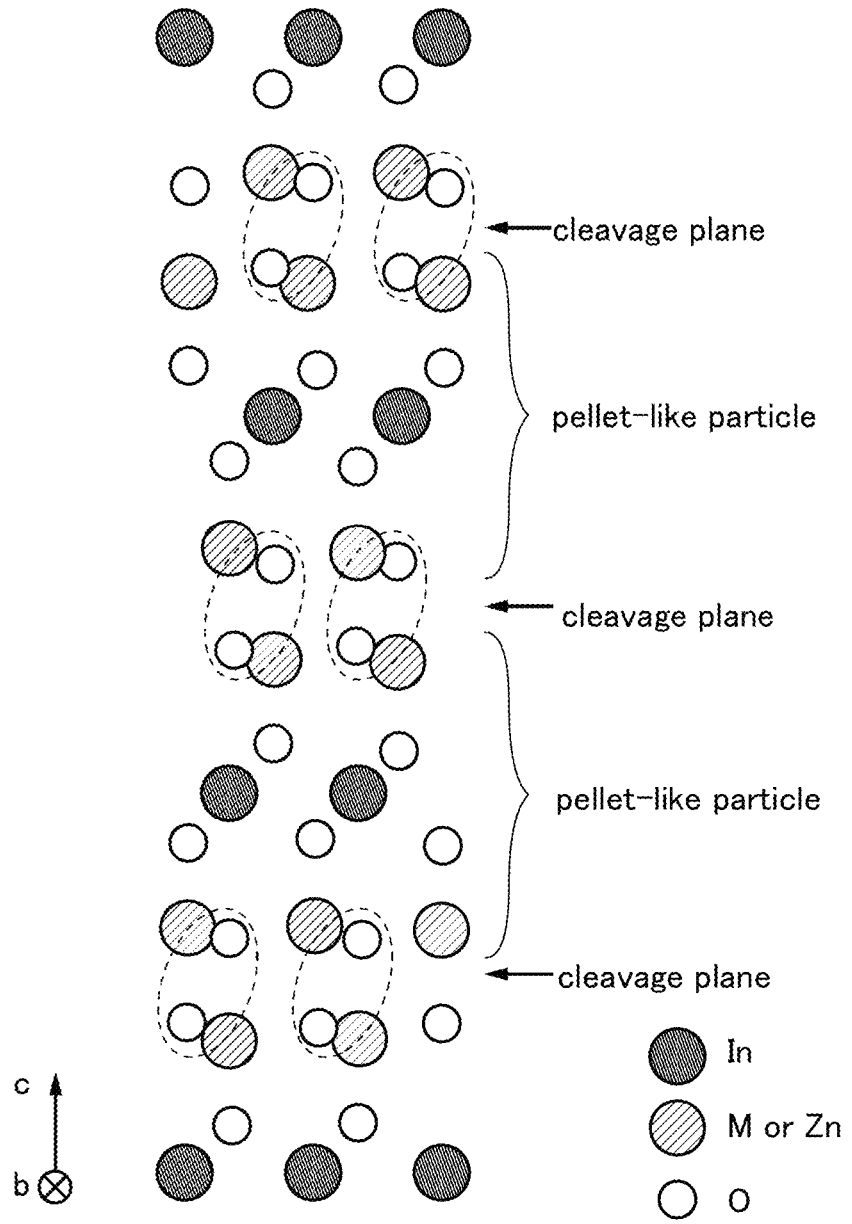
FIG. 3 illustrates a crystal of InMZnO$_4$.

The target 230 has a polycrystalline structure which includes a plurality of crystal grains and in which a cleavage plane exists in any of the crystal grains. FIG. 3 shows a crystal structure of $InMZnO_4$ (M is an element such as aluminum, gallium, yttrium, or tin) included in the target 230 as an example. Note that the crystal structure shown in FIG. 3 is $InMZnO_4$ observed from a direction parallel to a b-axis. In the crystal of $InMZnO_4$, oxygen atoms are negatively charged, whereby repulsive force is generated between the two adjacent M—Zn—O layers. Thus, the $InMZnO_4$ crystal has a cleavage plane between the two adjacent M—Zn—O layers.

The ion 201 generated in the high-density plasma region is accelerated to move toward the target 230 side by an electric field, and then collides with the target 230 (see FIG.

2A). At this time, the pellet 200 which is a flat-plate-like or pellet-like sputtered particle is separated from the cleavage plane. The pellet 200 corresponds to a portion between the two cleavage planes shown in FIG. 3. Thus, when the pellet 200 is observed, the cross-section thereof is as shown in FIG. 1C, and the top surface thereof is as shown in FIG. 1D. Note that structure of the pellet 200 may be distorted by an impact of collision of the ion 201.

The pellet 200 is a flat-plate-like (pellet-like) sputtered particle having a triangle plane, e.g., regular triangle plane. Alternatively, the pellet 200 is a flat-plate-like (pellet-like) sputtered particle having a hexagon plane, e.g., regular hexagon plane. However, the shape of a flat plane of the pellet 200 is not limited to a triangle or a hexagon. For example, the flat plane may have a shape formed by combining two or more triangles. For example, a quadrangle (e.g., rhombus) may be formed by combining two triangles (e.g., regular triangles).

Figure 2B:
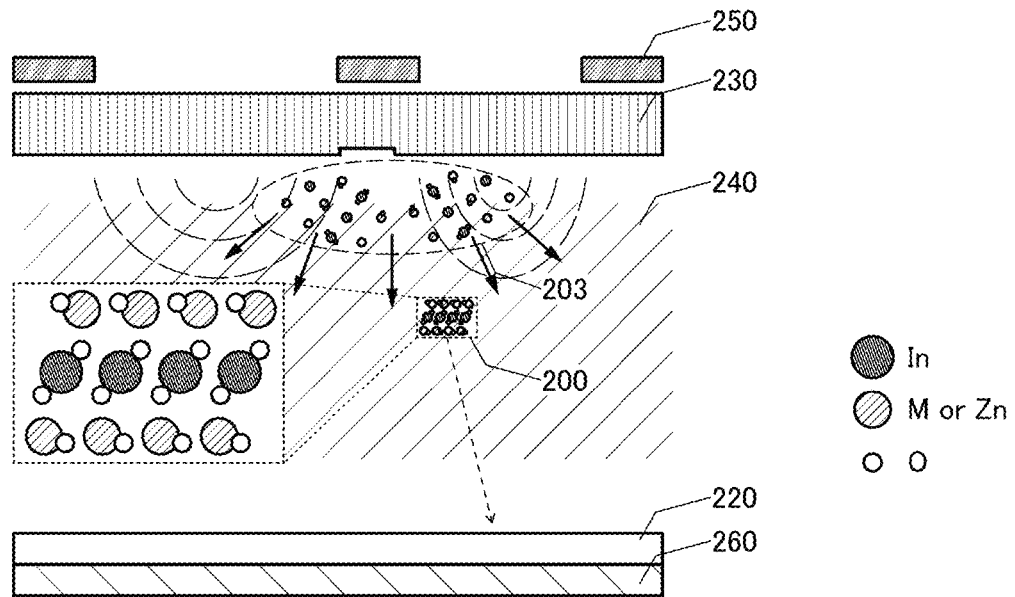

The thickness of the pellet 200 is determined depending on the kind of deposition gas and the like. For example, the thickness of the pellet 200 is greater than or equal to 0.4 nm and less than or equal to 1 nm, preferably greater than or equal to 0.6 nm and less than or equal to 0.8 nm. In addition, the width of the pellet 200 is, for example, greater than or equal to 1 nm and less than or equal to 3 nm, preferably greater than or equal to 1.2 nm and less than or equal to 2.5 nm. For example, the ion 201 collides with the target 230 including the In-M-Zn oxide as shown in FIG. 2A. Then, the pellet 200 including three layers of an M—Zn—O layer, an In—O layer, and an M—Zn—O layer is separated as shown in FIG. 2B. Note that along with the separation of the pellet 200, a particle 203 is also sputtered from the target 230. The particle 203 has an atom or an aggregate of several atoms. Therefore, the particle 203 can be referred to as an atomic particle.

The pellet 200 may receive a charge when passing through the plasma 240, so that surfaces thereof are negatively or positively charged. For example, the pellet 200 receives a negative charge from $O^{2-}$ in the plasma 240. As a result, oxygen atoms on the surfaces of the pellet 200 may be negatively charged. In addition, when passing through the plasma 240, the pellet 200 is sometimes combined with indium, the element M, zinc, oxygen, or the like in the plasma 240 to grow up.

The pellet 200 and the particle 203 that have passed through the plasma 240 reach the surface of the substrate 220. Note that part of the particle 203 is discharged to the outside by a vacuum pump or the like because the particle 203 is small in mass.

Figure 4A:
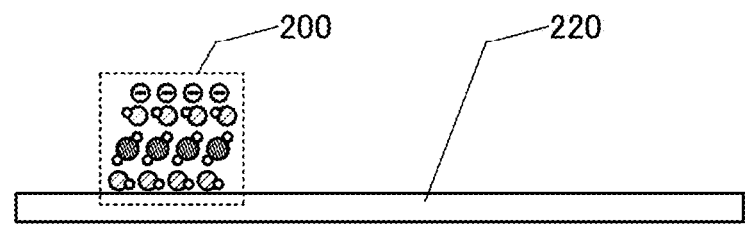
FIGS. 4A to 4C illustrate a deposition method of a CAAC-OS.
Figure 4B:
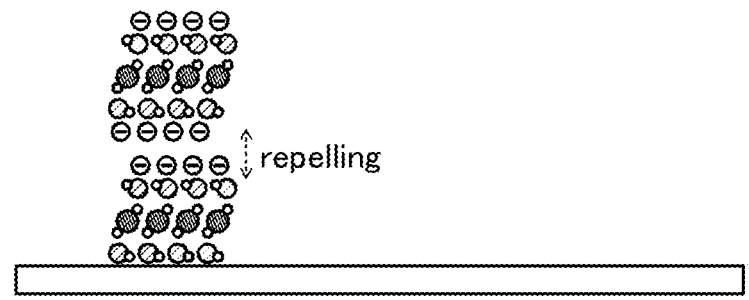

Next, deposition of the pellet 200 and the particle 203 over the surface of the substrate 220 is described with reference to FIGS. 4A to 4C.

First, a first of the pellets 200 is deposited over the substrate 220. Since the pellet 200 has a flat-plate-like shape, it is deposited so that the flat plane faces the surface of the substrate 220 (FIG. 4A). Here, a charge on a surface of the pellet 200 on the substrate 220 side is lost through the substrate 220.

Next, a second of the pellets 200 reaches the substrate 220. Here, since the surface of the first of the pellets 200 and the surface of the second of the pellets 200 are charged, they repel each other (FIG. 4B).

Figure 4C:
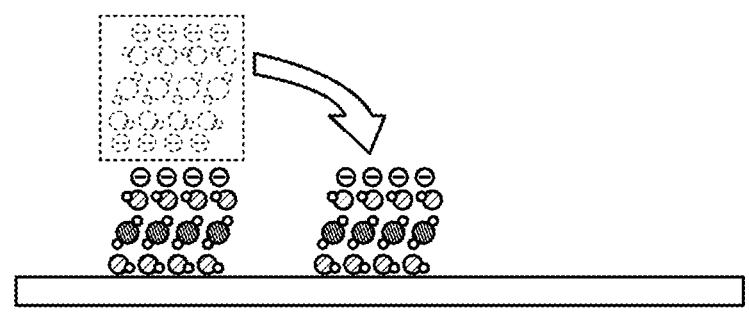

As a result, the second of the pellets 200 avoids being deposited over the first of the pellets 200, and is deposited over the surface of the substrate 220 so as to be a little distance away from the first of the pellets 200 (FIG. 4C). With repetition of this, millions of the pellets 200 are deposited over the surface of the substrate 220 to have a thickness of one layer. A region where any pellet 200 is not deposited is generated between adjacent pellets 200.

Figure 5A:
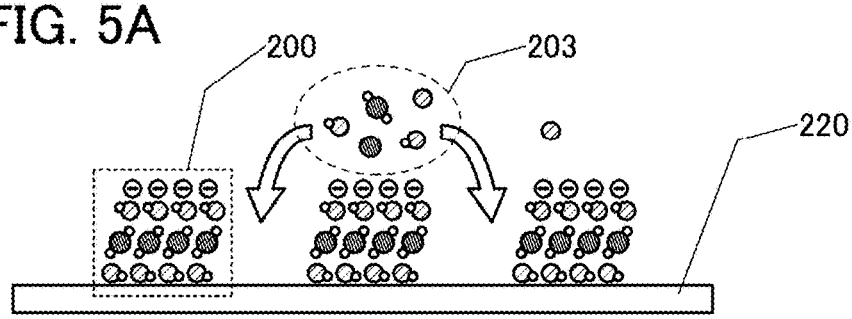
FIGS. 5A to 5D illustrate a deposition method of a CAAC-OS.

Next, the particle 203 reaches the surface of the substrate 220 (FIG. 5A).

The particle 203 cannot be deposited over an active region such as the surface of the pellet 200. Therefore, the particle 203 is deposited so as to fill a region where the pellets 200 are not deposited. The particles 203 attach between the pellets 200 and grow in the horizontal (lateral) direction, thereby connecting the pellets 200. In this way, the particles 203 are deposited until they fill regions where the pellets 200 are not deposited. This mechanism is similar to a deposition mechanism of an atomic layer deposition (ALD) method.

Figure 5B:
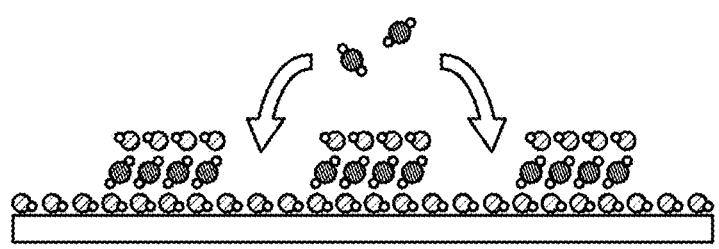
Figure 5C:
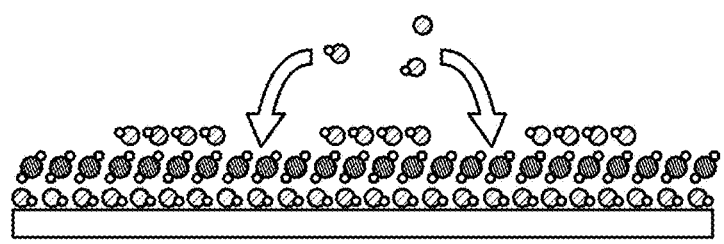
Figure 5D:
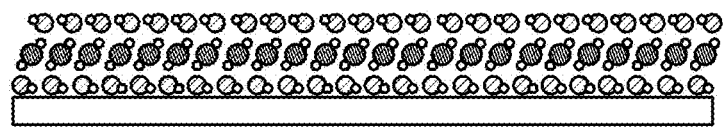

Note that there can be several mechanisms for the lateral growth of the particles 203 between the pellets 200. For example, there is the following mechanism (first mechanism): the particles 203 attach to join sides of first M—Zn—O layers as shown in FIG. 5B (first step); the particles 203 attach to join sides of second In—O layers as shown in FIG. 5C (second step); and the particles 203 attach to join sides of third M—Zn—O layers as shown in FIG. 5D (third step).

Figure 6A:
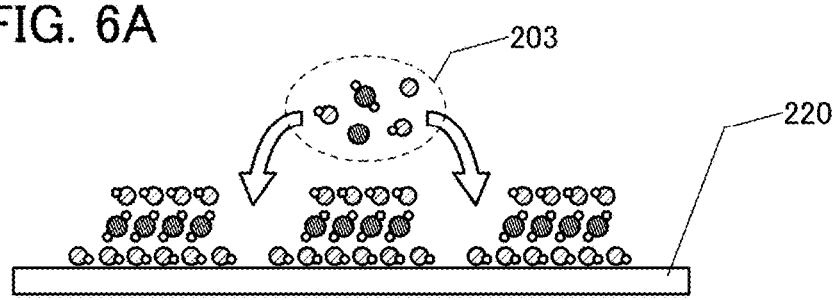
FIGS. 6A to 6D illustrate a deposition method of a CAAC-OS.
Figure 6B:
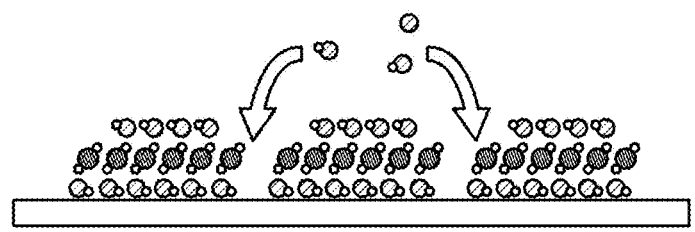
Figure 6C:
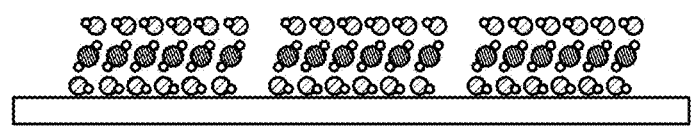
Figure 6D:
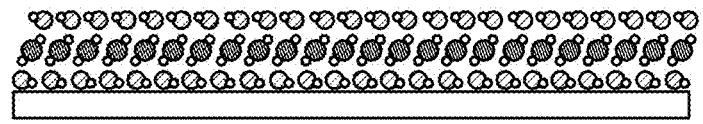

Alternatively, as shown in FIG. 6A, first, the particles 203 are connected in line (in the depth direction) to the sides of the first M—Zn—O layers. Then, as shown in FIG. 6B, the particles 203 are connected in line (in the depth direction) to sides of the second In—O layers. After that, the particles 203 are connected in line (in the depth direction) to sides of the third M—Zn—O layers. In the above manner, the particles 203 are connected to each layer in line, so that oxide with the same thickness as that of the pellet 200 can be deposited without a gap as shown in FIG. 6D (second mechanism). Note that the connection of the pellets 200 can also be made by the simultaneous occurrence of the deposition in FIGS. 6A, 6B, and 6C (third mechanism).

As shown in the above, the above three mechanisms are considered as the mechanisms of the lateral growth of the particles 203 between the pellets 200. However, the particles 203 may grow up laterally between the pellets 200 by other mechanisms.

Therefore, even when the orientations of a plurality of pellets 200 are different from each other, generation of crystal boundaries can be suppressed since the particles 203 laterally grow to fill gaps between the plurality of pellets 200. In addition, as the particles 203 make smooth connection between the plurality of pellets 200, a crystal structure different from a single crystal and a polycrystal is formed. In other words, a crystal structure including distortion between minute crystal regions (pellets 200) is formed. The regions filling the gaps between the crystal regions are distorted crystal regions, and thus, it will be not appropriate to say that the regions have an amorphous structure.

Figure 7A:
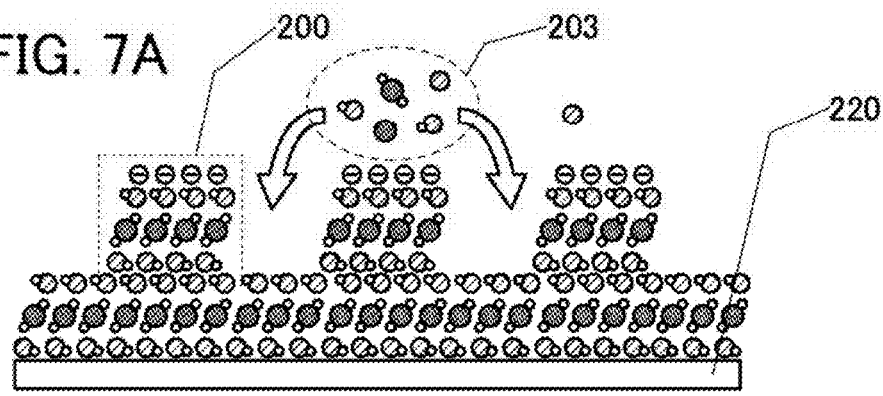
FIGS. 7A to 7C illustrate a deposition method of a CAAC-OS.
Figure 7B:
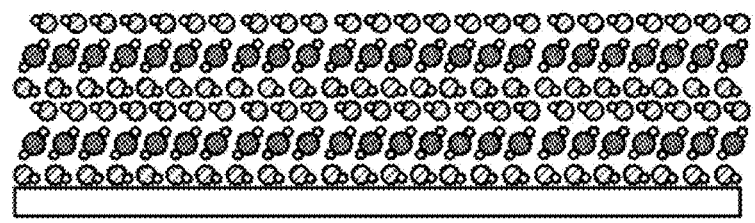
Figure 7C:
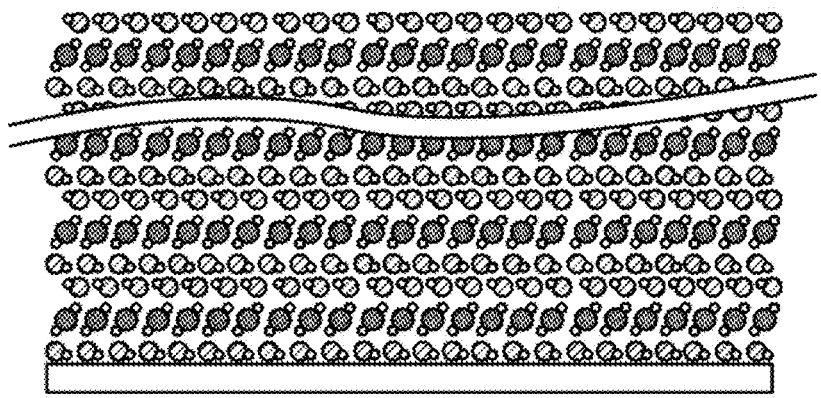

After the gaps between the pellets 200 are filled with the particles 203, a first layer with a thickness approximately the same as that of the pellet 200 is formed. Over the first layer, another pellet 200 is newly deposited (see FIG. 7A). Thus, a second layer is formed (see FIG. 7B). With repetition of this cycle, the stacked-layer thin film structure is formed (see FIG. 7C).

A deposition way of the pellets 200 changes depending on the surface temperature of the substrate 220 or the like. For example, if the surface temperature of the substrate 220 is high, migration of the pellets 200 occurs over the substrate 220. As a result, a proportion of the pellets 200 that are directly connected with each other without the particles 203 increases, whereby a CAAC-OS with high orientation is made. The surface temperature of the substrate 220 for formation of the CAAC-OS is higher than or equal to 100° C. and lower than 500° C., preferably higher than or equal to 140° C. and lower than 450° C., or further preferably higher than or equal to 170° C. and lower than 400° C. Therefore, even when a large-sized substrate of the 8th generation or more is used as the substrate 220, a warp or the like due to the deposition of CAAC-OS hardly occurs.

Figure 8:
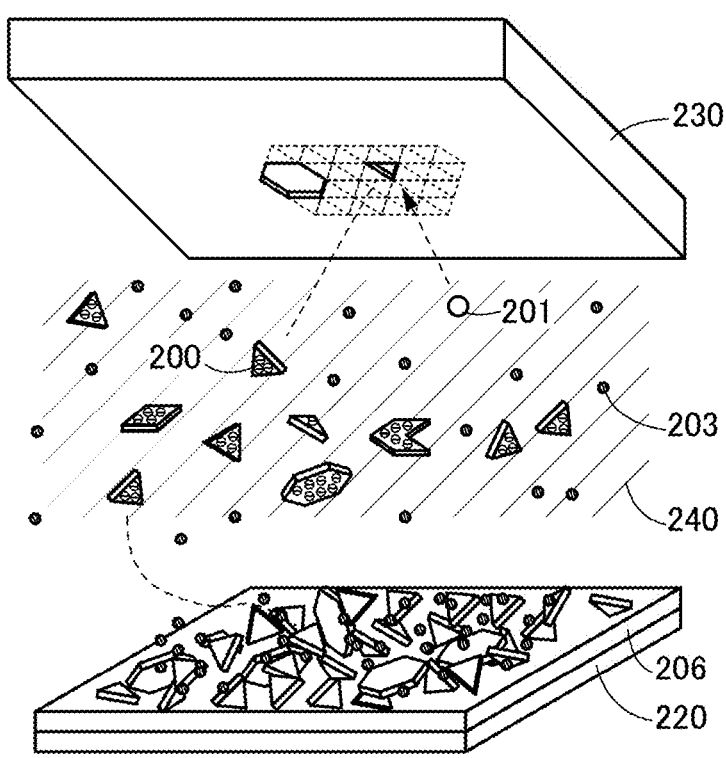
FIG. 8 illustrates a deposition method of a CAAC-OS.

On the other hand, if the surface temperature of the substrate 220 is low, the migration of the pellets 200 over the substrate 220 does not easily occur. As a result, the pellets 200 overlap with each other, whereby a nanocrystalline oxide semiconductor (nc-OS) with low orientation or the like is made (see FIG. 8). In the nc-OS, the pellets 200 are deposited with certain gaps because the pellets 200 are negatively charged. Therefore, the nc-OS film has low orientation but some regularity, and thus it has a denser structure than an amorphous oxide semiconductor.

When gaps between the pellets are extremely small in a CAAC-OS, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

According to such a model, the pellets 200 are considered to be deposited on the surface of the substrate 220. Thus, a CAAC-OS can be deposited even when a formation surface does not have a crystal structure; therefore, a growth mechanism in this case is different from epitaxial growth. In addition, a uniform film of a CAAC-OS or an nc-OS can be formed even over a large-sized glass substrate or the like. For example, even when the surface of the substrate 220 (formation surface) has an amorphous structure (e.g., such as amorphous silicon oxide), a CAAC-OS can be formed.

Furthermore, it is found that the pellets 200 are arranged in accordance with a surface shape of the substrate 220 that is the film formation surface even when the film formation surface has unevenness.

<Lateral Growth>

Description below is that the particle 203 attaches to (bonds to or adsorbs on) the pellet 200 laterally and the lateral growth occurs.

FIG. 9A, FIG. 9B, FIG. 9C, FIG. 9D, and FIG. 9E each illustrate a structure of the pellet 200 and a position where metal ions attach. A model assumed as the pellet 200 is a cluster having an InGaZnO$_4$ crystal structure from which 84 atoms are extracted and which holds the stoichiometric composition. FIG. 9F shows a structure of the pellet 200 seen in the direction parallel to a c-axis. FIG. 9G shows a structure of the pellet 200 seen in the direction parallel to an a-axis.

The positions where metal ions attach are represented as a position A, a position B, a position a, a position b, and a position c. The position A is an upper part of an interstitial site surrounded by one gallium atom and two zinc atoms on a top surface of the pellet 200. The position B is an upper part of an interstitial site surrounded by two gallium atoms and one zinc atom on a top surface of the pellet 200. The position a is in an indium site on a side surface of the pellet 200. The position b is in an interstitial site between an In—O layer and a Ga—Zn—O layer on a side surface of the pellet 200. The position c is in a gallium site on a side surface of the pellet 200.

The relative energies in the case where metal ions are located in the assumed positions (the position A, the position B, the position a, the position b, and the position c) are estimated with first principles calculation. In the calculation, first principles calculation software VASP (Vienna Ab initio Simulation Package) was used. For the exchange-correlation potential, Perdew-Burke-Ernzerhof (PBE) type generalized gradient approximation (GGA) was used, and for the ion potential, a projector augmented wave (PAW) method was used. The cut-off energy was 400 eV, and Γ-only k-point sampling was used. The table below shows the relative energies in the case where an indium ion (In$^{3+}$), a gallium ion (Ga$^{3+}$), and a zinc ion (Zn$^{2+}$) are located in the position A, the position B, the position a, the position b, and the position c. Note that the relative energy is a relative value under the condition where the energy of the model with the lowest energy among the calculated models is set to 0 eV.

TABLE 1

| | Relative Energy [eV] | | | | |
|---|---|---|---|---|---|
| | Top surface of pellet | | Side surface of pellet | | |
| ion | A | B | a | b | c |
| In$^{3+}$ | 2.1 | 1.5 | 0.0 | 1.8 | 1.9 |
| Ga$^{3+}$ | 3.7 | 3.0 | 0.6 | 0.0 | 3.5 |
| Zn$^{2+}$ | 2.3 | 1.8 | 0.0 | 0.6 | 2.9 |

As a result, it is found that any metal ion is more likely to attach on the side surface than to attach on the top surface of the pellet 200. In particular, in the indium site of the position a, a zinc ion as well as an indium ion is most likely to attach.

Figure 10A:
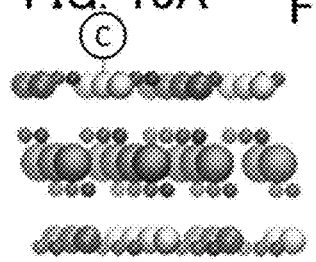
FIGS. 10A to 10G are diagrams showing positions where a particle is attached to a pellet.
Figure 10B:
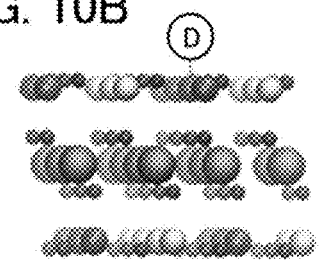
Figure 10C:
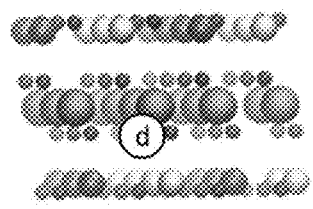
Figure 10D:
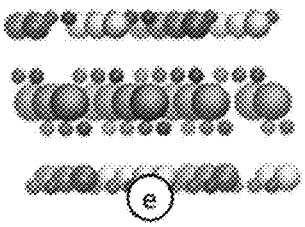
Figure 10E:
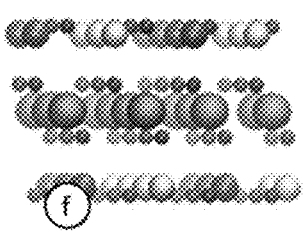
Figure 10F:
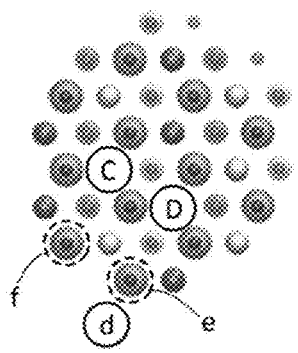
Figure 10G:
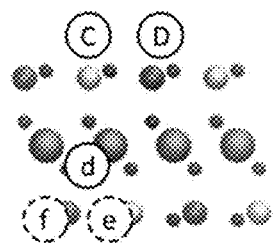

Ease of an oxygen ion (O$^{2-}$) attaching to the pellet 200 is examined. FIG. 10A, FIG. 10B, FIG. 10C, FIG. 10D, and FIG. 10E show structures of the pellet 200 and positions where oxygen ions attach. FIG. 10F shows a structure of the pellet 200 seen in the direction parallel to a c-axis. FIG. 10G shows a structure of the pellet 200 seen in the direction parallel to a b-axis.

The positions where oxygen ions attach are represented as a position C, a position D, a position d, a position e, and a position f. In the position C, an oxygen ion is bonded to gallium on a top surface of the pellet 200. In the position D, an oxygen ion is bonded to zinc on a top surface of the pellet 200. In the position d, an oxygen ion is bonded to indium on a side surface of the pellet 200. In the position e, an oxygen ion is bonded to gallium on a side surface of the pellet 200. In the position f an oxygen ion is bonded to zinc on a side surface of the pellet 200.

Next, the relative energies in the case where oxygen ions are located in the assumed positions (the position C, the position D, the position d, the position e, and the position f) are estimated with first principles calculation. The table below shows the relative energies in the case where oxygen ions (O$^{2-}$) are located in the position C, the position D, the position d, the position e, and the position f.

TABLE 2

| | Relative Energy [eV] | | | | |
|---|---|---|---|---|---|
| | Top surface of pellet | | Side surface of pellet | | |
| ion | C | D | d | e | f |
| O$^{2-}$ | 3.9 | 3.6 | 0.0 | 0.5 | 1.5 |

As a result, it is found that the oxygen ion is also likely to attach to the side surface of the pellet 200 than to the top surface.

According to the above, the particle 203 approaching the pellet 200 preferentially attaches to the side surface of the pellet 200. In other words, the deposition model in which lateral grow of the pellet 200 is caused by the particle 203 attaching to the side surface of the pellet 200 has high validity.

<Structure of Oxide Semiconductor>

An oxide semiconductor is classified into a single crystal oxide semiconductor and a non-single-crystal oxide semiconductor. Examples of a non-single-crystal oxide semiconductor include a CAAC-OS, a polycrystalline oxide semiconductor, an amorphous like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure described below. For this reason, an a-like OS has physical properties similar to those of an amorphous oxide semiconductor.

Even when an amorphous oxide semiconductor having an unstable structure as one of definitions can be used for a channel formation region of a transistor, the transistor may be insufficient for practical use as a product. The same matter applies to an a-like OS. Thus, it is preferable that components of an amorphous oxide semiconductor and an a-like OS be rarely included or be not included at all in products.

A single crystalline oxide semiconductor needs the high process temperature for formation though it has high crystallinity, and might not be practical for use in terms of productivity. A polycrystalline oxide semiconductor has a grain boundary though it has high crystallinity in crystal grains, and is likely to have variation or the like.

In contrast, a CAAC-OS and an nc-OS have high stability and can be deposited at a substrate temperature lower than 500° C. by the above-described deposition method. In addition, they have no clear grain boundaries; thus, they are uniform and less likely to have variation or the like. For example, they can be deposited uniformly even on a large-sized substrate of the 8th generation or more, and accordingly can be regarded to have structures with high reliability and high practical utility.

<Analysis with Electron Microscope>

An nc-OS, a CAAC-OS, a polycrystalline oxide semiconductor, and a single crystal oxide semiconductor are analyzed with a transmission electron microscope (TEM).

<Plan-view TEM>

First, image analysis of plan views obtained with a TEM (also referred to as a plan-view TEM image) was performed. The plan-view TEM images were observed with a spherical aberration corrector function. The plan-view TEM images were obtained using an atomic resolution analytical electron microscope JEM-ARM200F manufactured by JEOL Ltd.

As Sample 1, Sample 2, and Sample 3, In—Ga—Zn oxides (In-M-Zn oxide where an element M is gallium) each over a silicon substrate where a 25-nm-thick silicon oxide was formed by a thermal oxidation method were prepared. Sample 1 was an In—Ga—Zn oxide deposited at room temperature by a sputtering method. Sample 2 was an In—Ga—Zn oxide deposited at a substrate temperature of 300° C. by a sputtering method. Sample 3 was an In—Ga—Zn oxide that was obtained by performing heat treatment (also referred to as thermal anneal) on Sample 2 at 1000° C. for an hour. For comparison, Sample 4 that was a single crystal In—Ga—Zn oxide was prepared.

Figure 11:
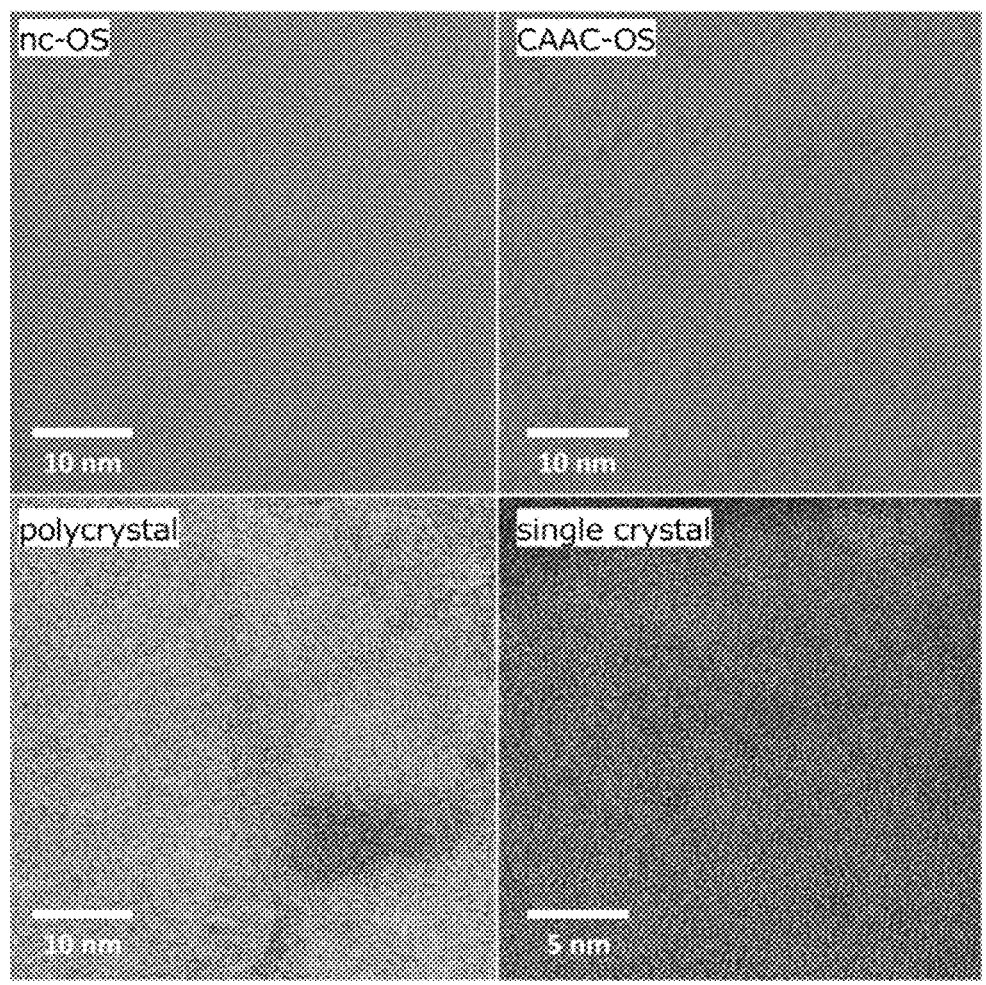
FIG. 11 shows plan-view TEM images.

FIG. 11 shows plan-view TEM images of Samples 1 to 4. Sample 4 is single crystal; thus it has high periodic atomic order in the whole observation area, and no grain boundary is observed. Sample 3 has a plurality of crystal grains each having high crystallinity, and grain boundaries can be observed at the boundaries, which indicates that Sample 3 is polycrystal. Sample 2 has triangular and hexagonal atomic arrangements, and a boundary between regions with different crystal orientations is not clear, which indicates that Sample 2 is a CAAC-OS. Sample 1 has partly periodic atomic order, which means that the whole of Sample 1 does not have periodic order. Thus, Sample 1 is an nc-OS.

The image analysis of the plan-view TEM images shown in FIG. 11 is performed.

The obtained plan-view TEM images are subjected to two-dimensional fast Fourier transform (FFT), and thus FFT images are obtained. Mask processing is performed on the condition that a range of from 2.8 nm$^{-1}$ to 5.0 nm$^{-1}$ from the origin in each of the obtained FFT images remains. After the mask processing, the FFT images are subjected to two-dimensional inverse fast Fourier transform, so that FFT filtering images are obtained. Note that in the case of Sample 4 that is single crystal, forbidden reflection only occurs in the above range; thus, mask processing is performed on the condition that a range of from 2.8 nm$^{-1}$ to 7.4 nm$^{-1}$ remains.

Next, lattice points are extracted from the FFT filtering images. Extraction of lattice points is performed by picking out the coordinates where the luminance has a maximum value. At this time, a treatment for smoothing luminance profiles is performed so as not to obtain a maximum value derived from noise. Furthermore, in the case where a distance between the maximum values adjacent to each other is extremely short, both of the maximum values are removed from data.

Next, a reference lattice point is determined from the extracted lattice points, and six lattice points that are nearest points of the reference lattice point are connected, so that a hexagonal lattice is formed. Then, a value R is calculated. Note that R is an average value of the distances from the reference lattice point that is the center of the hexagonal lattice to the lattice points that are each a vertex of the hexagonal lattice. With use of the calculated R regarded as the distance to each vertex, a regular hexagon in which the reference lattice point is a center point is formed. The regular hexagon is rotated by 0.1° plural times (the angle of rotation is from 0° to 60°) around a center point, and an average deviation between the rotated regular hexagon and the hexagonal lattice is calculated. The average deviation is calculated by dividing the sum of distances between vertexes of the regular hexagon and corresponding lattice points of the hexagonal lattice by six. The rotation angle of the regular hexagon when the average deviation has a minimum value is regarded as an angle of the hexagonal lattice.

Next, the observation range of the plan-view TEM image is adjusted so that the hexagonal lattices whose angles are 30° account for the highest percentage. In such a condition, the average value of the angles of the hexagonal lattices within a radius of 1 nm is calculated. The thus obtained result of image analysis of the plan-view TEM image is shown with gradation in accordance with angles of the hexagonal lattices (see FIG. 12).

Figure 12:
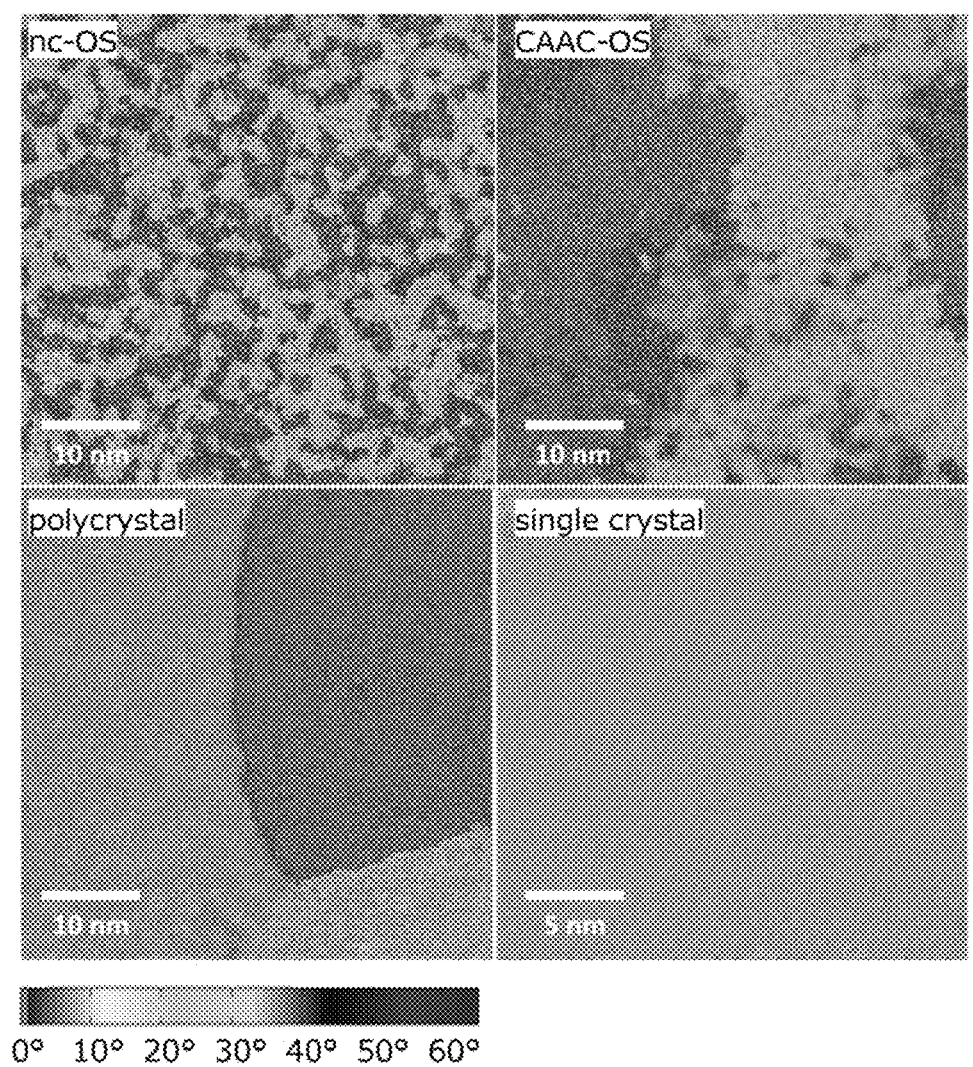
FIG. 12 shows plan-view TEM analysis images of oxide semiconductors.

According to FIG. 12, in Sample 4 that is single crystal, the angles of hexagonal lattices in the whole of observation range are uniform. Sample 3 that is polycrystal has crystal grains in which the angles of hexagonal lattices are uniform; however, the angle of the hexagonal lattice differs between the crystal grains, and a grain boundary is clear. Sample 2 that is a CAAC-OS has a plurality of regions in which the angles of hexagonal lattices are uniform, and the angles of the hexagonal lattices in a local region in the vicinity of a boundary vary smoothly. In other words, the CAAC-OS has a structure in which a junction of crystal regions warps, that is, the CAAC-OS does not have a clear crystal grain. In Sample 1 that is an nc-OS, the ordered distribution of the angles of hexagonal lattices is low.

As described above, by image analysis of the plan-view TEM image, the nc-OS, the CAAC-OS, the polycrystalline oxide semiconductor, and the single crystal oxide semiconductor can be discriminated.

The atomic arrangements in Sample 1 to Sample 4 are examined.

Figure 13:
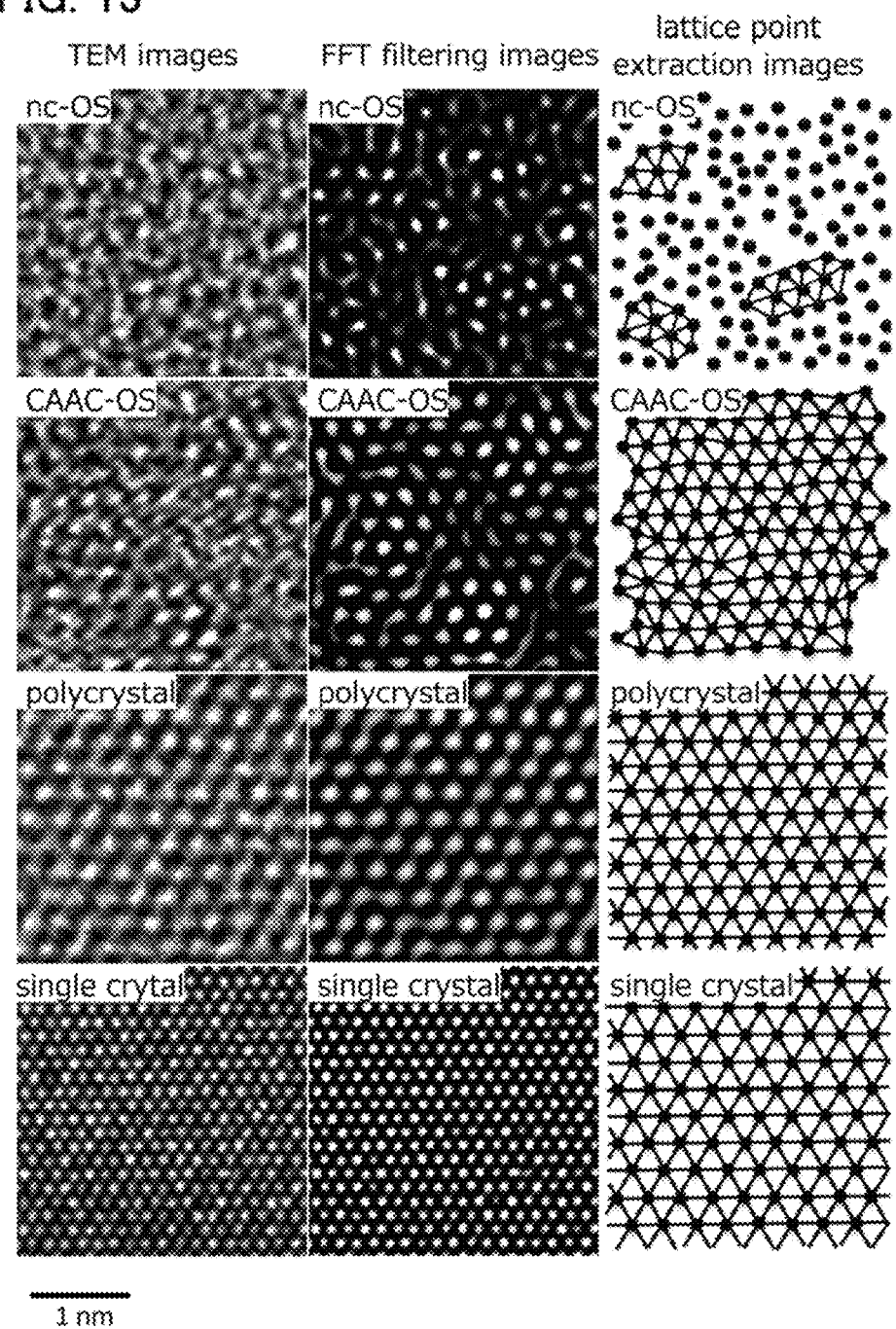
FIG. 13 shows plan-view TEM images, FFT filtering images, and lattice point extraction images of oxide semiconductors.

FIG. 13 shows plan-view TEM images (left column), FFT filtering images (middle column), and lattice point extraction images (right column) of regions where angles of hexagonal lattices of Sample 1 to Sample 4 are relatively uniform. The plan-view TEM images in FIG. 13 are images more enlarged than those in FIG. 11 so as to define the lattice points. The lattice point extraction images are obtained by extracting lattice points by the above method and connecting lattice points adjacent to each other with lines. Note that in the extraction of lattice points, several obvious lattice points that fail to be picked out automatically are added. All of the extracted luminescent spots are not necessarily a lattice point.

According to FIG. 13, Sample 4 that is single crystal has an ideal atomic arrangement in the whole of the observation range; Sample 3 that is polycrystal has atomic arrangement that is close to an ideal arrangement though luminescent spots with half a periodicity that is shown in Sample 4 are not observed. Thus, the extraction image of Sample 3 is similar to that of Sample 4 if extraction of lattice points is performed under such a condition that luminescent spots with half a periodicity in Sample 4 are removed. Sample 2 that is a CAAC-OS has an atomic arrangement similar to that of Sample 4 which is an ideal atomic arrangement and also has a distortion (which can also be represented as fluctuation or disorder). Sample 1 that is an nc-OS partly has the periodicity of its atomic arrangement; however, there is no regularity of atomic arrangements.

A paracrystal is known as a crystal structure which has a trace of an ideal atomic arrangement while having distortion. The paracrystal has been reported in the field of organic filament, but it has been hardly reported in the field of inorganic materials. The following are differences between a paracrystal and a CAAC-OS. For example, the paracrystal has a planar structure (like cloth). Meanwhile, the CAAC-OS has a shape along a surface where the CAAC-OS is formed and has a stacked-layer thin film structure. In the CAAC-OS, a denser structure is formed by heat treatment performed at a temperature higher than or equal to a deposition temperature (e.g., higher than 300° C. and lower than 1500° C., preferably higher than 350° C. and lower than 800° C.). Furthermore, the CAAC-OS allows its structure to change into a single crystal structure when heat treatment is performed at a temperature higher than or equal to a temperature at which a crystal structure changes (e.g., higher than or equal to 1000° C. and lower than or equal to 1500° C.). Thus, it is found that the CAAC-OS has a novel crystal structure different from that of the paracrystal.

Figure 14:
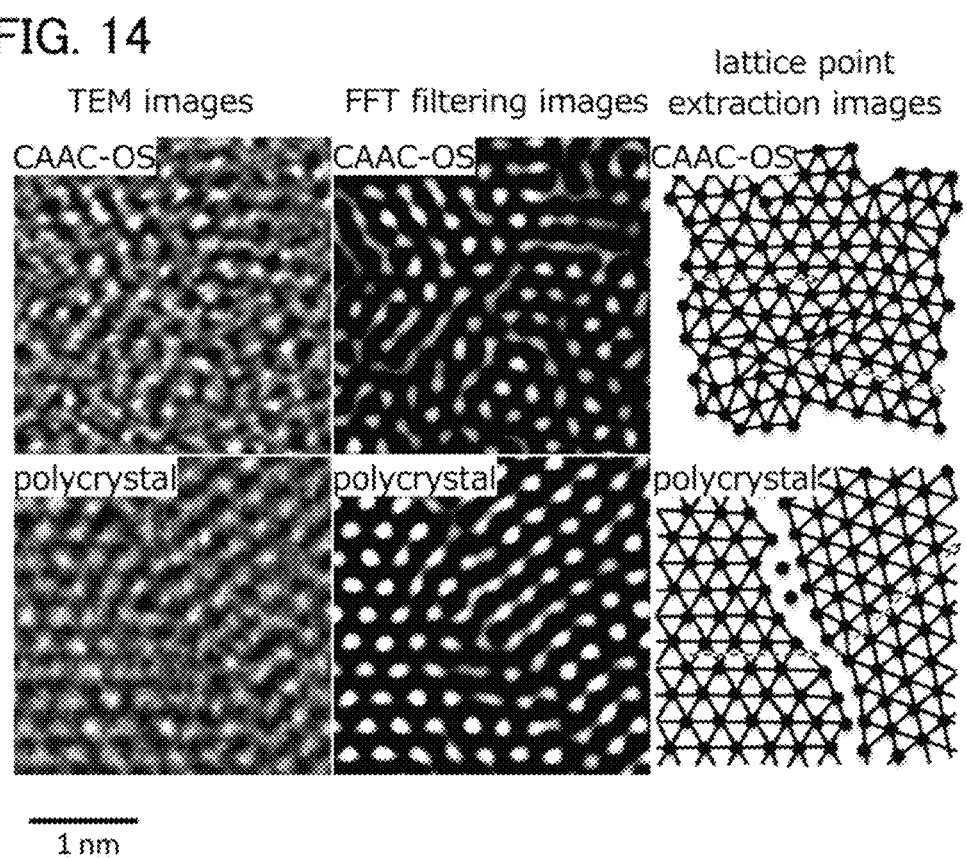
FIG. 14 shows plan-view TEM images, FFT filtering images, and lattice point extraction images of oxide semiconductors.

FIG. 14 shows plan-view TEM images (left column), FFT filtering images (middle column), and lattice point extraction images (right column) or regions in Sample 2 and Sample 3 different from those in FIG. 13.

According to FIG. 14, in Sample 3 that is polycrystal, the atomic arrangement largely changes at a grain boundary (defect). In contrast, in Sample 2 that is a CAAC-OS, a grain boundary is not formed even in a region with large distortion.

FIG. 15A shows a plan-view TEM image of Sample 2 that is a CAAC-OS in a region different from those shown in FIG. 13 and FIG. 14. FIG. 15B shows a plan-view TEM analysis image showing the angle distribution of hexagonal lattices, which is obtained by conversion from the image in FIG. 15A with the method described with FIG. 12. FIG. 15C is an enlarged view of a region including pellets in FIG. 15B. FIG. 15D is a lattice point extraction image corresponding to FIG. 15C. FIG. 15E is an enlarged view in another region including pellets in FIG. 15B. FIG. 15F is a lattice point extraction image corresponding to FIG. 15E.

FIG. 15G is a plan-view TEM image of Sample 3 that is polycrystal in a region different from those in FIG. 13 and FIG. 14. FIG. 15H is a plan-view TEM analysis image showing the angle distribution of hexagonal lattices, which is obtained by conversion from the image in FIG. 15G with the method described with FIG. 12. FIG. 15I is an enlarged view of a region including pellets in FIG. 15H. FIG. 15J is a lattice point extraction image corresponding to FIG. 15I. FIG. 15K is an enlarged view of another region including pellets in FIG. 15H. FIG. 15L is a lattice point extraction image corresponding to FIG. 15K.

From FIGS. 15A to 15F, a grain boundary is not observed clearly in Sample 2 that is a CAAC-OS. In contrast, from FIGS. 15G to 15L, a crystal grain composed of a single crystal is included and a grain boundary is clearly observed in Sample 3 that is polycrystal. The existence of grain boundary means that many crystal defects are included.

Figure 16A:
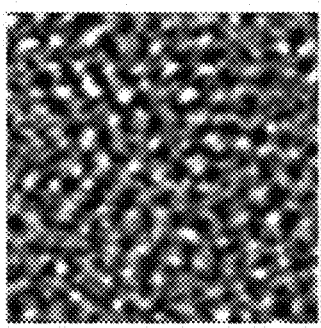
FIGS. 16A to 16J show plan-view TEM images, FFT filtering images, and lattice point extraction images of an oxide semiconductor.
Figure 16B:
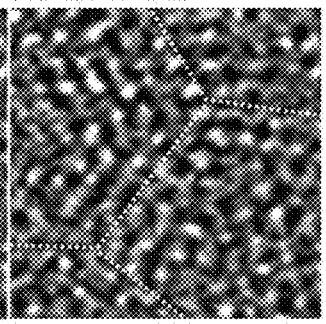
Figure 16C:
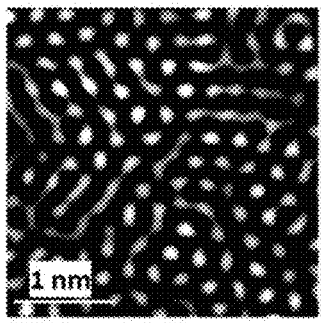
Figure 16D:
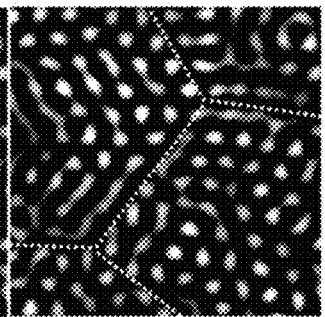
Figure 16E:
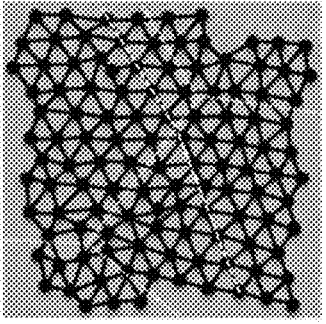

FIG. 16A is a plan-view TEM image showing an enlarged region including a boundary between pellets in Sample 2 that is a CAAC-OS. FIG. 16B is a plan-view TEM image in which a dotted line is drawn in a portion corresponding to the boundary between pellets in FIG. 16A. FIG. 16C is a FFT filtering image of FIG. 16A. FIG. 16D is a FFT filtering image in which a dotted line is drawn on the boundary between pellets in FIG. 16B. FIG. 16E is a lattice point extraction image of FIG. 16D.

Figure 16F:
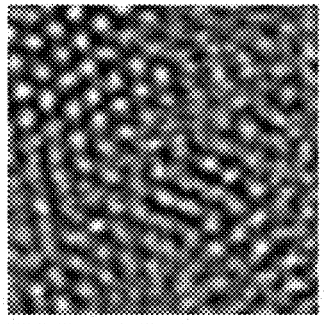
Figure 16G:
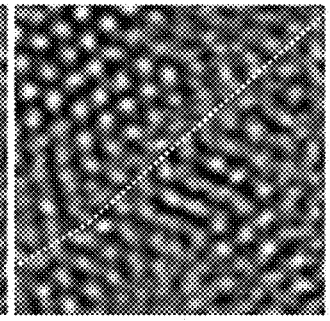
Figure 16H:
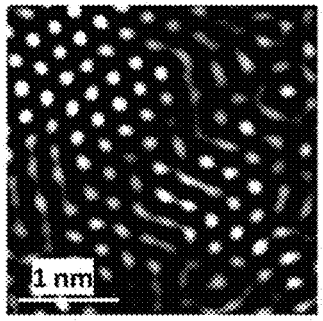
Figure 16I:
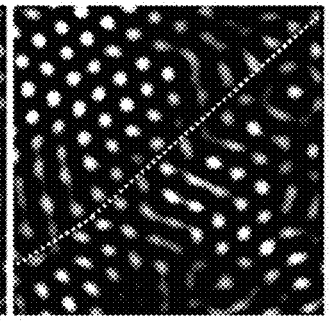
Figure 16J:
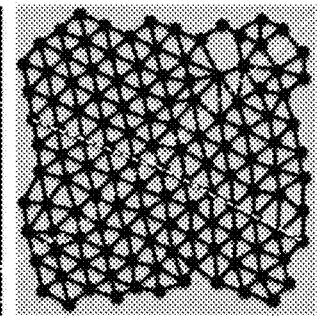

FIG. 16F is a plan-view TEM image showing another enlarged region including a boundary between pellets in Sample 2 that is a CAAC-OS. FIG. 16G is a plan-view TEM image in which a dotted line is drawn in a portion corresponding to the boundary between pellets of FIG. 16F. FIG. 16H is a FFT filtering image of FIG. 16F. FIG. 16I is a FFT filtering image in which a dotted line is drawn on the boundary between pellets in FIG. 16G. FIG. 16J is a lattice point extraction image of FIG. 16I.

As indicated by dashed lines in FIG. 16E and FIG. 16J, the atomic arrangement at the periphery of the pellets is distorted in Sample 2 that is a CAAC-OS. It is assumed that the atomic distance expands and contracts locally at a junction of pellets and atoms are continuously arranged while the atomic position has a fluctuation, so that a clear crystal boundary as in Sample 3 that is a polycrystal is not formed. As described above, the crystal boundary is not clearly observed in the CAAC-OS; thus, the CAAC-OS can be regarded as an oxide semiconductor with few crystal defects.

The features observed in the plan-view TEM images are one aspect of a structure of an oxide semiconductor. For example, when a conductor is formed over a CAAC-OS, there is a possibility that physical damages or chemical damages occur, and defects may be generated.

<Cross-Sectional TEM>

Besides the plan-view TEM, it becomes possible to specify a structure more exactly with use of a plurality of methods. Characteristics of a CAAC-OS and an nc-OS observed in cross-sectional TEM images are described below.

Figure 17A:
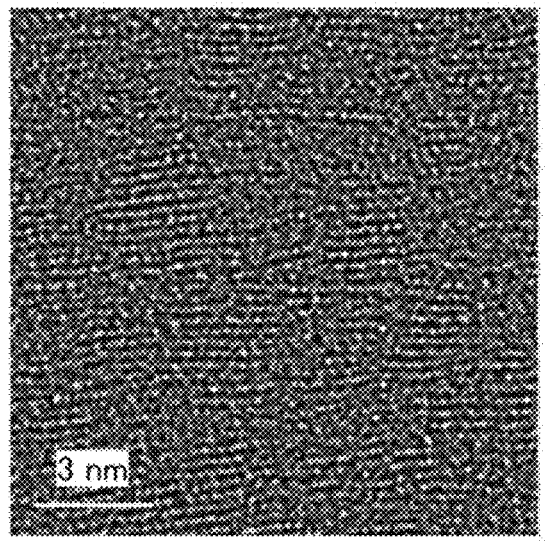
FIGS. 17A and 17B are each a cross-sectional TEM images of oxide semiconductors.

FIG. 17A shows a cross-sectional TEM image of the CAAC-OS which is observed in a direction substantially parallel to the sample surface. In observation of the cross-sectional TEM image, a spherical aberration corrector function was used. From FIG. 17A, atomic arrangement in a layered manner can be seen. The atomic arrangement in a layered manner reflects unevenness of a surface over which the CAAC-OS is formed (hereinafter, the surface is referred to as a formation surface) or a top surface of the CAAC-OS, and is parallel to the formation surface or the top surface of the CAAC-OS. Thus, the crystal distortion of the CAAC-OS can be observed also in the cross-sectional TEM image.

As shown in FIG. 17A, the CAAC-OS has a characteristic atomic arrangement. According to FIG. 17A, the size of each pellet is greater than or equal to 1 nm and less than or equal to 3 nm. Due to these characteristics, the pellet can also be referred to as a nanocrystal (nc). Furthermore, the CAAC-OS can also be referred to as an oxide semiconductor including c-axis aligned nanocrystals (CANC).

Figure 17B:
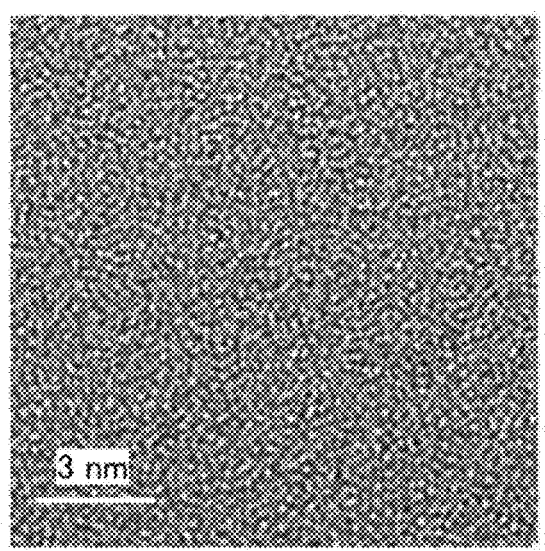

FIG. 17B shows a cross-sectional TEM image of the nc-OS observed in a direction substantially parallel to the sample surface. The nc-OS has no atomic arrangement in a layered manner. Thus, the nc-OS can also be referred to as an oxide semiconductor including random aligned nanocrystals (RANC) or non-aligned nanocrystals (NANC).

<Electron Diffraction>

Characteristics of a CAAC-OS and an nc-OS observed in electron diffraction are described below.

Figure 18A:
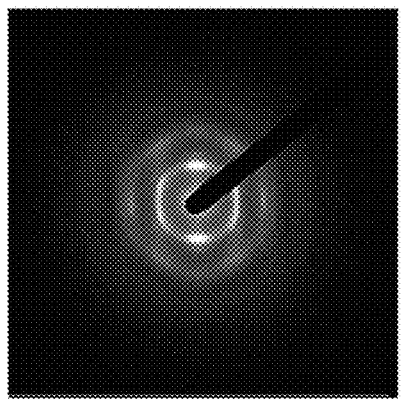
FIGS. 18A to 18C show electron diffraction patterns of a CAAC-OS.
Figure 18B:
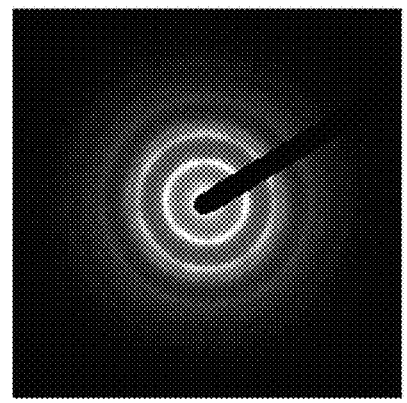

For example, when an electron beam with a probe diameter of 300 nm is incident on a CAAC-OS including an InGaZnO$_4$ crystal in a direction parallel to the sample surface, a diffraction pattern shown in FIG. 18A might be obtained. In this diffraction pattern, spots derived from the (009) plane of an InGaZnO$_4$ crystal are included. Thus, the electron diffraction also indicates that nanocrystals included in the CAAC-OS have c-axis alignment and that the c-axes are aligned in a direction substantially perpendicular to the formation surface or the top surface of the CAAC-OS. FIG. 18B shows a diffraction pattern when an electron beam with a probe diameter of 300 nm is incident on the same sample in a direction perpendicular to the sample surface. As shown in FIG. 18B, a ring-like diffraction pattern is observed. Thus, the electron diffraction also indicates that the a-axes and b-axes of the nanocrystals included in the CAAC-OS do not have regular alignment. Note that the first ring in FIG. 18B is considered to be derived from the (010) plane, the (100) plane, and the like. The second ring in FIG. 18B is considered to be derived from the (110) plane and the like.

Figure 18C:
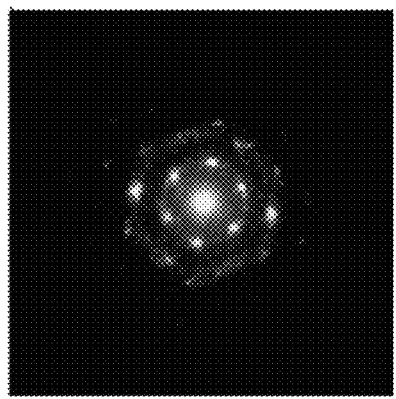

As described using the plan-view TEM images, the CAAC-OS has a region where the angles of hexagonal lattices are uniform. Thus, with use of an electron beam with a small probe diameter (e.g., 1 nm), a diffraction pattern having orientation shown in FIG. 18C may appear even when an electron beam is perpendicularly incident on the sample surface.

Figure 19A:
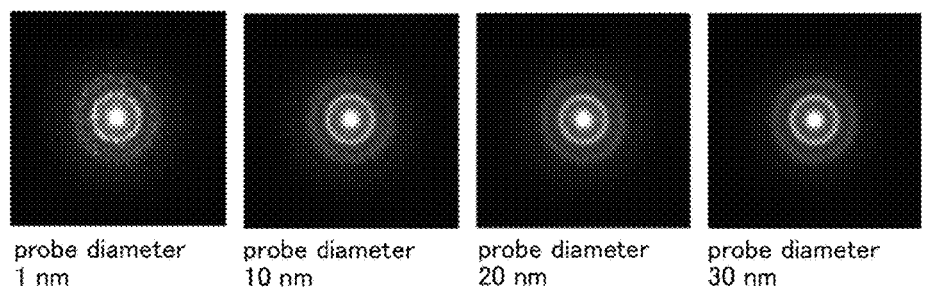
FIGS. 19A and 19B show electron diffraction patterns of an nc-OS.

Furthermore, an electron diffraction pattern like a halo pattern is observed when the nc-OS is subjected to diffraction using an electron beam having a probe diameter larger than the diameter of a crystal region (e.g., greater than or equal to 50 nm). In other words, even when an electron beam with a probe diameter larger than a crystal region is used, local existence of a crystal region is not observed in the nc-OS. For example, as shown in FIG. 19A, in a nanobeam electron diffraction pattern of the nc-OS with a thickness of approximately 50 nm, which is obtained by using a probe diameter of 30 nm, 20 nm, 10 nm, or 1 nm, regions with high luminance in a circular (ring) pattern are shown. Furthermore, when the probe diameter is decreased, the regions in a ring pattern are formed of a plurality of spots.

Figure 19B:
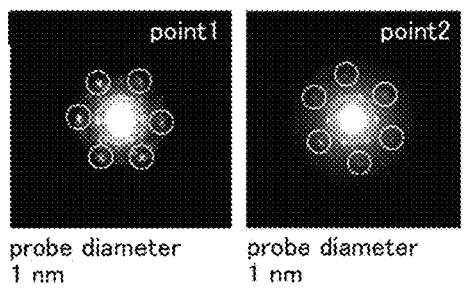

To analyze the structure in more detail, the nc-OS was thinned to obtain a sample with a thickness of several nanometers (approximately 5 nm). Then, an electron beam with a probe diameter of 1 nm entered the sample to obtain electron diffraction patterns. As a result, diffraction patterns having spots exhibiting crystallinity are obtained (see FIG. 19B). FIG. 19B shows that, in the nc-OS, a diffraction pattern exhibiting crystallinity is obtained, but orientation along a crystal plane in a particular direction is not observed.

Figure 20A:
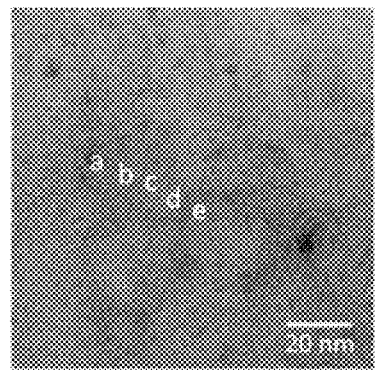
FIGS. 20A to 20L show plan-view TEM images, cross-sectional TEM images, and electron diffraction patterns of an oxide semiconductor.

When diffraction patterns are observed with use of an electron beam with a small probe diameter, a change in direction of a crystal axis at the junction of pellets of the CAAC-OS can be examined. FIG. 20A shows plan-view TEM image of the CAAC-OS. In FIG. 20A, a region a, a region b, a region c, a region d, and a region e are regions whose diffraction patterns are obtained with use of an electron beam with a probe diameter of 1 nm. The diffraction patterns of the region a, the region b, the region c, the region d, and the region e are respectively shown in FIG. 20B, FIG. 20C, FIG. 20D, FIG. 20E, and FIG. 20F.

Dashed lines in FIG. 20B, FIG. 20C, FIG. 20D, FIG. 20E, and FIG. 20F each indicate an a-axis or a b-axis. From the region a toward the region b, the region c, the region d, and the region e, a gentle change of the direction of a-axis or b-axis is observed (−7.5°, −8.4°, −23.1°, −24.6°, and −31.0°.

Figures 20B, 20C, 20D, 20E, 20F:
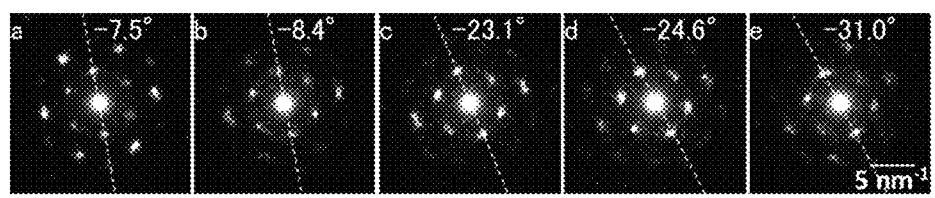
Figure 20G:
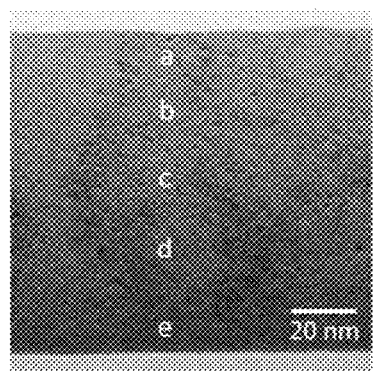
Figures 20H, 20I, 20J, 20K, 20L:
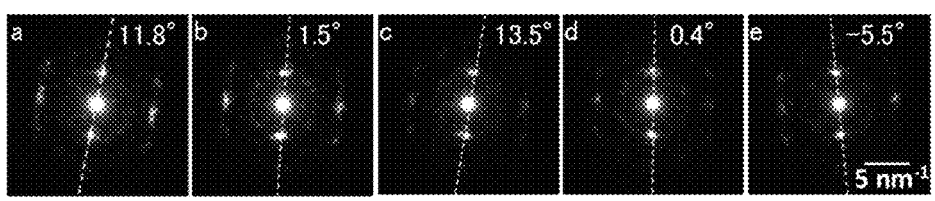

FIG. 20G shows a cross-sectional TEM image of a CAAC-OS. A region a, a region b, a region c, a region d, and a region e in FIG. 20G are regions whose diffraction patterns are obtained with use of an electron beam with a probe diameter of 1 nm. The diffraction patterns in the region a, the region b, the region c, the region d, and the region e are shown respectively in FIG. 20H, FIG. 20I, FIG. 20J, FIG. 20K, and FIG. 20L.

Dashed lines in FIG. 20H, FIG. 20I, FIG. 20J, FIG. 20K, and FIG. 20L each indicate a c-axis. In the region a, the region b, the region c, the region d, and the region e, the directions of c-axes are respectively 11.8°, 1.5°, 13.5°, 0.4°, and −5.5°, which indicates a gentle change of the direction of c-axis.

Thus, it is found that junctions of pellets are connected smoothly in the CAAC-OS.

Figure 21A:
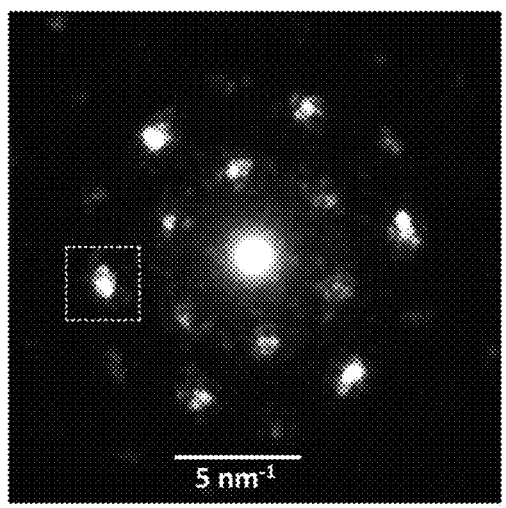
FIGS. 21A to 21D show electron diffraction patterns of an oxide semiconductor.
Figure 21B:
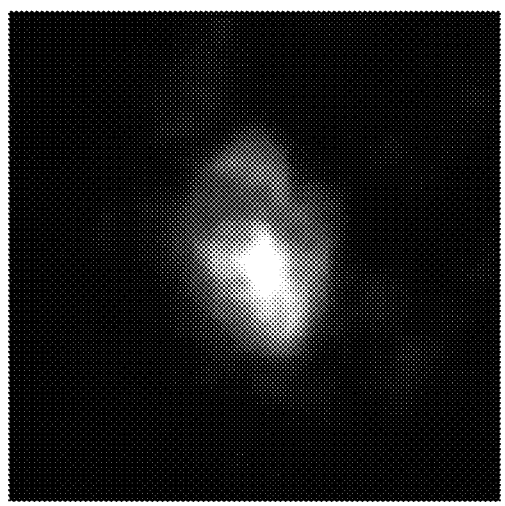

FIG. 21A shows a diffraction pattern the same as that in FIG. 20B. FIG. 21B shows an enlarged spot in a surrounded portion in FIG. 21A. According to FIG. 21B, the spot appearing in the diffraction pattern in the CAAC-OS is broad and anisotropic. This is similar to a diffraction pattern of polymer paracrystal disclosed in Non-Patent Document 5.

Figure 21C:
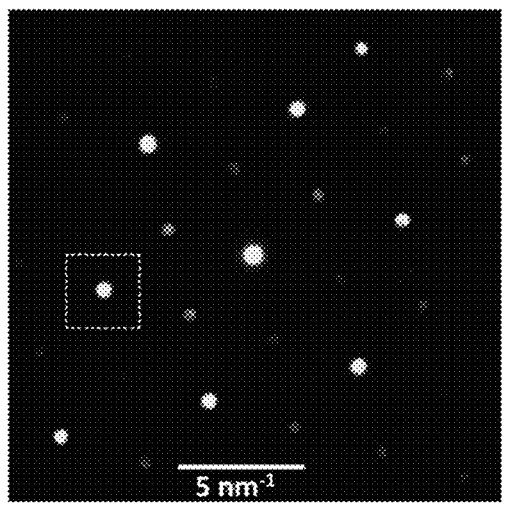
Figure 21D:
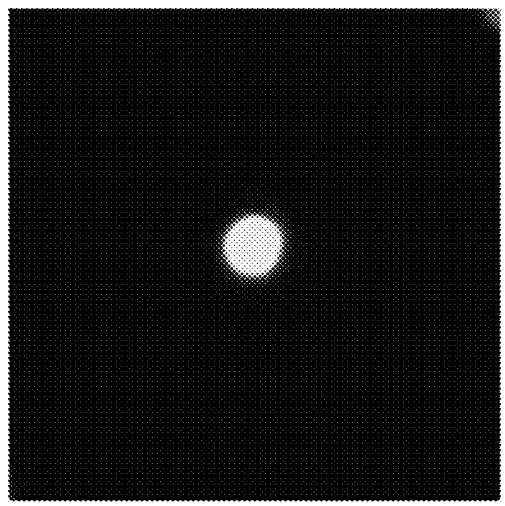

When an electron beam with a probe diameter of 1 nm is incident on one of crystal grains of a polycrystalline oxide semiconductor, a diffraction pattern shown in FIG. 21C is obtained. FIG. 21D shows an enlarged spot in a surrounded portion in FIG. 21C. According to FIG. 21D, the spot observed in the diffraction pattern of the polycrystalline oxide semiconductor is small and isotropic.

Thus, unlike the polycrystalline oxide semiconductor, the CAAC-OS has a fluctuation of atomic arrangement while having a periodic structure. In other words, the CAAC-OS has a displacement distribution in the periodic structure. From the above characteristics, the CAAC-OS can be regarded to have a structure different from those of an amorphous oxide semiconductor, a polycrystalline oxide semiconductor, and a single crystal oxide semiconductor.

<Stability>

Since the CAAC-OS and the nc-OS each have a stable structure, they can be subjected to structural analysis using an electron beam. Meanwhile, an a-like OS with an unstable structure easily changes by irradiation with an electron beam. Stability of a CAAC-OS, an nc-OS, and an a-like OS with respect to electron beam irradiation is described below.

Figure 22A:
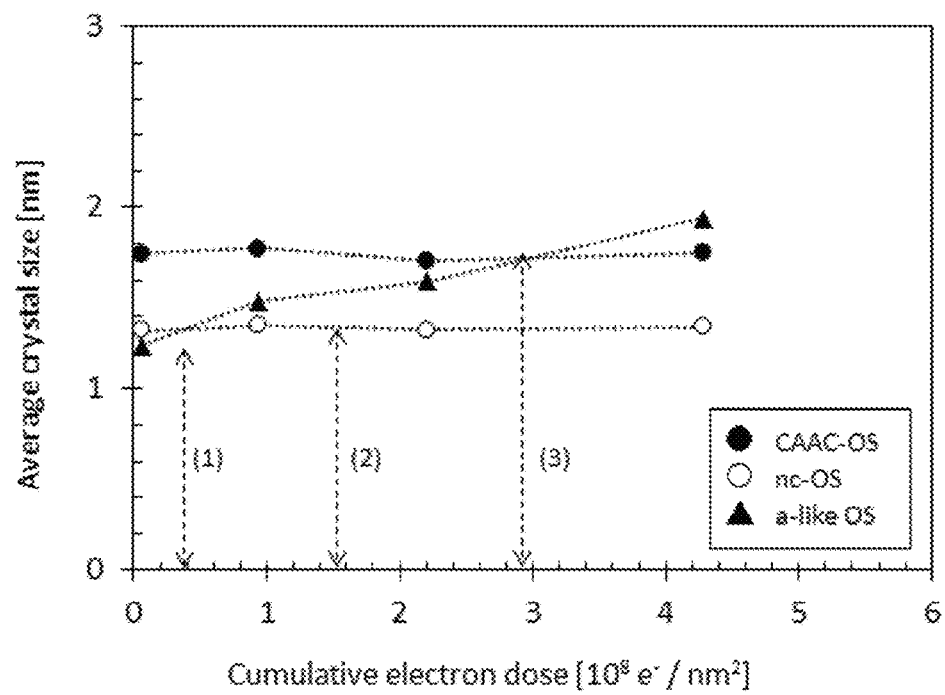
FIGS. 22A and 22B are each a graph showing a change in crystal size by irradiation on an oxide semiconductor with an electron beam.

FIG. 22A shows an examination example of the average size of crystal regions (at 22 points to 30 points) in each sample. Here, the size of crystal region corresponds to the length of lattice fringe. FIG. 22A indicates that the crystal region size in the a-like OS increases with an increase in the cumulative electron dose. Specifically, as shown by (1) in FIG. 22A, a crystal region of approximately 1.2 nm (also referred to as an initial nucleus) at the start of TEM observation grows to a size of approximately 1.9 nm at a cumulative electron dose of $4.2 \times 10^8$ e$^-$/nm$^2$. In contrast, the crystal region sizes in the nc-OS and the CAAC-OS each show little change from the start of electron irradiation to a cumulative electron dose of $4.2 \times 10^8$ e$^-$/nm$^2$. Specifically, as shown by (2) and (3) in FIG. 22A, the crystal region sizes in an nc-OS and a CAAC-OS are approximately 1.3 nm and approximately 1.8 nm, respectively, regardless of the cumulative electron dose. For observation of electron beam irradiation and TEM, a Hitachi H-9000NAR transmission electron microscope was used. The conditions of electron beam irradiations were as follows: the accelerating voltage was 300 kV; the current density was $6.7 \times 10^5$ e$^-$/(nm$^2$·s); and the diameter of irradiation region was 230 nm.

Figure 22B:
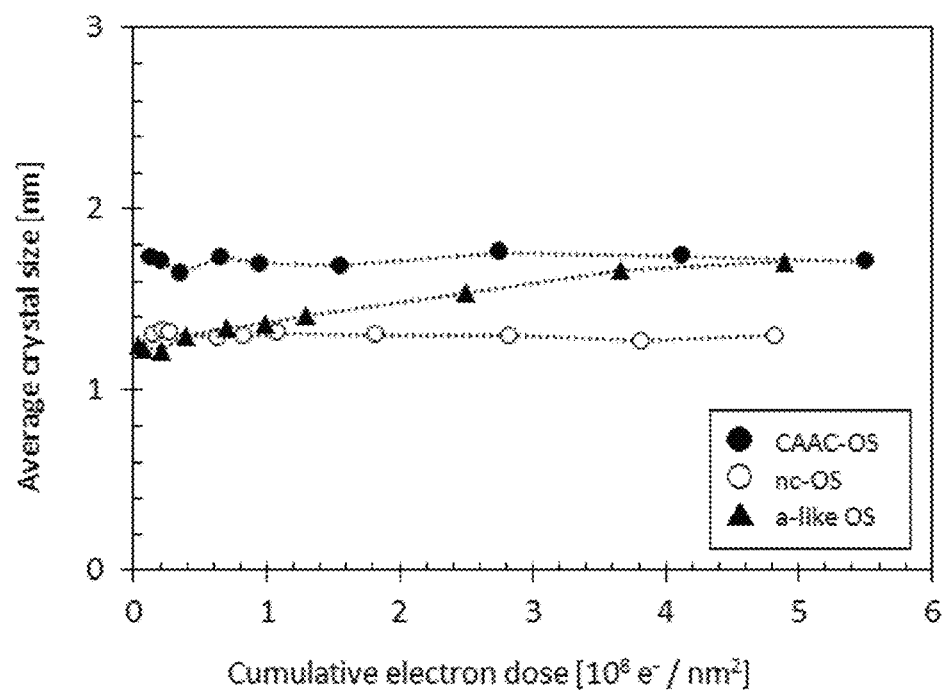

FIG. 22B shows results of analysis in moving images in order to examine the size of crystal regions under the small amount of cumulative electron dose. The focus adjustment for observation was performed in a region different from an analysis region. Thus, the analysis region was not irradiated with electrons during the focus adjustment. The size of crystal region was measured with use of a still image captured from a moving image from the TEM. According to FIG. 22B, in each of the nc-OS and the CAAC-OS, the size of crystal region does not change from the time of starting electron beam irradiation to the time of starting TEM observation. In the a-like OS, a crystal region exists both in the time of starting electron beam irradiation and in the time of starting TEM observation. For the electron beam irradiation and TEM observation, a spherical aberration corrector function of an atomic resolution analytical electron microscope JEM-ARM200F manufactured by JEOL Ltd. was used. The conditions of electron beam irradiations were as follows: the accelerating voltage was 200 kV; the current density was $2.5 \times 10^6$ e$^-$/(nm$^2$·s); and the diameter of irradiation region was 80 nm.

Next, in the CAAC-OS, the nc-OS, and the a-like OS each of which has been subjected to heat treatment, a change in crystal sizes caused by electron beam irradiation is measured by TEM. FIG. 23A shows results of the CAAC-OS, FIG. 23B shows results of the nc-OS, and FIG. 23C shows results of the a-like OS. In both the CAAC-OS and the nc-OS, the crystal sizes do not change significantly regardless of the temperature of the heat treatment and electron beam irradiation. In the a-like OS, the crystal size is increased due to electron beam irradiation. This might be attributed from voids in the a-like OS. This tendency is notable as the temperature of the heat treatment is lower.

As described in Reference, an oxide semiconductor having an absolutely amorphous structure has a characteristic that crystal growth occurs due to irradiation with an electron beam or the like. In view of this, the a-like OS has physical properties similar to those of an amorphous oxide semiconductor. However, a periodic structure is shown in a microscopic region in the a-like OS; that is, the a-like OS has higher order of atomic arrangement than an absolutely amorphous oxide semiconductor. Thus, in the case, for example, where an absolutely oxide semiconductor can be formed, the amorphous oxide semiconductor is supposed to have a more unstable structure than the a-like OS.

From the changes in crystal sizes due to the heat treatment and the electron beam irradiation, it is found that the CAAC-OS and the nc-OS have higher stability than the a-like OS.

In this manner, the structure of the a-like OS may change by electron beam irradiation and heat treatment. Crystal growth of nanocrystals and atoms at the periphery thereof easily occurs, which means that when the a-like OS is used for an element such a transistor, the element has instability. Thus, it might be impossible to achieve the practical uses of the a-like OS. In contrast, in the nc-OS and the CAAC-OS, growth of the crystal region is hardly induced by electron beam irradiation. Therefore, the a-like OS has an unstable structure as compared with the nc-OS and the CAAC-OS. As described above, it seems impossible that the a-like OS and the amorphous oxide semiconductor are put into practical usage.

The characteristics of an oxide semiconductor having the density of defect states might be changed by light, heat, or the like. Additionally, the impurities contained in the oxide semiconductor might serve as a carrier trap or a carrier generation source. Furthermore, oxygen vacancies in the oxide semiconductor serve as carrier traps or serve as carrier generation sources when hydrogen is captured therein.

The impurities indicate elements other than main components of the oxide semiconductor (the element such as hydrogen, carbon, silicon, and transition metal element). For example, an element (specifically, silicon or the like) having higher strength of bonding to oxygen than a metal element included in an oxide semiconductor extracts oxygen from the oxide semiconductor, which results in disorder of the atomic arrangement and reduces crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity. In other words, an oxide semiconductor with high crystallinity is an oxide semiconductor with few impurities and oxygen vacancies. Thus, the CAAC-OS is an oxide semiconductor with few impurities and oxygen vacancies.

The CAAC-OS having small amounts of impurities and oxygen vacancies is an oxide semiconductor with low carrier density (specifically, lower than $8 \times 10^{11}$/cm$^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<Film Density>

The a-like OS has lower density than the nc-OS and the CAAC-OS. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density lower than 78% of the density of the single crystal oxide semiconductor layer.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

<X-ray Diffraction>

Characteristics of a CAAC-OS, an nc-OS, and an a-like OS shown in X-ray diffraction (XRD) are described below.

Figure 24A:
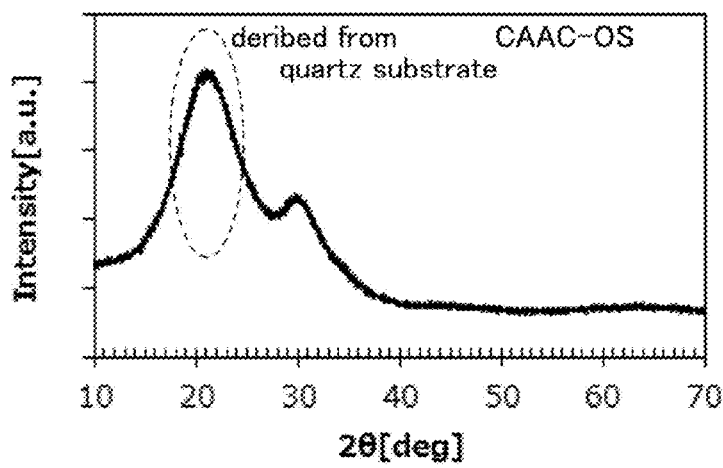
FIGS. 24A to 24C are graphs showing structure analysis of oxide semiconductors by XRD.

For example, when the structure of a CAAC-OS including an InGaZnO$_4$ crystal provided over a quartz substrate is analyzed by an out-of-plane method, a peak appears at a diffraction angle (2θ) of around 31° as shown in FIG. 24A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Figure 24B:
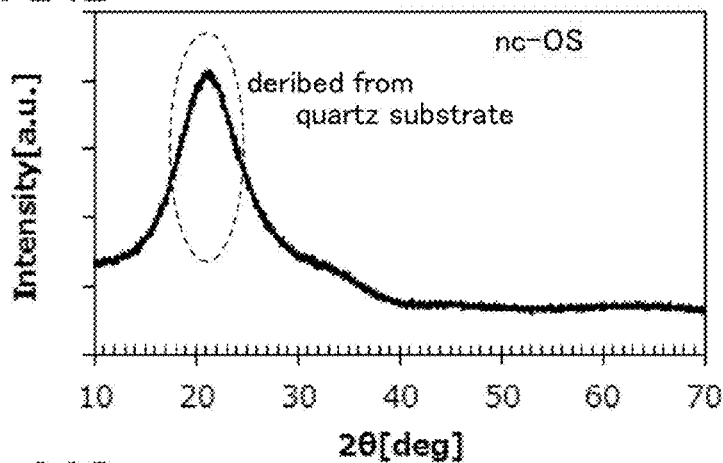
Figure 24C:
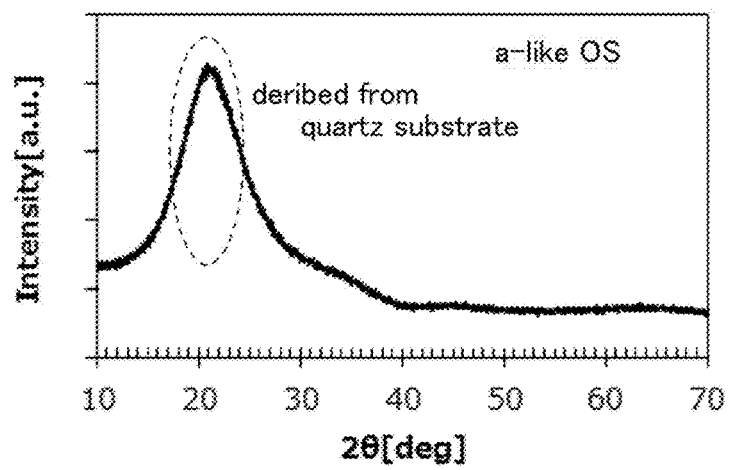

When an nc-OS which has a composition similar to that of the CAAC-OS and is provided over a quartz substrate is subjected to structural analysis by an out-of-plane method, a peak indicating crystallinity does not appear as shown in FIG. 24B. Furthermore, when an a-like OS provided over a quartz substrate is subjected to structural analysis by an out-of-plane method, a peak indicating crystallinity does not appear as shown in FIG. 24C. Thus, the nc-OS and the a-like OS cannot be distinguished with the structure analysis using XRD, which may mean that an attention is needed in the case where the structure of an oxide semiconductor is specified by the structure analysis using XRD (for example, another analysis method should be combined).

Note that in structural analysis of the CAAC-OS by an out-of-plane method, another peak may appear when 2θ is around 36°, in addition to the peak of 2θ at around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 25A:
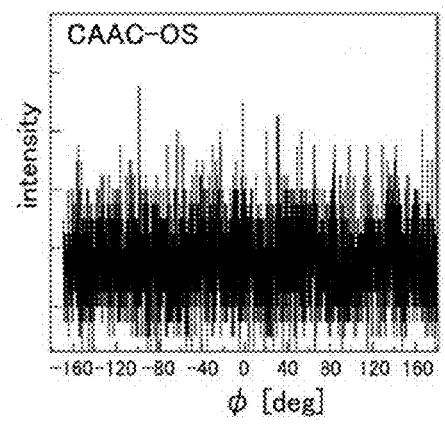
FIGS. 25A and 25B are graphs showing structure analysis of oxide semiconductors by XRD.
Figure 25B:
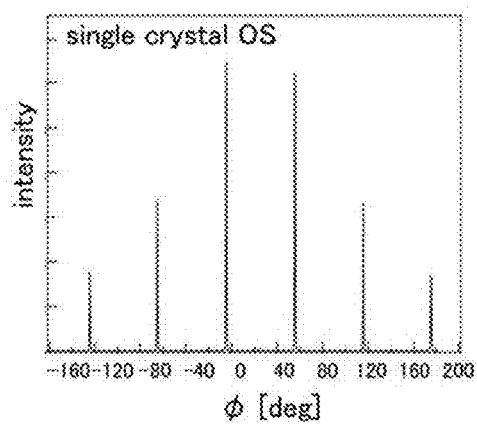
Figure 26A:
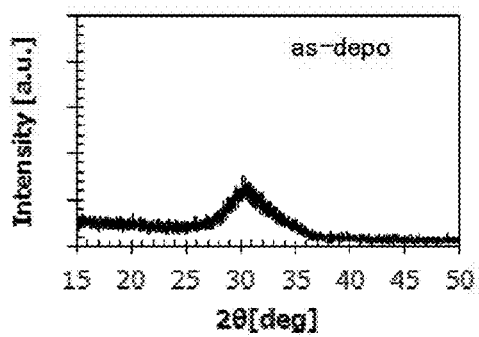
FIGS. 26A to 26E are graphs showing structure analysis of oxide semiconductors by XRD.
Figure 26B:
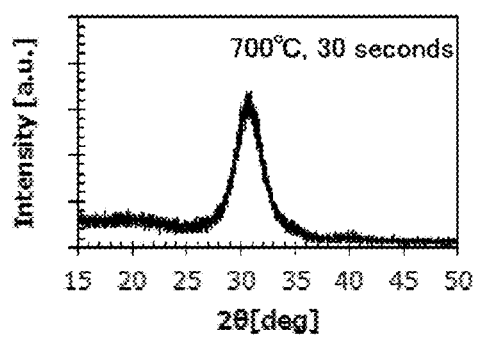
Figure 26C:
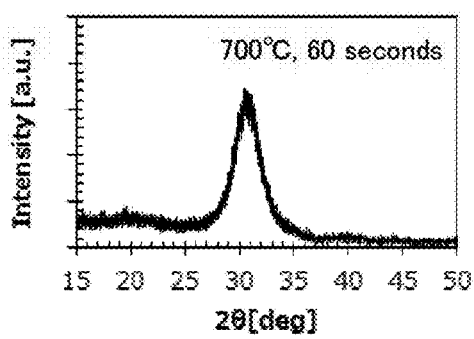
Figure 26D:
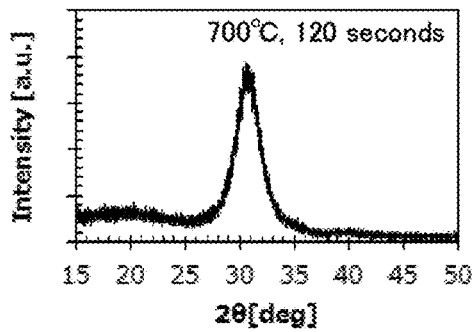
Figure 26E:
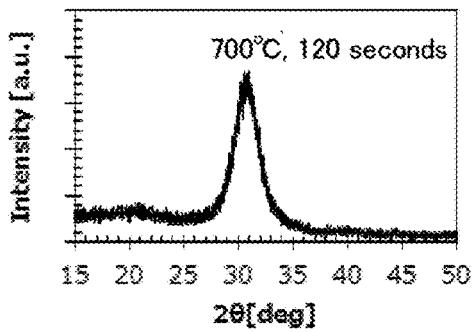

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at in the vicinity of 56° and with the sample rotated about a normal vector of the sample surface as an axis (φ axis), as shown in FIG. 25A, a peak is not clearly observed. In contrast, in the case of a single crystal oxide semiconductor of InGaZnO$_4$, when φ scan is performed with 2θ fixed at around 56°, six peaks which are derived from crystal planes equivalent to the (110) plane are observed as shown in FIG. 25B. Accordingly, the structural analysis using XRD shows that the directions of a-axes and b-axes are irregularly orientated in the CAAC-OS.

<Heat Treatment>

The distortion or fluctuation in a CAAC-OS can also be observed by the structural analysis with XRD. FIGS. 26A to 26E show the results of structure analysis of a CAAC-OS by an out-of-plane method. The CAAC-OS is provided over a silicon substrate including a 100-nm-thick thermal oxidation film, and the CAAC-OS is subjected to heat treatment before the out-of-plane method is performed. Note that for the structural analysis, a thin film method is performed. In the thin film method, an angle w of an X-ray source is fixed at an extremely small angle with respect to a top surface of the sample, and an angle θ of a detector is varied. For the heat treatment, lamp heating is performed plural times for 30 seconds, 60 seconds, 120 seconds, and 180 seconds at 700° C. in an oxygen atmosphere with use of a rapid thermal annealing (RTA) apparatus. For reference, a CAAC-OS that is not subjected to heat treatment (the CAAC-OS is expressed as as-depo) is shown.

FIG. 27 shows the peak intensity and full width at half maximum (FWHM) of each peak of 2θ at around 31° observed in FIGS. 26A to 26E. According to FIG. 27, the peak intensity is increased and the FWHM is decreased when heat treatment is performed on the CAAC-OS. In other words, the crystallinity of CAAC-OS is increased by heat treatment.

Figure 28:
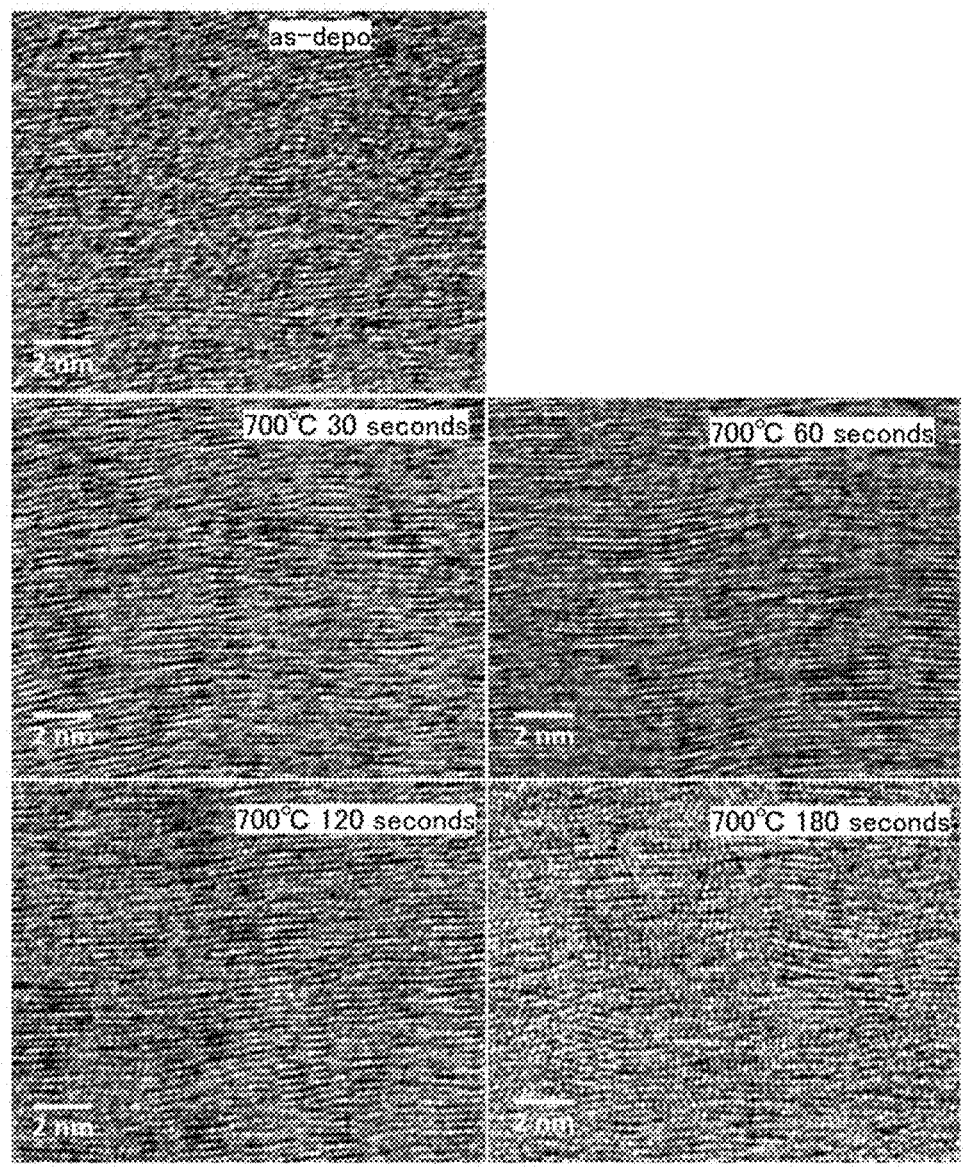
FIG. 28 shows cross-sectional TEM images of oxide semiconductors.

To confirm the above, cross-sectional TEM images of the same samples were obtained (see FIG. 28). From FIG. 28, it is found that the crystallinity of CAAC-OS is increased by heat treatment.

Heat treatment with an RTA apparatus is effective for an improvement in productivity because it needs short time as compared with the case of using a furnace. As described above, as the temperature and time of heat treatment are increased, the density of CAAC-OS is further increased, and the physical properties of CAAC-OS can be closer to those of single crystal.

<Composition>

Composition of a CAAC-OS is described below. For explanation of the composition, the case of an In-M-Zn oxide that is an oxide semiconductor to be a CAAC-OS is described as an example. The element M is aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like.

Figure 29:
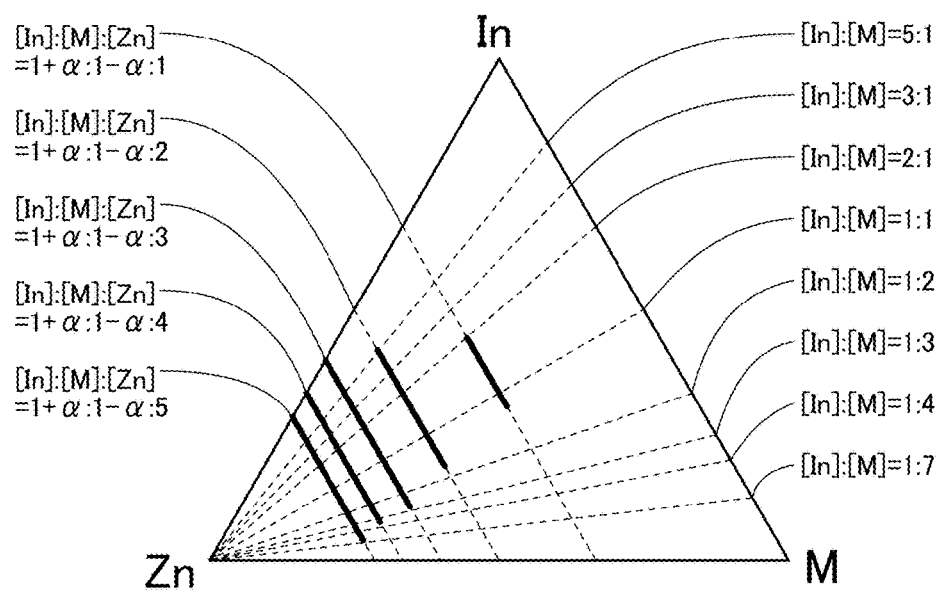
FIG. 29 is a triangular diagram for explaining composition of an In-M-Zn oxide.

FIG. 29 is a triangular diagram in which the vertices represent In, M, and Zn. In the diagram, [In] means the atomic concentration of In, [M] means the atomic concentration of the element M, and [Zn] means the atomic concentration of Zn.

A crystal of an In-M-Zn oxide is known to have a homologous structure and is represented by $InMO_3(ZnO)_m$ (m is a natural number). Since In and M can be interchanged, the crystal can also be represented by $In_{1+\alpha}M_{1-\alpha}O_3(ZnO)_m$. This composition is represented by any of the dashed lines denoted as [In]:[M]:[Zn]=1+α:1−α:1, [In]:[M]:[Zn]=1+α:1−α:2, [In]:[M]:[Zn]=1+α:1−α:3, [In]:[M]:[Zn]=1+α:1−α:4, and [In]:[M]:[Zn]=1+α:1−α:5. Note that the bold line on the dashed line represents, for example, the composition that allows an oxide as a raw material mixed and subjected to baking at 1350° C. to be a solid solution.

Therefore, when an oxide has a composition close to the above composition that allows the oxide to be a solid solution, a CAAC-OS having a large region with a single crystal structure can be obtained. When an In-M-Zn oxide is deposited by a sputtering method, the composition of a target is different from the composition of a film in some cases. For example, in the case of using, as a target, an In-M-Zn oxide in which an atomic ratio is 1:1:1, 1:1:1.2, 3:1:2, 4:2:4.1, 1:3:2, 1:3:4, or 1:4:5, an atomic ratio of a film is 1:1:0.7 (approximately 0.5 to 0.9), 1:1:0.9 (approximately 0.8 to 1.1), 3:1:1.5 (approximately 1 to 1.8), 4:2:3 (approximately 2.6 to 3.6), 1:3:1.5 (approximately 1 to 1.8), 1:3:3 (approximately 2.5 to 3.5), or 1:4:4 (approximately 3.4 to 4.4). Thus, in order to obtain a film with a desired composition, a composition of a target may be selected in consideration of a change in the composition.

When a CAAC-OS is deposited, because of heating of a substrate surface (the surface on which the CAAC-OS is deposited), space heating, or the like, the composition of the film is sometimes different from that of a target as a source or the like. For example, since zinc oxide sublimates more easily than indium oxide, gallium oxide, or the like, the source and the film are likely to have different compositions. Thus, a source is preferably selected taking into account the change in composition. Note that a difference between the compositions of the source and the film is also affected by a pressure or a gas used for the deposition as well as a temperature.

<Sputtering Apparatus>

A sputtering apparatus of one embodiment of the present invention is described below.

Figure 30A:
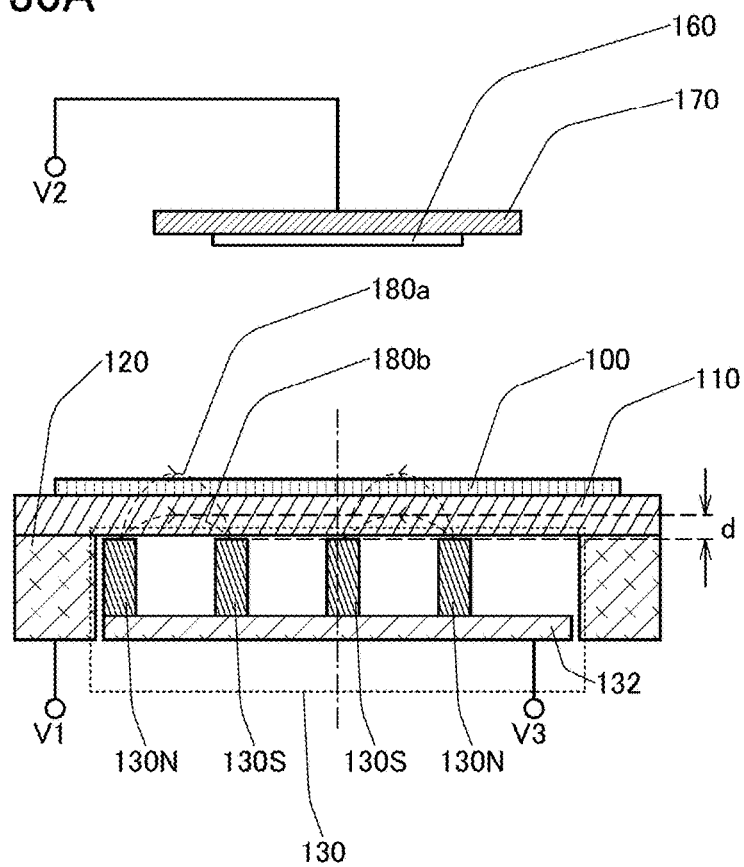
FIGS. 30A and 30B are diagrams each illustrating a sputtering apparatus.

FIG. 30A is a cross-sectional view of a deposition chamber 101 that is a sputtering apparatus. The deposition chamber 101 in FIG. 30A includes a target holder 120, a backing plate 110, a target 100, a magnet unit 130, and a substrate holder 170. Note that the target 100 is placed over the backing plate 110. The backing plate 110 is placed over the target holder 120. The magnet unit 130 is placed under the target 100 with the backing plate 110 positioned therebetween. The substrate holder 170 faces the target 100. Note that in this specification, a magnet unit means a group of magnets. The magnet unit can be replaced with "cathode", "cathode magnet", "magnetic member", "magnetic part", or the like. The magnet unit 130 includes a magnet 130N, a magnet 130S, and a magnet holder 132. Note that in the magnet unit 130, the magnet 130N and the magnet 130S are placed over the magnet holder 132. The magnet 130N and the magnet 130S are spaced. When a substrate 160 is transferred into the deposition chamber 101, the substrate 160 is placed on the substrate holder 170.

The target holder 120 and the backing plate 110 are fixed to each other with a bolt and have the same potential. The target holder 120 has a function of supporting the target 100 with the backing plate 110 positioned therebetween.

The backing plate 110 has a function of fixing the target 100.

FIG. 30A illustrates a magnetic force line 180a and a magnetic force line 180b formed by the magnet unit 130.

The magnetic force line 180a is one of magnetic force lines that form a horizontal magnetic field in the vicinity of a top surface of the target 100. The vicinity of the top surface of the target 100 corresponds to a region in which the vertical distance from the top surface of the target 100 is, for example, greater than or equal to 0 mm and less than or equal to 10 mm, in particular, greater than or equal to 0 mm and less than or equal to 5 mm.

The magnetic force line 180b is one of magnetic force lines that form a horizontal magnetic field in a plane apart from the top surface of the magnet unit 130 by a vertical distance d. The vertical distance d is, for example, greater than or equal to 0 mm and less than or equal to 20 mm or greater than or equal to 5 mm and less than or equal to 15 mm.

Here, with use of the strong magnet 130N and the strong magnet 130S, an intense magnetic field can be generated in the vicinity of the top surface of the substrate 160. Specifically, the intensities of the horizontal magnetic field on the top surface of the substrate 160 can be greater than or equal to 10 G and less than or equal to 100 G, preferably greater than or equal to 15 G and less than or equal to 60 G, further preferably greater than or equal to 20 G and less than or equal to 40 G. When the intense of the horizontal magnetic field on the top surface of the substrate 160 is in the above range, a deposition model described later can be realized.

Note that the intensity of the horizontal magnetic field may be measured when the intensity of the vertical magnetic field is 0 G.

By setting the intensity of the magnetic field in the deposition chamber 101 to be in the above range, an oxide semiconductor with high density and high crystallinity can be deposited. The deposited oxide hardly includes plural kinds of crystal phases and is a substantially-single crystalline phase.

Figure 30B:
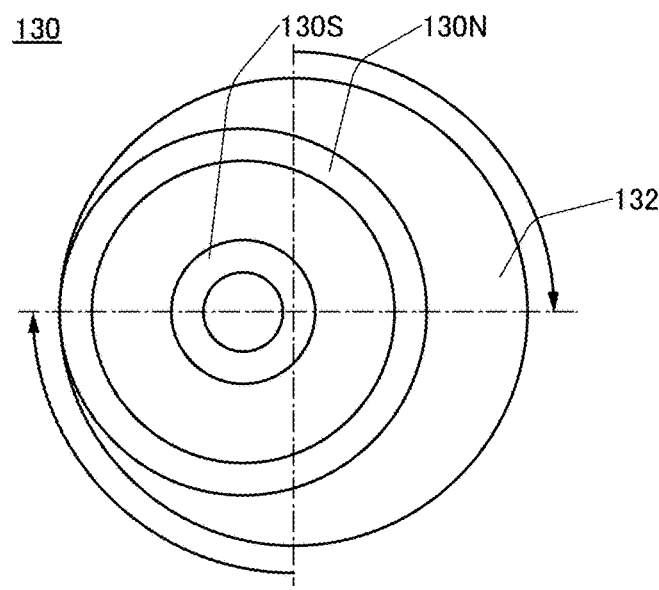

FIG. 30B is a top view of the magnet unit 130. In the magnet unit 130, the circular or substantially circular magnet 130N and the circular or substantially circular magnet 130S are fixed to the magnet holder 132. The magnet unit 130 can be rotated about a normal vector at the center of the top surface of the magnet unit 130 or a normal vector substantially at the center of the top surface of the magnet unit 130. For example, the magnet unit 130 may be rotated with a beat (also referred to as rhythm, pulse, frequency, period, cycle, or the like) greater than or equal to 0.1 Hz and less than or equal to 1 kHz.

Thus, a region where a magnetic field on the target 100 is intense changes as the magnet unit 130 is rotated. The region with an intense magnetic field is a high-density plasma region; thus, sputtering of the target 100 easily occurs in the vicinity of the region. For example, when the region with an intense magnetic field is fixed, only a specific region of the target 100 is used. In contrast, when the magnet unit 130 is rotated as shown in FIG. 30B, the target 100 can be uniformly used. By rotating the magnet unit 130, a film with a uniform thickness and uniform quality can be deposited.

By rotating the magnet unit 130, the direction of the magnetic force line on the top surface of the substrate 160 can also be changed.

Although the magnet unit 130 is rotated in this example, one embodiment of the present invention is not limited to this example. For example, the magnet unit 130 may be oscillated vertically or horizontally. For example, the magnet unit 130 may be moved with a beat greater than or equal to 0.1 Hz and less than or equal to 1 kHz. Alternatively, the target 100 may be rotated or moved. For example, the target 100 may be rotated or moved with a beat greater than or equal to 0.1 Hz and less than or equal to 1 kHz. Further alternatively, the direction of a magnetic force line on the top surface of the substrate 160 may be changed relatively by rotating the substrate 160. These methods may be combined.

The deposition chamber 101 may have a water channel inside or under the backing plate 110. By making fluid (air, nitrogen, a rare gas, water, oil, or the like) flow through the water channel, discharge anomaly due to an increase in the temperature of the target 100 or damage to the deposition chamber 101 due to deformation of a component can be prevented in the sputtering. In that case, the backing plate 110 and the target 100 are preferably adhered to each other with a bonding member because the cooling capability is increased.

A gasket is preferably provided between the target holder 120 and the backing plate 110, in which case an impurity is less likely to enter the deposition chamber 101 from the outside or the water channel.

In the magnet unit 130, the magnet 130N and the magnet 130S are placed such that their surfaces on the target 100 side have opposite polarities. Here, the case where the pole of the magnet 130N on the target 100 side is the north pole and the pole of the magnet 130S on the target 100 side is the south pole is described. Note that the layout of the magnets and the poles in the magnet unit 130 are not limited to those described here or those illustrated in FIG. 30A.

In the deposition, a potential V1 applied to a terminal V1 connected to the target holder 120 is, for example, lower than a potential V2 applied to a terminal V2 connected to the substrate holder 170. The potential V2 applied to the terminal V2 connected to the substrate holder 170 is, for example, the ground potential. A potential V3 applied to a terminal V3 connected to the magnet holder 132 is, for example, the ground potential. Note that the potentials applied to the terminals V1, V2, and V3 are not limited to the above description. Not all the target holder 120, the substrate holder 170, and the magnet holder 132 are necessarily supplied with potentials. For example, the substrate holder 170 may be electrically floating. Note that although the potential V1 is applied to the terminal V1 connected to the target holder 120 (i.e., a DC sputtering method is employed) in the example illustrated in FIG. 30A, one embodiment of the present invention is not limited thereto. For example, it is possible to employ what is called an RF sputtering method, in which case a high-frequency power supply with a frequency of 13.56 MHz or 27.12 MHz, for example, is connected to the target holder 120.

FIG. 30A illustrate an example where the backing plate 110 and the target holder 120 are not electrically connected to the magnet unit 130 and the magnet holder 132, but electrical connection is not limited thereto. For example, the backing plate 110 and the target holder 120 may be electrically connected to the magnet unit 130 and the magnet holder 132, and the backing plate 110, the target holder 120, the magnet unit 130, and the magnet holder 132 may have the same potential.

To increase the crystallinity of the formed oxide, the temperature of the substrate 160 may be set high. By setting the temperature of the substrate 160 high, migration of sputtered particles at the top surface of the substrate 160 can be promoted. Thus, an oxide with higher density and higher crystallinity can be deposited. Note that the temperature of the substrate 160 is, for example, higher than or equal to 100° C. and lower than or equal to 450° C., preferably higher than or equal to 150° C. and lower than or equal to 400° C., further preferably higher than or equal to 170° C. and lower than or equal to 350° C.

When the partial pressure of oxygen in the deposition gas is too high, an oxide including plural kinds of crystal phases is likely to be deposited; therefore, a mixed gas of oxygen and a rare gas such as argon (other examples of the rare gas are helium, neon, krypton, and xenon) is preferably used as the deposition gas. For example, the proportion of oxygen in the whole deposition gas is less than 50 vol %, preferably less than or equal to 33 vol %, further preferably less than or equal to 20 vol %, still further preferably less than or equal to 15 vol %.

The vertical distance between the target 100 and the substrate 160 is greater than or equal to 10 mm and less than or equal to 600 mm, preferably greater than or equal to 20 mm and less than or equal to 400 mm, further preferably greater than or equal to 30 mm and less than or equal to 200 mm, still further preferably greater than or equal to 40 mm and less than or equal to 100 mm. Within the above range, the vertical distance between the target 100 and the substrate 160 is small enough to suppress a decrease in the energy of the sputtered particles until the sputtered particles reach the substrate 160 in some cases. Within the above range, the vertical distance between the target 100 and the substrate 160 is large enough to make the incident direction of the sputtered particle approximately vertical to the substrate 160, so that damage to the substrate 160 caused by collision of the sputtered particles can be reduced in some cases.

Figure 31A:
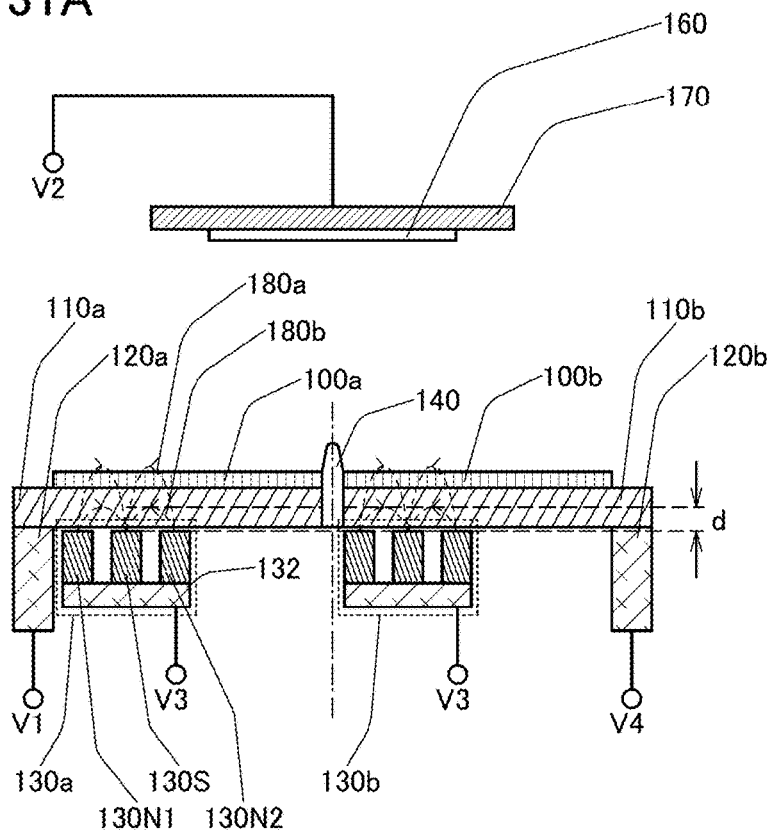
FIGS. 31A and 31B are diagrams each illustrating a sputtering apparatus.

FIG. 31A illustrates an example of a deposition chamber different from that in FIG. 30A.

The deposition chamber 101 in FIG. 31A includes a target holder 120a, a target holder 120b, a backing plate 110a, a backing plate 110b, a target 100a, a target 100b, a magnet unit 130a, a magnet unit 130b, a member 140, and the substrate holder 170. Note that the target 100a is placed over the backing plate 110a. The backing plate 110a is placed over the target holder 120a. The magnet unit 130a is placed under the target 100a with the backing plate 110a positioned therebetween. The target 100b is placed over the backing plate 110b. The backing plate 110b is placed over the target holder 120b. The magnet unit 130b is placed under the target 100b with the backing plate 110b positioned therebetween.

The magnet unit 130a includes a magnet 130N1, a magnet 130N2, the magnet 130S, and the magnet holder 132. Note that in the magnet unit 130a, the magnet 130N1, the magnet 130N2, and the magnet 130S are placed over the magnet holder 132. The magnet 130N1, the magnet 130N2, and the magnet 130S are spaced. Note that the magnet unit 130b has a structure similar to that of the magnet unit 130a. When a substrate 160 is transferred into the deposition chamber 101, the substrate 160 is placed on the substrate holder 170.

The target 100a, the backing plate 110a, and the target holder 120a are separated from the target 100b, the backing plate 110b, and the target holder 120b by the member 140. Note that the member 140 is preferably an insulator. The member 140 may be a conductor or a semiconductor. The member 140 may be a conductor or a semiconductor whose surface is covered with an insulator.

The target holder 120a and the backing plate 110a are fixed to each other with a bolt and have the same potential. The target holder 120a has a function of supporting the target 100a with the backing plate 110a positioned therebetween. The target holder 120b and the backing plate 110b are fixed to each other with a bolt and have the same potential. The target holder 120b has a function of supporting the target 100b with the backing plate 110b positioned therebetween.

The backing plate 110a has a function of fixing the target 100a. The backing plate 110b has a function of fixing the target 100b.

FIG. 31A illustrates the magnetic force line 180a and the magnetic force line 180b formed by the magnet unit 130a.

The magnetic force line 180a is one of magnetic force lines that form a horizontal magnetic field in the vicinity of a top surface of the target 100a. The vicinity of the top surface of the target 100a corresponds to a region in which the vertical distance from the top surface of the target 100a is, for example, greater than or equal to 0 mm and less than or equal to 10 mm, in particular, greater than or equal to 0 mm and less than or equal to 5 mm.

The magnetic force line 180b is one of magnetic force lines that form a horizontal magnetic field in a plane apart from the top surface of the magnet unit 130a by a vertical distance d. The vertical distance d is, for example, greater than or equal to 0 mm and less than or equal to 20 mm or greater than or equal to 5 mm and less than or equal to 15 mm.

Here, with use of the strong magnet 130N1, the strong magnet 130N2, and the strong magnet 130S, an intense magnetic field can be generated in the vicinity of the top surface of the substrate 160. Specifically, the intense of the horizontal magnetic field on the top surface of the substrate 160 can be greater than or equal to 10 G and less than or equal to 100 G, preferably greater than or equal to 15 G and less than or equal to 60 G, further preferably greater than or equal to 20 G and less than or equal to 40 G. When the intense of the horizontal magnetic field on the top surface of the substrate 160 is in the above range, a deposition model described later can be realized.

By setting the intensity of the magnetic field in the deposition chamber 101 to be in the above range, an oxide semiconductor with high density and high crystallinity can be deposited. The deposited oxide hardly includes plural kinds of crystal phases and is a substantially-single crystalline phase.

Note that the magnet unit 130b forms a magnetic force line similar to that formed by the magnet unit 130a.

Figure 31B:
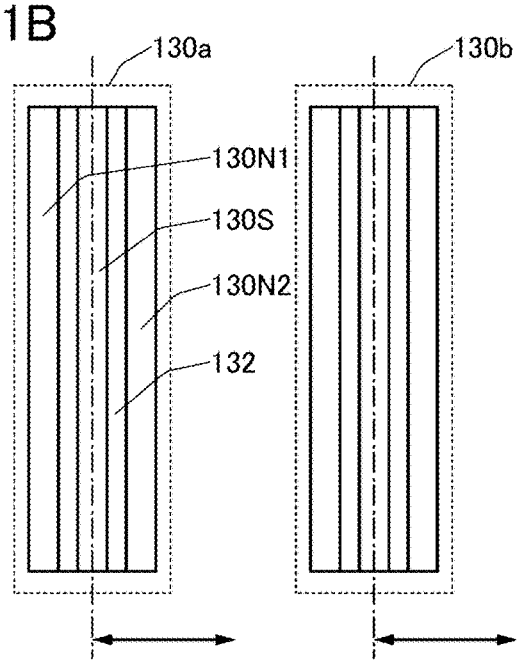

FIG. 31B is a top view of the magnet units 130a and 130b. In the magnet unit 130a, the rectangular or substantially rectangular magnet 130N1, the rectangular or substantially rectangular magnet 130N2, and the rectangular or substantially rectangular magnet 130S are fixed to the magnet holder 132. The magnet unit 130a can be oscillated horizontally as shown in FIG. 31B. For example, the magnet unit 130a may be oscillated with a beat greater than or equal to 0.1 Hz and less than or equal to 1 kHz.

Thus, a region where a magnetic field on the target 100a is intense changes as the magnet unit 130a is oscillated. The region with an intense magnetic field is a high-density plasma region; thus, sputtering of the target 100a easily occurs in the vicinity of the region. For example, when the region with an intense magnetic field is fixed, only a specific region of the target 100a is used. In contrast, when the magnet unit 130a is oscillated as shown in FIG. 31B, the target 100a can be uniformly used. By oscillating the magnet unit 130a, a film with a uniform thickness and uniform quality can be deposited.

By oscillating the magnet unit 130a, the state of the magnetic force line on the top surface of the substrate 160 can also be changed. The same applies to the magnet unit 130b.

Although the magnet unit 130a and the magnet unit 130b are oscillated in this example, one embodiment of the present invention is not limited to this example. For example, the magnet unit 130a and the magnet unit 130b may be rotated. For example, the magnet unit 130a and the magnet unit 130b may be rotated with a beat greater than or equal to 0.1 Hz and less than or equal to 1 kHz. Alternatively, the target 100 may be rotated or moved. For example, the target 100 may be rotated or moved with a beat greater than or equal to 0.1 Hz and less than or equal to 1 kHz. Further alternatively, the state of a magnetic force line on the top surface of the substrate 160 may be changed relatively by rotating the substrate 160. These methods may be combined.

The deposition chamber 101 may have a water channel inside or under the backing plate 110a and the backing plate 110b. By making fluid (air, nitrogen, a rare gas, water, oil, or the like) flow through the water channel, discharge anomaly due to an increase in the temperature of the target 100a and the target 100b or damage to the deposition chamber 101 due to deformation of a component can be prevented in the sputtering. In that case, the backing plate 110a and the target 100a are preferably adhered to each other with a bonding member because the cooling capability is increased. Furthermore, the backing plate 110b and the target 100b are preferably adhered to each other with a bonding member because the cooling capability is increased.

A gasket is preferably provided between the target holder 120a and the backing plate 110a, in which case an impurity is less likely to enter the deposition chamber 101 from the outside or the water channel. A gasket is preferably provided between the target holder 120b and the backing plate 110b, in which case an impurity is less likely to enter the deposition chamber 101 from the outside or the water channel.

In the magnet unit 130a, the magnets 130N1 and 130N2 and the magnet 130S are placed such that their surfaces on the target 100a side have opposite polarities. Here, the case where the pole of each of the magnets 130N1 and 130N2 on the target 100a side is the north pole and the pole of the magnet 130S on the target 100a side is the south pole is described. Note that the layout of the magnets and the poles in the magnet unit 130a are not limited to those described here or those illustrated in FIG. 31A. The same applies to the magnet unit 130b.

In the deposition, a potential whose level is varied between a high level and a low level is applied to the terminal V1 connected to the target holder 120a and a terminal V4 connected to the target holder 120b. The potential V2 applied to the terminal V2 connected to the substrate holder 170 is, for example, the ground potential. A potential V3 applied to a terminal V3 connected to the magnet holder 132 is, for example, the ground potential. Note that the potentials applied to the terminals V1, V2, V3, and V4 are not limited to the above description. Not all the target holder 120a, the target holder 120b, the substrate holder 170, and the magnet holder 132 are necessarily supplied with potentials. For example, the substrate holder 170 may be electrically floating. Note that the potential whose level is varied between the high level and the low level is applied to the terminal V1 connected to the target holder 120a and the terminal V4 connected to the target holder 120b (i.e., an AC sputtering method is employed) in the example illustrated in FIG. 31A; however, one embodiment of the present invention is not limited thereto.

FIG. 31A illustrates an example where the backing plate 110a and the target holder 120a are not electrically connected to the magnet unit 130a and the magnet holder 132, but electrical connection is not limited thereto. For example, the backing plate 110a and the target holder 120a may be electrically connected to the magnet unit 130a and the magnet holder 132, and the backing plate 110a, the target holder 120a, the magnet unit 130a, and the magnet holder 132 may have the same potential. The backing plate 110b and the target holder 120b are not electrically connected to the magnet unit 130b and the magnet holder 132 in the example, but electrical connection is not limited thereto. For example, the backing plate 110b and the target holder 120b may be electrically connected to the magnet unit 130b and the magnet holder 132, and the backing plate 110b, the target holder 120b, the magnet unit 130b, and the magnet holder 132 may have the same potential.

To increase the crystallinity of the formed oxide, the temperature of the substrate 160 may be set high. By setting the temperature of the substrate 160 high, migration of sputtered particles at the top surface of the substrate 160 can be promoted. Thus, an oxide with higher density and higher crystallinity can be deposited. Note that the temperature of the substrate 160 is, for example, higher than or equal to 100° C. and lower than or equal to 450° C., preferably higher than or equal to 150° C. and lower than or equal to 400° C., further preferably higher than or equal to 170° C. and lower than or equal to 350° C.

When the partial pressure of oxygen in the deposition gas is too high, an oxide including plural kinds of crystal phases is likely to be deposited; therefore, a mixed gas of oxygen and a rare gas such as argon (other examples of the rare gas are helium, neon, krypton, and xenon) is preferably used as the deposition gas. For example, the proportion of oxygen in the whole deposition gas is less than 50 vol %, preferably less than or equal to 33 vol %, further preferably less than or equal to 20 vol %, still further preferably less than or equal to 15 vol %.

The vertical distance between the target 100a and the substrate 160 is greater than or equal to 10 mm and less than or equal to 600 mm, preferably greater than or equal to 20 mm and less than or equal to 400 mm, further preferably greater than or equal to 30 mm and less than or equal to 200 mm, still further preferably greater than or equal to 40 mm and less than or equal to 100 mm. Within the above range, the vertical distance between the target 100a and the substrate 160 is small enough to suppress a decrease in the energy of the sputtered particles until the sputtered particles reach the substrate 160 in some cases. Within the above range, the vertical distance between the target 100a and the substrate 160 is large enough to make the incident direction of the sputtered particle approximately vertical to the substrate 160, so that damage to the substrate 160 caused by collision of the sputtered particles can be reduced in some cases.

The vertical distance between the target 100b and the substrate 160 is greater than or equal to 10 mm and less than or equal to 600 mm, preferably greater than or equal to 20 mm and less than or equal to 400 mm, further preferably greater than or equal to 30 mm and less than or equal to 200 mm, still further preferably greater than or equal to 40 mm and less than or equal to 100 mm. Within the above range, the vertical distance between the target 100b and the substrate 160 is small enough to suppress a decrease in the energy of the sputtered particles until the sputtered particles reach the substrate 160 in some cases. Within the above range, the vertical distance between the target 100b and the substrate 160 is large enough to make the incident direction of the sputtered particle approximately vertical to the substrate 160, so that damage to the substrate 160 caused by collision of the sputtered particles can be reduced in some cases.

<Deposition Apparatus>

A deposition apparatus including a deposition chamber with which the above-described CAAC-OS can be deposited is described below.

First, a structure of a deposition apparatus which allows the entry of few impurities into a film at the time of the deposition or the like is described with reference to FIG. 32 and FIGS. 33A to 33C.

Figure 32:
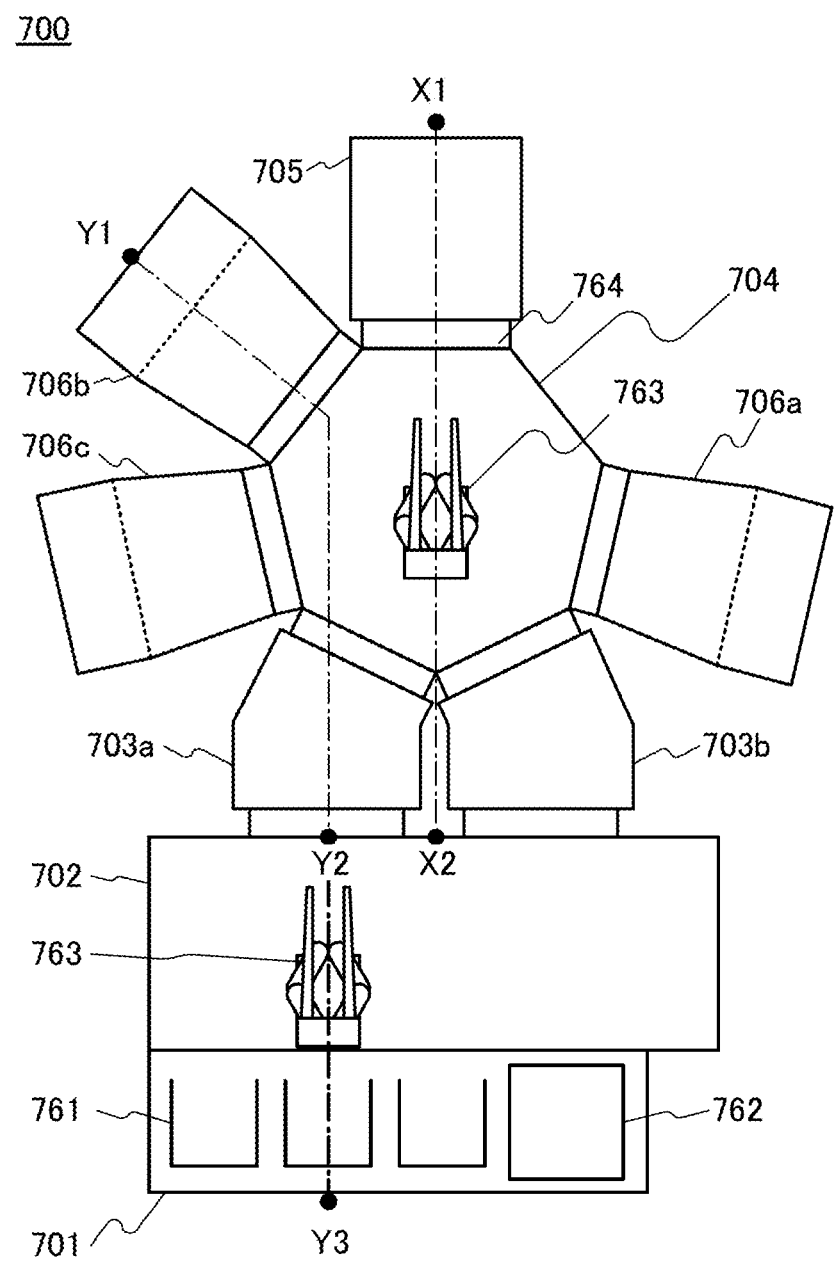
FIG. 32 is a top view illustrating an example of a deposition apparatus.

FIG. 32 is a top view schematically illustrating a single wafer multi-chamber deposition apparatus 700. The deposition apparatus 700 includes an atmosphere-side substrate supply chamber 701 including a cassette port 761 for holding a substrate and an alignment port 762 for performing alignment of a substrate, an atmosphere-side substrate transfer chamber 702 through which a substrate is transferred from the atmosphere-side substrate supply chamber 701, a load lock chamber 703a where a substrate is carried and the pressure inside the chamber is switched from atmospheric pressure to reduced pressure or from reduced pressure to atmospheric pressure, an unload lock chamber 703b where a substrate is carried out and the pressure inside the chamber is switched from reduced pressure to atmospheric pressure or from atmospheric pressure to reduced pressure, a transfer chamber 704 through which a substrate is transferred in a vacuum, a substrate heating chamber 705 where a substrate is heated, and deposition chambers 706a, 706b, and 706c in each of which a target is placed for deposition. Note that for the deposition chambers 706a, 706b, and 706c, the structure of the deposition chamber 101 illustrated in FIG. 1A or FIG. 2A can be referred to, for example.

The atmosphere-side substrate transfer chamber 702 is connected to the load lock chamber 703a and the unload lock chamber 703b, the load lock chamber 703a and the unload lock chamber 703b are connected to the transfer chamber 704, and the transfer chamber 704 is connected to the substrate-heating chamber 705 and the deposition chambers 706a, 706b, and 706c.

Gate valves 764 are provided for connecting portions between chambers so that each chamber except the atmosphere-side substrate supply chamber 701 and the atmosphere-side substrate transfer chamber 702 can be independently kept under vacuum. Moreover, the atmosphere-side substrate transfer chamber 702 and the transfer chamber 704 each include a transfer robot 763, with which a substrate can be transferred.

Further, it is preferable that the substrate heating chamber 705 also serve as a plasma treatment chamber. In the deposition apparatus 700, it is possible to transfer a substrate without exposure to the air between treatment and treatment; therefore, adsorption of impurities on a substrate can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and the numbers thereof can be set as appropriate depending on the space for placement or the process conditions.

Figure 33A:
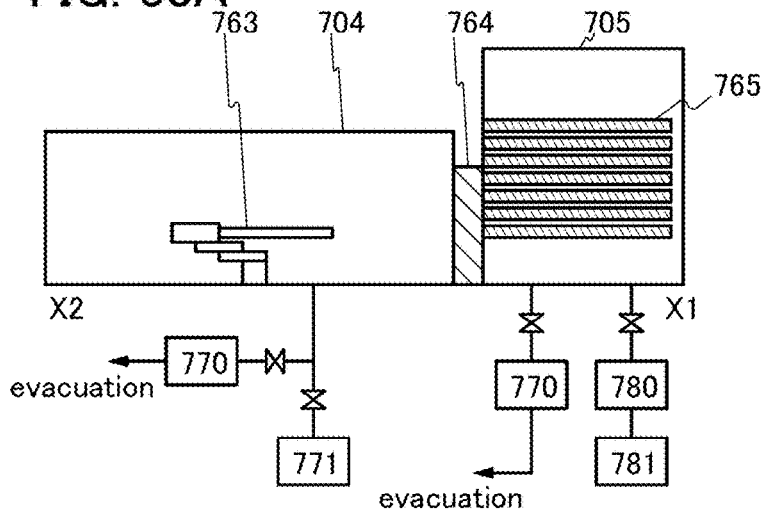
FIGS. 33A to 33C illustrate a structure example of a deposition apparatus.
Figure 33B:
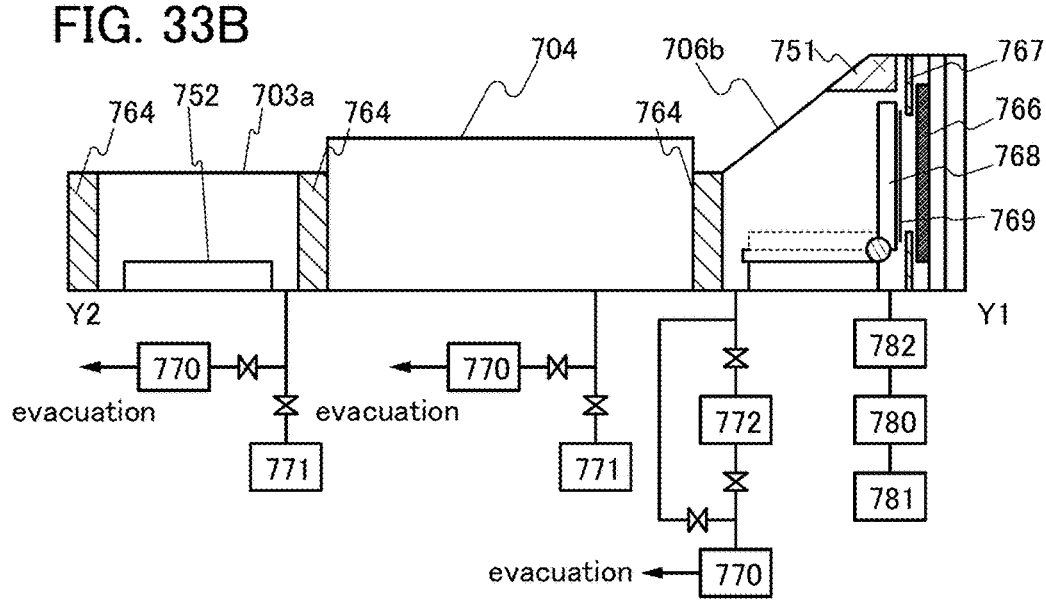
Figure 33C:
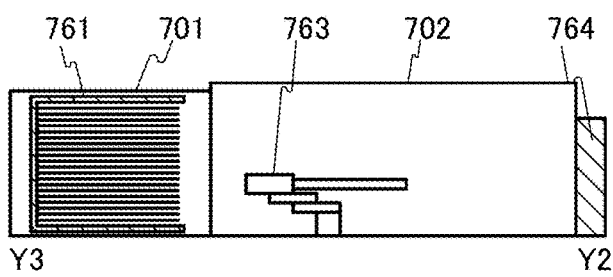

Next, FIG. 33A, FIG. 33B, and FIG. 33C are a cross-sectional view taken along dashed-dotted line X1-X2, a cross-sectional view taken along dashed-dotted line Y1-Y2, and a cross-sectional view taken along dashed-dotted line Y2-Y3, respectively, in the deposition apparatus 700 illustrated in FIG. 32.

FIG. 33A shows a cross section of the substrate heating chamber 705 and the transfer chamber 704, and the substrate heating chamber 705 includes a plurality of heating stages 765 which can hold a substrate. Furthermore, the substrate heating chamber 705 is connected to a vacuum pump 770 through a valve. As the vacuum pump 770, a dry pump and a mechanical booster pump can be used, for example.

As heating mechanism which can be used for the substrate heating chamber 705, a resistance heater may be used for heating, for example. Alternatively, heat conduction or heat radiation from a medium such as a heated gas may be used as the heating mechanism. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as a gas.

Moreover, the substrate heating chamber 705 is connected to a refiner 781 through a mass flow controller 780. Note that although the mass flow controller 780 and the refiner 781 can be provided for each of a plurality of kinds of gases, only one mass flow controller 780 and one refiner 781 are provided for easy understanding. As the gas introduced to the substrate heating chamber 705, a gas whose dew point is −80° C. or lower, preferably −100° C. or lower can be used; for example, an oxygen gas, a nitrogen gas, and a rare gas (e.g., an argon gas) are used.

The transfer chamber 704 includes the transfer robot 763. The transfer robot 763 can transfer a substrate to each chamber. Further, the transfer chamber 704 is connected to the vacuum pump 770 and a cryopump 771 through valves. With such a structure, evacuation can be performed using the vacuum pump 770 when the pressure inside the transfer chamber 704 is in the range of atmospheric pressure to low or medium vacuum (about 0.1 Pa to several hundred Pa) and then, by switching the valves, evacuation can be performed using the cryopump 771 when the pressure inside the transfer chamber 704 is in the range of middle vacuum to high or ultra-high vacuum (0.1 Pa to $1\times10^{-7}$ Pa).

Alternatively, two or more cryopumps 771 may be connected in parallel to the transfer chamber 704. With such a structure, even when one of the cryopumps is in regeneration, evacuation can be performed using any of the other cryopumps. Note that the above regeneration refers to treatment for discharging molecules (or atoms) entrapped in the cryopump. When molecules (or atoms) are entrapped too much in a cryopump, the evacuation capability of the cryopump is lowered; therefore, regeneration is performed regularly.

FIG. 33B shows a cross section of the deposition chamber 706b, the transfer chamber 704, and the load lock chamber 703a.

Here, the details of the deposition chamber (sputtering chamber) are described with reference to FIG. 33B. The deposition chamber 706b illustrated in FIG. 33B includes a target 766, an attachment protection plate 767, and a substrate stage 768. Note that here, a substrate 769 is provided on the substrate stage 768. Although not illustrated, the substrate stage 768 may include a substrate holding mechanism which holds the substrate 769, a rear heater which heats the substrate 769 from the back surface, or the like. A magnet unit may be provided behind the target.

Note that the substrate stage 768 is held substantially vertically to a floor during deposition and is held substantially parallel to the floor when the substrate is delivered. In FIG. 33B, the position where the substrate stage 768 is held when the substrate is delivered is denoted by a dashed line. With such a structure, the probability that dust or a particle which might be mixed into a film during the deposition is attached to the substrate 769 can be suppressed as compared with the case where the substrate stage 768 is held parallel to the floor. However, there is a possibility that the substrate 769 falls when the substrate stage 768 is held vertically) (90° to the floor; therefore, the angle of the substrate stage 768 to the floor is preferably wider than or equal to 80° and narrower than 90°.

The attachment protection plate 767 can suppress deposition of a particle which is sputtered from the target 766 on a region where deposition is not needed. Moreover, the attachment protection plate 767 is preferably processed to prevent accumulated sputtered particles from being separated. For example, blasting treatment which increases surface roughness may be performed, or roughness may be formed on the surface of the attachment protection plate 767.

The deposition chamber 706b is connected to a mass flow controller 780 through a gas heating system 782, and the gas heating system 782 is connected to a refiner 781 through the mass flow controller 780. With the gas heating system 782, a gas which is introduced to the deposition chamber 706b can be heated to a temperature higher than or equal to 40° C. and lower than or equal to 400° C., preferably higher than or equal to 50° C. and lower than or equal to 200° C. Note that although the gas heating system 782, the mass flow controller 780, and the refiner 781 can be provided for each of a plurality of kinds of gases, only one gas heating system 782, one mass flow controller 780, and one refiner 781 are provided for easy understanding. As the gas introduced to the deposition chamber 706b, a gas whose dew point is −80° C. or lower, preferably −100° C. or lower can be used; for example, an oxygen gas, a nitrogen gas, and a rare gas (e.g., an argon gas) are used.

A facing-target-type sputtering apparatus may be provided in the deposition chamber 706b. In each of the above-described structures of the facing-target-type sputtering device, plasma is confined between the targets; therefore, plasma damage to a substrate can be reduced. Further, step coverage can be improved because an incident angle of a sputtered particle to the substrate can be made smaller depending on the inclination of the target.

Note that a parallel-plate-type sputtering apparatus or an ion beam sputtering apparatus may be provided in the deposition chamber 706b.

In the case where the refiner is provided near a gas inlet, the length of a pipe between the refiner and the deposition chamber 706b is less than or equal to 10 m, preferably less than or equal to 5 m, further preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with an iron fluoride, an aluminum oxide, a chromium oxide, or the like can be used. With the above pipe, the amount of released gas containing impurities is made small and the entry of impurities into the gas can be reduced as compared with a SUS316L-EP pipe, for example. Further, a high-performance ultra-compact metal gasket joint (UPG joint) is preferably used as a joint of the pipe. A structure where all the materials of the pipe are metals is preferable because the effect of the generated released gas or the external leakage can be reduced compared with a structure where resin or the like is used.

The deposition chamber 706b is connected to a turbo molecular pump 772 and a vacuum pump 770 through valves.

In addition, the deposition chamber 706b is provided with a cryotrap 751.

The cryotrap 751 is a mechanism which can adsorb a molecule (or an atom) having a relatively high melting point, such as water. The turbo molecular pump 772 is capable of stably evacuating a large-sized molecule (or atom), needs low frequency of maintenance, and thus enables high productivity, whereas it has a low capability in evacuating hydrogen and water. Hence, the cryotrap 751 is connected to the deposition chamber 706b so as to have a high capability in evacuating water or the like. The temperature of a refrigerator of the cryotrap 751 is set to be lower than or equal to 100 K, preferably lower than or equal to 80 K. In the case where the cryotrap 751 includes a plurality of refrigerators, it is preferable to set the temperature of each refrigerator at a different temperature because efficient evacuation is possible. For example, the temperatures of a first-stage refrigerator and a second-stage refrigerator may be set at 100 K or lower and 20 K or lower, respectively. Note that when a titanium sublimation pump is used instead of the cryotrap, a higher vacuum can be achieved in some cases. Using an ion pump instead of a cryopump or a turbo molecular pump can also achieve higher vacuum in some cases.

Note that the evacuation method of the deposition chamber 706b is not limited to the above, and a structure similar to that in the evacuation method described in the transfer chamber 704 (the evacuation method using the cryopump and the vacuum pump) may be employed. Needless to say, the evacuation method of the transfer chamber 704 may have a structure similar to that of the deposition chamber 706b (the evacuation method using the turbo molecular pump and the vacuum pump).

Note that in each of the transfer chamber 704, the substrate heating chamber 705, and the deposition chamber 706b which are described above, the back pressure (total pressure) and the partial pressure of each gas molecule (atom) are preferably set as follows. In particular, the back pressure and the partial pressure of each gas molecule (atom) in the deposition chamber 706b need to be noted because impurities might enter a film to be formed.

In each of the above chambers, the back pressure (total pressure) is less than or equal to $1\times10^{-4}$ Pa, preferably less than or equal to $3\times10^{-5}$ Pa, further preferably less than or equal to $1\times10^{-5}$ Pa. In each of the above chambers, the partial pressure of a gas molecule (atom) having a mass-to-charge ratio (m/z) of 18 is less than or equal to $3\times10^{-5}$ Pa, preferably less than or equal to $1\times10^{-5}$ Pa, further preferably less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, preferably less than or equal to $1\times10^{-5}$ Pa, further preferably less than or equal to $3\times10^{-5}$ Pa. Furthermore, in each of the above chambers, the partial pressure of a gas molecule (atom) having a mass-to-charge ratio (m/z) of 44 is less than or equal to $3\times10^{-5}$ Pa, preferably less than or equal to $1\times10^{-5}$ Pa, further preferably less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. can be used.

Moreover, the transfer chamber 704, the substrate heating chamber 705, and the deposition chamber 706b which are described above preferably have a small amount of external leakage or internal leakage.

For example, in each of the transfer chamber 704, the substrate heating chamber 705, and the deposition chamber 706b which are described above, the leakage rate is less than or equal to $3\times10^{-6}$ Pa·m$^3$/s, preferably less than or equal to $1\times10^{-6}$ Pa·m$^3$/s. The leakage rate of a gas molecule (atom) having a mass-to-charge ratio (m/z) of 18 is less than or equal to $1\times10^{-7}$ Pa·m$^3$/s, preferably less than or equal to $3\times10^{-8}$ Pa·m$^3$/s. The leakage rate of a gas molecule (atom) having a mass-to-charge ratio (m/z) of 28 is less than or equal to $1\times10^{-5}$ Pa·m$^3$/s, preferably less than or equal to $1\times10^{-6}$ Pa·m$^3$/s. The leakage rate of a gas molecule (atom) having a mass-to-charge ratio (m/z) of 44 is less than or equal to $3\times10^{-6}$ Pa·m$^3$/s, preferably less than or equal to $1\times10^{-6}$ Pa·m$^3$/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to gas released from an internal member. Measures need to be taken from both aspects of external leakage and internal leakage in order that the leakage rate be lower than or equal to the above value.

For example, an open/close portion of the deposition chamber 706b can be sealed with a metal gasket. For the metal gasket, metal covered with an iron fluoride, an aluminum oxide, or a chromium oxide is preferably used. The metal gasket enables higher adhesion than an O-ring, leading to a reduction in the external leakage. Further, with use of the metal covered with an iron fluoride, an aluminum oxide, a chromium oxide, or the like which is in the passive state, the release of gas containing impurities released from the metal gasket is suppressed, so that the internal leakage can be reduced.

For a member of the deposition apparatus 700, aluminum, chromium, titanium, zirconium, nickel, or vanadium, which releases a smaller amount of gas containing impurities, is used. Alternatively, an alloy containing iron, chromium, nickel, and the like covered with the above member may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 700 may be covered with iron fluoride, aluminum oxide, chromium oxide, or the like.

The member of the deposition apparatus 700 is preferably formed with only metal as much as possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbate is present in the deposition chamber, the adsorbate does not affect the pressure in the deposition chamber because it is adsorbed onto an inner wall or the like; however, the adsorbate causes gas to be released when the inside of the deposition chamber is evacuated. Therefore, although there is no correlation between the leakage rate and the evacuation rate, it is important that the adsorbate present in the deposition chamber be desorbed as much as possible and evacuation be performed in advance with use of a pump with high evacuation capability. Note that the deposition chamber may be baked to promote desorption of the adsorbate. By the baking, the desorption rate of the adsorbate can be increased approximately tenfold. The baking can be performed at a temperature in the range of 100° C. to 450° C. At this time, when the adsorbate is removed while an inert gas is introduced to the deposition chamber, the desorption rate of water or the like, which is difficult to be desorbed simply by evacuation, can be further increased. Note that when the inert gas to be introduced is heated to substantially the same temperature as the baking temperature of the deposition chamber, the desorption rate of the adsorbate can be further increased. Here, a rare gas is preferably used as an inert gas. Depending on the kind of a film to be formed, oxygen or the like may be used instead of an inert gas. For example, in the case of forming an oxide, the use of oxygen which is the main component of the oxide is preferable in some cases. The baking is preferably performed using a lamp.

Alternatively, treatment for evacuating the inside of the deposition chamber is preferably performed a certain period of time after heated oxygen, a heated inert gas such as a rare gas, or the like is introduced to increase a pressure in the deposition chamber. The introduction of the heated gas can desorb the adsorbate in the deposition chamber, and the impurities present in the deposition chamber can be reduced. Note that a positive effect can be achieved when this treatment is repeated 2 to 30 times inclusive, preferably 5 to 15 times inclusive. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, further preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The rate of desorption of the adsorbate can be further increased also by dummy film formation. Here, the dummy film formation refers to film formation on a dummy substrate by a sputtering method or the like, in which a film is deposited on the dummy substrate and the inner wall of the deposition chamber so that impurities in the deposition chamber and an adsorbate on the inner wall of the deposition chamber are confined in the film. For a dummy substrate, a substrate which releases a smaller amount of gas is preferably used. By performing dummy film formation, impurity concentration in a film to be formed later can be reduced. Note that the dummy film formation may be performed at the same time as the baking of the deposition chamber.

Next, the details of the transfer chamber 704 and the load lock chamber 703a illustrated in FIG. 33B and the atmosphere-side substrate transfer chamber 702 and the atmosphere-side substrate supply chamber 701 illustrated in FIG. 33C are described. Note that FIG. 33C is a cross section of the atmosphere-side substrate transfer chamber 702 and the atmosphere-side substrate supply chamber 701.

For the transfer chamber 704 illustrated in FIG. 33B, the description of the transfer chamber 704 illustrated in FIG. 33A can be referred to.

The load lock chamber 703a includes a substrate delivery stage 752. When a pressure in the load lock chamber 703a becomes atmospheric pressure by being increased from reduced pressure, the substrate delivery stage 752 receives a substrate from the transfer robot 763 provided in the atmosphere-side substrate transfer chamber 702. After that, the load lock chamber 703a is evacuated into vacuum so that the pressure therein becomes reduced pressure and then the transfer robot 763 provided in the transfer chamber 704 receives the substrate from the substrate delivery stage 752.

Furthermore, the load lock chamber 703a is connected to the vacuum pump 770 and the cryopump 771 through valves. For a method for connecting evacuation systems such as the vacuum pump 770 and the cryopump 771, the description of the method for connecting the transfer chamber 704 can be referred to, and the description thereof is omitted here. Note that the unload lock chamber 703b illustrated in FIG. 32 can have a structure similar to that in the load lock chamber 703a.

The atmosphere-side substrate transfer chamber 702 includes the transfer robot 763. The transfer robot 763 can deliver a substrate from the cassette port 761 to the load lock chamber 703a or deliver a substrate from the load lock chamber 703a to the cassette port 761. Furthermore, a mechanism for suppressing entry of dust or a particle, such as high efficiency particulate air (HEPA) filter, may be provided above the atmosphere-side substrate transfer chamber 702 and the atmosphere-side substrate supply chamber 701.

The atmosphere-side substrate supply chamber 701 includes a plurality of cassette ports 761. The cassette port 761 can hold a plurality of substrates.

The surface temperature of the target is set to be lower than or equal to 100° C., preferably lower than or equal to 50° C., further preferably about room temperature (typically, 25° C.). In a sputtering apparatus for a large substrate, a large target is often used. However, it is difficult to form a target for a large substrate without a juncture. In fact, a plurality of targets are arranged with as few spaces as possible to obtain a large shape; however, a tiny space is inevitably generated. When the surface temperature of the target increases, in some cases, zinc or the like is volatilized from such a slight space and the space might be expanded gradually. When the space expands, a metal of a backing plate or a metal used for adhesion might be sputtered and cause an increase in impurity concentration. Thus, it is preferable that the target be cooled sufficiently.

Specifically, for the backing plate, a metal having high conductivity and a high heat dissipation property (specifically copper) is used. The target can be cooled efficiently by making a sufficient amount of cooling water flow through a water channel which is formed in the backing plate.

Note that in the case where the target includes zinc, plasma damage is alleviated by the deposition in an oxygen gas atmosphere; thus, an oxide in which zinc is unlikely to be volatilized can be obtained.

Specifically, the concentration of hydrogen in the CAAC-OS film, which is measured by secondary ion mass spectrometry (SIMS), can be set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

The concentration of nitrogen in the CAAC-OS, which is measured by SIMS, can be set to be lower than $5 \times 10^{19}$ atoms/cm$^3$, preferably lower than or equal to $1 \times 10^{19}$ atoms/cm$^3$, more preferably lower than or equal to $5 \times 10^{18}$ atoms/cm$^3$, still more preferably lower than or equal to $1 \times 10^{18}$ atoms/cm$^3$.

The concentration of carbon in the CAAC-OS, which is measured by SIMS, can be set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The amount of each of the following gas molecules (atoms) released from the CAAC-OS can be less than or equal to $1 \times 10^{19}$ molecules (atoms)/cm$^3$, preferably less than or equal to $1 \times 10^{18}$ molecules (atoms)/cm$^3$, which is measured by thermal desorption spectroscopy (TDS) analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the CAAC-OS can be suppressed. Further, when a film in contact with the oxide film is formed with use of the above deposition apparatus, the entry of impurities into the oxide film from the film in contact therewith can be suppressed.

<Transistor>

A transistor of one embodiment of the present invention is described below.

Note that the transistors of the embodiments of the present invention each preferably include the above CAAC-OS or the nc-OS.

<Transistor Structure 1>

Figure 34A:
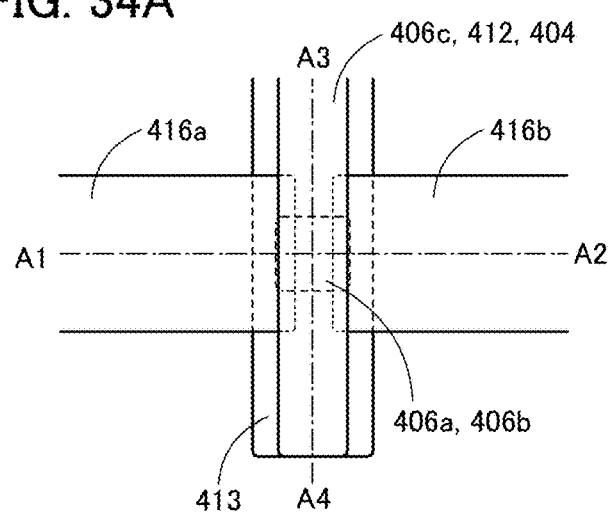
FIGS. 34A and 34B are a top view and a cross-sectional view illustrating a transistor according to one embodiment of the present invention.
Figure 34B:
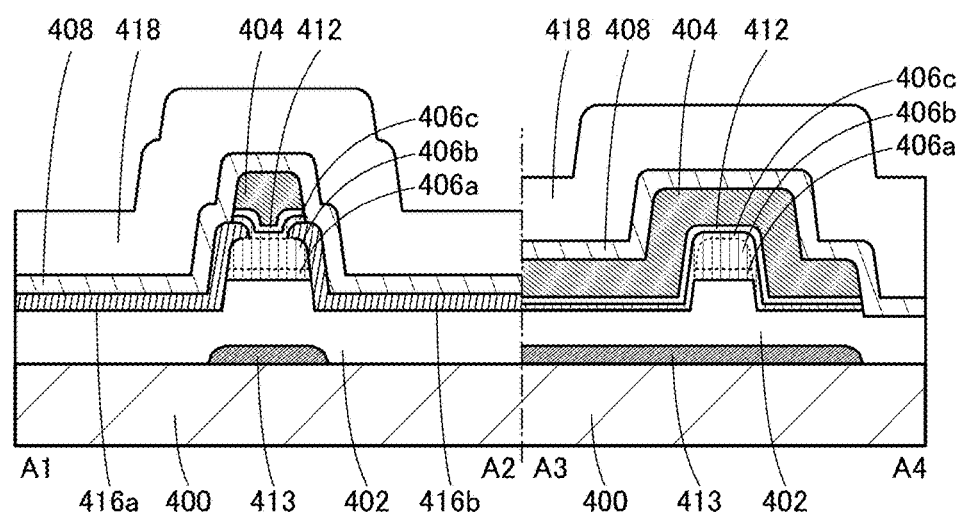

FIGS. 34A and 34B are a top view and a cross-sectional view which illustrate a transistor of one embodiment of the present invention. FIG. 34A is a top view and FIG. 34B is a cross-sectional view taken along dashed-dotted line A1-A2 and dashed-dotted line A3-A4 in FIG. 34A. Note that for simplification of the drawing, some components are not illustrated in the top view in FIG. 34A.

The transistor in FIGS. 34A and 34B includes a conductor 413 over a substrate 400, an insulator 402 having a projection over the substrate 400 and the conductor 413, a semiconductor 406a over the projection of the insulator 402, a semiconductor 406b over the semiconductor 406a, a conductor 416a and a conductor 416b which are in contact with a top surface and a side surface of the semiconductor 406b and which are arranged to be separated from each other, a semiconductor 406c over the semiconductor 406b, the conductor 416a, and the conductor 416b, an insulator 412 over the semiconductor 406c, a conductor 404 over the insulator 412, an insulator 408 over the conductor 416a, the conductor 416b, and the conductor 404, and an insulator 418 over the insulator 408. Although the conductor 413 is part of the transistor here, a transistor structure of one embodiment of the present invention is not limited thereto. For example, the conductor 413 may be a component independent of the transistor.

Note that the semiconductor 406c is in contact with at least a top surface and a side surface of the semiconductor 406b in the cross section taken along line A3-A4. Furthermore, the conductor 404 faces the top surface and the side surface of the semiconductor 406b with the semiconductor 406c and the insulator 412 provided therebetween in the cross section taken along line A3-A4. The conductor 413 faces a bottom surface of the semiconductor 406b with the insulator 402 provided therebetween. The insulator 402 does not necessarily include a projection. The semiconductor 406c, the insulator 408, and/or the insulator 418 is not necessarily provided.

The semiconductor 406b serves as a channel formation region of the transistor. The conductor 404 serves as a first gate electrode (also referred to as a front gate electrode) of the transistor. The conductor 413 serves as a second gate electrode (also referred to as a back gate electrode) of the transistor. The conductor 416a and the conductor 416b serve as a source electrode and a drain electrode of the transistor. The insulator 408 functions as a barrier layer. The insulator 408 has, for example, a function of blocking oxygen and/or hydrogen. Alternatively, the insulator 408 has, for example, a higher capability of blocking oxygen and/or hydrogen than the semiconductor 406a and/or the semiconductor 406c.

The insulator 402 is preferably an insulator containing excess oxygen.

The insulator containing excess oxygen means an insulator from which oxygen is released by heat treatment, for example. The silicon oxide layer containing excess oxygen means a silicon oxide layer which can release oxygen by heat treatment or the like, for example. Therefore, the insulator 402 is an insulator in which oxygen can be moved. In other words, the insulator 402 may be an insulator having an oxygen-transmitting property. For example, the insulator 402 may be an insulator having a higher oxygen-transmitting property than the semiconductor 406a.

The insulator containing excess oxygen has a function of reducing oxygen vacancies in the semiconductor 406b in some cases. Such oxygen vacancies form DOS in the semiconductor 406b and serve as hole traps or the like. In addition, hydrogen comes into the site of such an oxygen vacancy and forms an electron serving as a carrier. Therefore, by reducing the oxygen vacancies in the semiconductor 406b, the transistor can have stable electrical characteristics.

Here, an insulator from which oxygen is released by heat treatment may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ (converted into the number of oxygen atoms) in TDS analysis in the range of a surface temperature of 100° C. to 700° C. or 100° C. to 500° C.

Here, the method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-tocharge ratio of 32 which are obtained in the TDS analysis are assumed to originate from an oxygen molecule. Note that $CH_3OH$, which is a gas having the mass-to-charge ratio of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2} \times S_{O2} \times \alpha$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. $S_{O2}$ is the integral value of ion intensity when the measurement sample is analyzed by TDS. The value α is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W using a silicon substrate containing hydrogen atoms at $1 \times 10^{16}$ atoms/cm$^2$ as the reference sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in ESR.

The insulator containing excess oxygen may be formed using oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

As illustrated in FIG. 34B, the side surfaces of the semiconductor 406b are in contact with the conductor 416a and the conductor 416b. The semiconductor 406b can be electrically surrounded by an electric field of the conductor 404 (a structure in which a semiconductor is electrically surrounded by an electric field of a conductor is referred to as a surrounded channel (s-channel) structure). Therefore, a channel is formed in the entire semiconductor 406b (bulk) in some cases. In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, further preferably less than or equal to 30 nm, still further preferably less than or equal to 20 nm and the channel width of the transistor is preferably less than or equal to 40 nm, further preferably less than or equal to 30 nm, still further preferably less than or equal to 20 nm.

Furthermore, by applying a lower voltage or a higher voltage than a source electrode to the conductor 413, the threshold voltage of the transistor may be shifted in the positive direction or the negative direction. For example, by shifting the threshold voltage of the transistor in the positive direction, a normally-off transistor in which the transistor is in a non-conduction state (off state) even when the gate voltage is 0 V can be achieved in some cases. The voltage applied to the conductor 413 may be a variable or a fixed voltage. When the voltage applied to the conductor 413 is a variable, a circuit for controlling the voltage may be electrically connected to the conductor 413.

Next, a semiconductor which can be used as the semiconductor 406a, the semiconductor 406b, the semiconductor 406c, or the like is described below.

The semiconductor 406b is an oxide semiconductor containing indium, for example. An oxide semiconductor can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the semiconductor 406a and the semiconductor 406c include one or more elements other than oxygen included in the semiconductor 406b. Since the semiconductor 406a and the semiconductor 406c each include one or more elements other than oxygen included in the semiconductor 406b, an interface state is less likely to be formed at the interface between the semiconductor 406a and the semiconductor 406b and the interface between the semiconductor 406b and the semiconductor 406c.

The semiconductor 406a, the semiconductor 406b, and the semiconductor 406c preferably include at least indium. In the case of using an In-M-Zn oxide as the semiconductor 406a, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 406b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the semiconductor 406c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor 406c may be an oxide that is a type the same as that of the semiconductor 406a. Note that the semiconductor 406a and/or the semiconductor 406c do/does not necessarily contain indium in some cases. For example, the semiconductor 406a and/or the semiconductor 406c may be gallium oxide.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, further preferably higher than or equal to 90%.

Note that the composition of the semiconductor 406a is preferably in the neighborhood of the composition represented by the bold line in FIG. 29. The composition of the semiconductor 406b is preferably in the neighborhood of the composition represented by the bold line in FIG. 29. The composition of the semiconductor 406c is preferably in the neighborhood of the composition represented by the bold line in FIG. 29. When these compositions are employed, the channel formation region of the transistor can have a single crystal structure. Alternatively, the channel formation region, the source region, and the drain region of the transistor can have a single crystal structure in some cases. When the channel formation region of the transistor has a single crystal structure, the transistor can have high frequency characteristics in some cases.

At this time, when a gate voltage is applied, a channel is formed in the semiconductor 406b having the highest electron affinity in the semiconductor 406a, the semiconductor 406b, and the semiconductor 406c.

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low density of interface states. For that reason, the stack of the semiconductor 406a, the semiconductor 406b, and the semiconductor 406c has a band structure where energy at each interface and in the vicinity of the interface is changed continuously (continuous junction).

At this time, electrons move mainly in the semiconductor 406b, not in the semiconductor 406a and the semiconductor 406c. As described above, when the interface state density at the interface between the semiconductor 406a and the semiconductor 406b and the interface state density at the interface between the semiconductor 406b and the semiconductor 406c are decreased, electron movement in the semiconductor 406b is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large.

To increase the on-state current of the transistor, for example, root mean square (RMS) roughness with a measurement area of 1 μm×1 μm of a top surface or a bottom surface of the semiconductor 406b (a formation surface; here, the semiconductor 406a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P-V) with the measurement area of 1 μm×1 μm is less than 10 nm, preferably less than 9 nm, further preferably less than 8 nm, still further preferably less than 7 nm. RMS roughness, Ra, and P-V can be measured using a scanning probe microscope SPA-500 manufactured by SII Nano Technology Inc.

The electron movement is also inhibited, for example, in the case where the density of defect states is high in a region where a channel is formed.

For example, in the case where the semiconductor 406b contains oxygen vacancies (also denoted by Vo), donor levels are formed by entry of hydrogen into sites of oxygen vacancies in some cases. A state in which hydrogen enters sites of oxygen vacancies are denoted by VoH in the following description in some cases. VoH is a factor of decreasing the on-state current of the transistor because VoH scatters electrons. Note that sites of oxygen vacancies become more stable by entry of oxygen than by entry of hydrogen. Thus, by decreasing oxygen vacancies in the semiconductor 406b, the on-state current of the transistor can be increased in some cases.

To decrease oxygen vacancies in the semiconductor 406b, for example, there is a method in which excess oxygen in the insulator 402 is moved to the semiconductor 406b through the semiconductor 406a. In this case, the semiconductor 406a is preferably a layer having an oxygen-transmitting property (a layer through which oxygen passes or is transmitted).

In the case where the transistor has an s-channel structure, a channel is formed in the whole of the semiconductor 406b. Therefore, as the semiconductor 406b has a larger thickness, a channel region becomes larger. In other words, the thicker the semiconductor 406b is, the larger the on-state current of the transistor is. For example, the semiconductor 406b has a region with a thickness greater than or equal to 20 nm, preferably greater than or equal to 40 nm, further preferably greater than or equal to 60 nm, still further preferably greater than or equal to 100 nm. Note that the semiconductor 406b has a region with a thickness, for example, less than or equal to 300 nm, preferably less than or equal to 200 nm, further preferably less than or equal to 150 nm because the productivity of the semiconductor device might be decreased.

Moreover, the thickness of the semiconductor 406c is preferably as small as possible to increase the on-state current of the transistor. The thickness of the semiconductor 406c is less than 10 nm, preferably less than or equal to 5 nm, more preferably less than or equal to 3 nm, for example. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. The thickness of the semiconductor 406c is greater than or equal to 0.3 nm, preferably greater than or equal to 1 nm, further preferably greater than or equal to 2 nm, for example. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a has a region with a thickness, for example, greater than or equal to 10 nm, preferably greater than or equal to 20 nm, further preferably greater than or equal to 40 nm, still further preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a has a region with a thickness, for example, less than or equal to 200 nm, preferably less than or equal to 120 nm, further preferably less than or equal to 80 nm.

For example, a region in which the concentration of silicon which is measured by secondary ion mass spectrometry (SIMS) is lower than $1 \times 10^{19}$ atoms/cm$^3$, preferably lower than $5 \times 10^{18}$ atoms/cm$^3$, or further preferably lower than $2 \times 10^{18}$ atoms/cm$^3$ is provided between the semiconductor 406b and the semiconductor 406a. A region with a silicon concentration lower than $1 \times 10^{19}$ atoms/cm$^3$, preferably lower than $5 \times 10^{18}$ atoms/cm$^3$, further preferably lower than $2 \times 10^{18}$ atoms/cm$^3$ which is measured by SIMS is provided between the semiconductor 406b and the semiconductor 406c.

It is preferable to reduce the concentration of hydrogen in the semiconductor 406a and the semiconductor 406c in order to reduce the concentration of hydrogen in the semiconductor 406b. The semiconductor 406a and the semiconductor 406c each have a region in which the concentration of hydrogen measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is preferable to reduce the concentration of nitrogen in the semiconductor 406a and the semiconductor 406c in order to reduce the concentration of nitrogen in the semiconductor 406b. The semiconductor 406a and the semiconductor 406c each have a region in which the concentration of nitrogen measured by SIMS is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The above three-layer structure is an example. For example, a two-layer structure without the semiconductor 406a or the semiconductor 406c may be employed. A four-layer structure in which any one of the semiconductors described as examples of the semiconductor 406a, the semiconductor 406b, and the semiconductor 406c is provided below or over the semiconductor 406a or below or over the semiconductor 406c may be employed. An n-layer structure (n is an integer of 5 or more) in which any one of the semiconductors described as examples of the semiconductor 406a, the semiconductor 406b, and the semiconductor 406c is provided at two or more of the following positions: over the semiconductor 406a, below the semiconductor 406a, over the semiconductor 406c, and below the semiconductor 406c.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 μm and less than or equal to 700 μm, preferably greater than or equal to 10 μm and less than or equal to 500 μm, or further preferably greater than or equal to 15 μm and less than or equal to 300 μm. When the substrate 400 has a small thickness, the weight of the semiconductor device can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

The conductor 413 may be formed to have a single-layer structure or a stacked-layer structure using a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 may have a function of preventing diffusion of impurities from the substrate 400. In the case where the semiconductor 406b is an oxide semiconductor, the insulator 402 can have a function of supplying oxygen to the semiconductor 406b.

Each of the conductor 416a and the conductor 416b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Due to the conductor 416a and the conductor 416b, a defect may be formed in the semiconductor 406a, the semiconductor 406b, or the semiconductor 406c in some cases. The defect makes the semiconductor 406a, the semiconductor 406b, or the semiconductor 406c an n-type semiconductor in some cases. As a result, ohmic contact is made between any of the semiconductor 406a, the semiconductor 406b, or the semiconductor 406c and the conductor 416a and the conductor 416b. For example, in the case where the defect formed in the semiconductor 406a, the semiconductor 406b, or the semiconductor 406c is reduced by dehydrogenation or supplying excess oxygen, a Schottky junction is made between any of the semiconductor 406a, the semiconductor 406b, or the semiconductor 406c and the conductor 416a and the conductor 416b.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 412 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 404 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 408 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 408 may be preferably formed to have, for example, a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

The insulator 418 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 418 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Figure 35A:
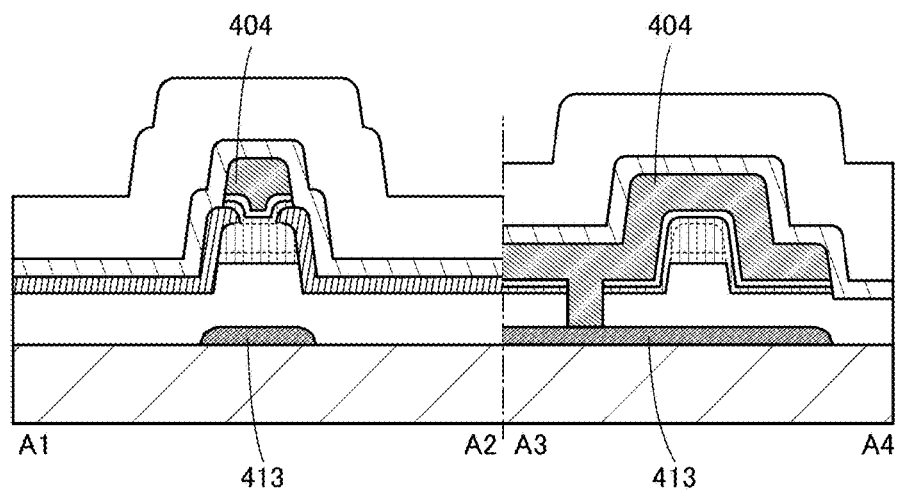
FIGS. 35A and 35B are cross-sectional views each illustrating a transistor according to one embodiment of the present invention.
Figure 35B:
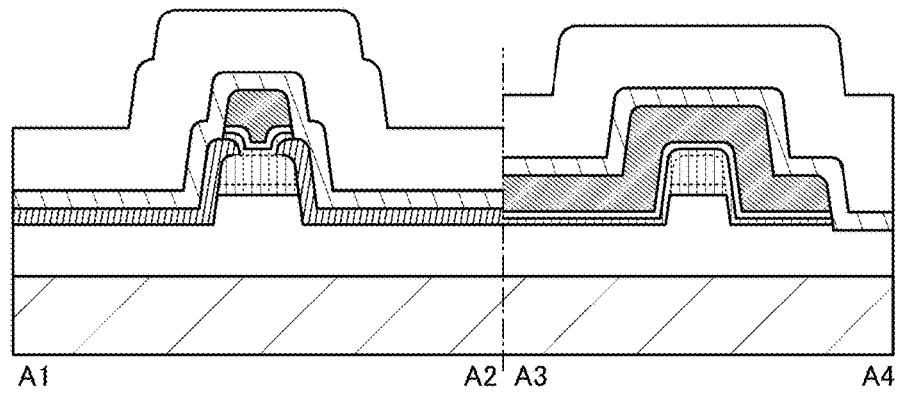

Although FIGS. 34A and 34B show an example where the conductor 404 which is a first gate electrode of a transistor is not electrically connected to the conductor 413 which is a second gate electrode, a transistor structure of one embodiment of the present invention is not limited thereto. For example, as illustrated in FIG. 35A, the conductor 404 may be electrically connected to the conductor 413. With such a structure, the conductor 404 and the conductor 413 are supplied with the same potential; thus, switching characteristics of the transistor can be improved. Alternatively, as illustrated in FIG. 35B, the conductor 413 is not necessarily provided.

Figure 36A:
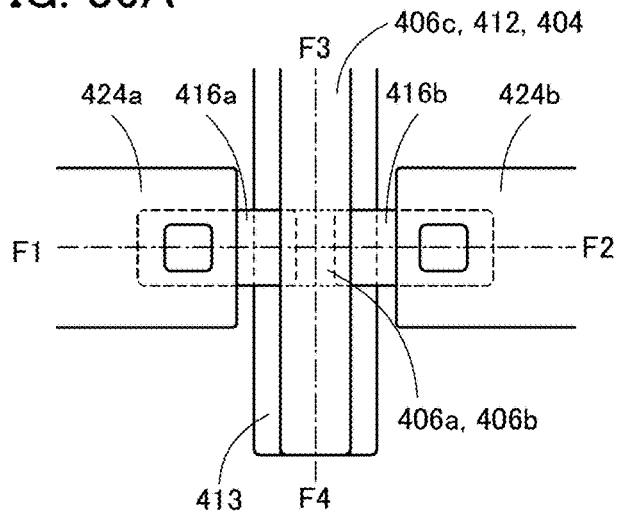
FIGS. 36A and 36B are a top view and a cross-sectional view illustrating a transistor according to one embodiment of the present invention.
Figure 36B:
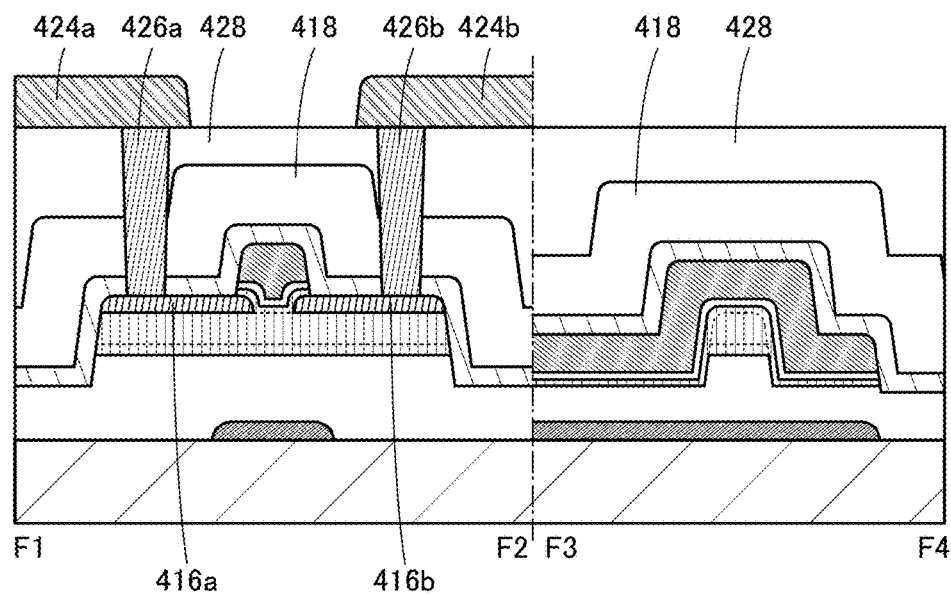

FIG. 36A is an example of a top view of a transistor. FIG. 36B is an example of a cross-sectional view taken along dashed-dotted line F1-F2 and dashed-dotted line F3-F4 in FIG. 36A. Note that some components such as an insulator are omitted in FIG. 36A for easy understanding.

Although FIGS. 34A and 34B and the like show an example where the conductor 416a and the conductor 416b which function as a source electrode and a drain electrode are in contact with a top surface and a side surface of the semiconductor 406b, a top surface of the insulator 402, and the like, a transistor structure of one embodiment of the present invention is not limited thereto. For example, as illustrated in FIGS. 36A and 36B, the conductor 416a and the conductor 416b may be in contact with only the top surface of the semiconductor 406b.

As illustrated in FIG. 36B, an insulator 428 may be provided over the insulator 418. The insulator 428 preferably has a flat top surface. The insulator 428 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 428 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. To planarize the top surface of the insulator 428, planarization treatment may be performed by a chemical mechanical polishing (CMP) method or the like.

A resin may be used as the insulator 428. For example, a resin containing polyimide, polyamide, acrylic, silicone, or the like may be used. The use of a resin does not need planarization treatment performed on the top surface of the insulator 428 in some cases. By using a resin, a thick film can be formed in a short time; thus, the productivity can be increased.

As illustrated in FIGS. 36A and 36B, a conductor 424a and a conductor 424b may be provided over the insulator 428. The conductor 424a and the conductor 424b may function as wirings, for example. The insulator 428 may include an opening and the conductor 416a and the conductor 424a may be electrically connected to each other through the opening. The insulator 428 may have another opening and the conductor 416b and the conductor 424b may be electrically connected to each other through the opening. In this case, the conductor 426a and the conductor 426b may be provided in the respective openings.

Each of the conductor 424a and the conductor 424b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

In the transistor illustrated in FIGS. 36A and 36B, the conductor 416a and the conductor 416b are not in contact with side surfaces of the semiconductor 406b. Thus, an electric field applied from the conductor 404 functioning as a first gate electrode to the side surfaces of the semiconductor 406b is less likely to be blocked by the conductor 416a and the conductor 416b. The conductor 416a and the conductor 416b are not in contact with a top surface of the insulator 402. Thus, excess oxygen (oxygen) released from the insulator 402 is not consumed to oxidize the conductor 416a and the conductor 416b. Accordingly, excess oxygen (oxygen) released from the insulator 402 can be efficiently used to reduce oxygen vacancies in the semiconductor 406b. In other words, the transistor having the structure illustrated in FIGS. 36A and 36B has excellent electrical characteristics such as a high on-state current, high field-effect mobility, a small subthreshold swing value, and high reliability.

Figure 37A:
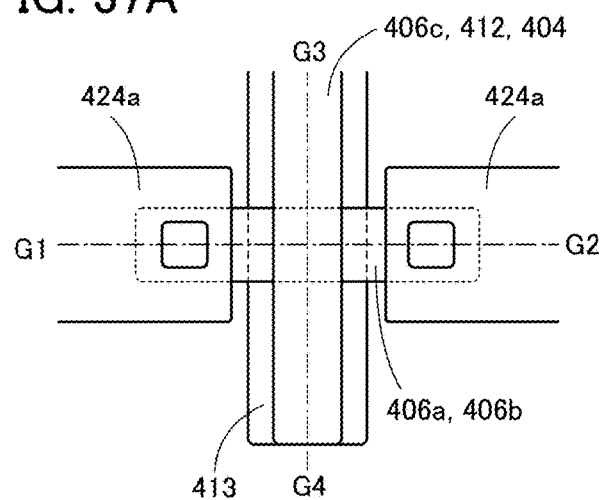
FIGS. 37A and 37B are a top view and a cross-sectional view illustrating a transistor according to one embodiment of the present invention.
Figure 37B:
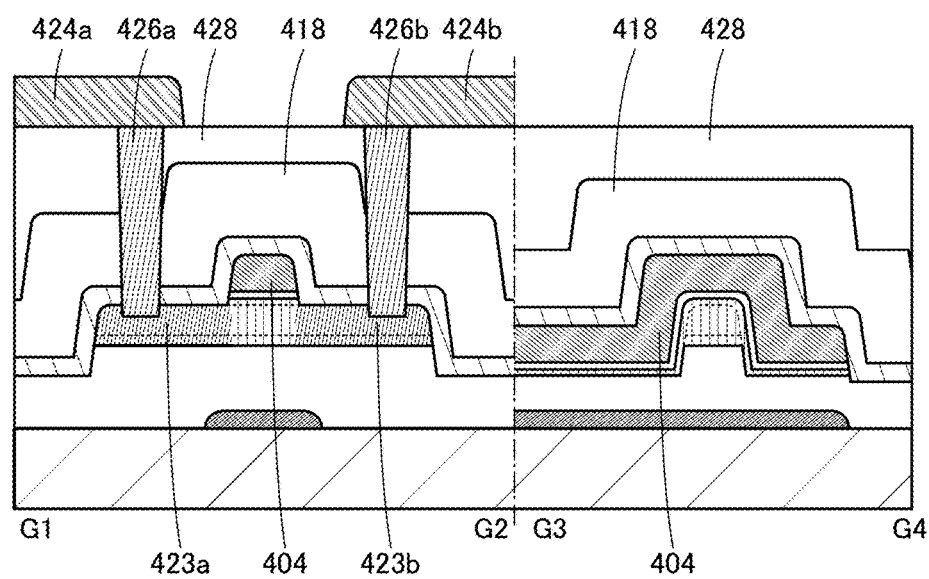

FIGS. 37A and 37B are a top view and a cross-sectional view which illustrate a transistor of one embodiment of the present invention. FIG. 37A is a top view and FIG. 37B is a cross-sectional view taken along dashed-dotted line G1-G2 and dashed-dotted line G3-G4 in FIG. 37A. Note that for simplification of the drawing, some components are not illustrated in the top view in FIG. 37A.

The transistor may have a structure in which, as illustrated in FIGS. 37A and 37B, the conductor 416a and the conductor 416b are not provided and the conductor 426a and the conductor 426b are in contact with the semiconductor 406b. In this case, a low-resistance region 423a (low-resistance region 423b) is preferably provided in a region in contact with at least the conductor 426a and the conductor 426b in the semiconductor 406b and/or the semiconductor 406a. The low-resistance region 423a and the low-resistance region 423b may be formed in such a manner that, for example, the conductor 404 and the like are used as masks and impurities are added to the semiconductor 406b and/or the semiconductor 406a. The conductor 426a and the conductor 426b may be provided in holes (portions which penetrate) or recessed portions (portions which do not penetrate) of the semiconductor 406b. When the conductor 426a and the conductor 426b are provided in holes or recessed portions of the semiconductor 406b, contact areas between the conductors 426a and 426b and the semiconductor 406b are increased; thus, the adverse effect of the contact resistance can be decreased. In other words, the on-state current of the transistor can be increased.

<Transistor Structure 2>

Figure 38A:
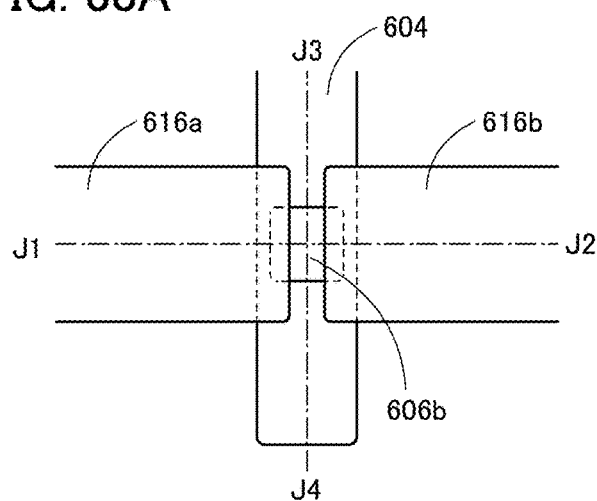
FIGS. 38A and 38B are a top view and a cross-sectional view illustrating a transistor according to one embodiment of the present invention.
Figure 38B:
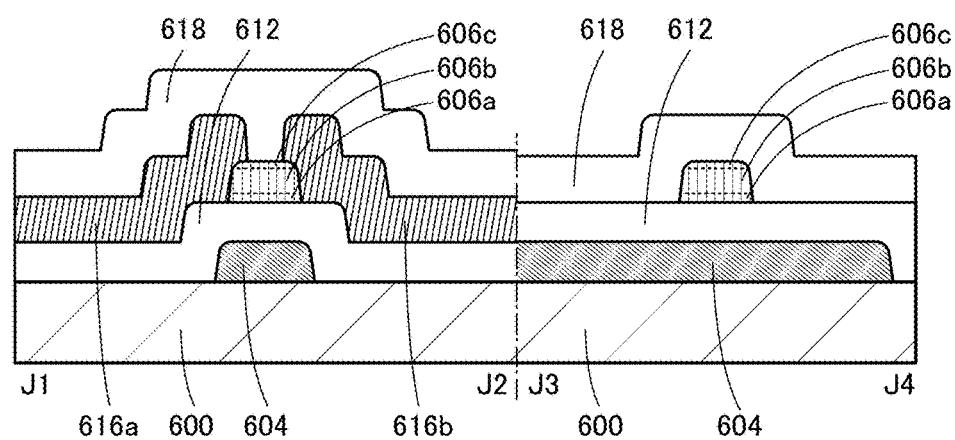

FIGS. 38A and 38B are a top view and a cross-sectional view of a transistor of one embodiment of the present invention. FIG. 38A is a top view and FIG. 38B is a cross-sectional view taken along dashed-dotted line J1-J2 and dashed-dotted line J3-J4 in FIG. 38A. Note that for simplification of the drawing, some components are not illustrated in the top view in FIG. 38A.

The transistor in FIGS. 38A and 38B includes a conductor 604 over a substrate 600, an insulator 612 over the conductor 604, a semiconductor 606a over the insulator 612, a semiconductor 606b over the semiconductor 606a, a semiconductor 606c over the semiconductor 606b, a conductor 616a and a conductor 616b which are in contact with the semiconductor 606a, the semiconductor 606b, and the semiconductor 606c and which are arranged to be apart from each other, and an insulator 618 over the semiconductor 606c, the conductor 616a, and the conductor 616b. The conductor 604 faces a bottom surface of the semiconductor 606b with the insulator 612 provided therebetween. The insulator 612 may have a projection. An insulator may be provided between the substrate 600 and the conductor 604. For the insulator, the description of the insulator 402 or the insulator 408 is referred to. The semiconductor 606a and/or the insulator 618 is not necessarily provided.

The semiconductor 606b serves as a channel formation region of the transistor. The conductor 604 serves as a first gate electrode (also referred to as a front gate electrode) of the transistor. The conductor 616a and the conductor 616b serve as a source electrode and a drain electrode of the transistor.

The insulator 618 is preferably an insulator containing excess oxygen.

For the substrate 600, the description of the substrate 400 is referred to. For the conductor 604, the description of the conductor 404 is referred to. For the insulator 612, the description of the insulator 412 is referred to. For the semiconductor 606a, the description of the semiconductor 406c is referred to. For the semiconductor 606b, the description of the semiconductor 406b is referred to. For the semiconductor 606c, the description of the semiconductor 406a is referred to. For the conductor 616a and the conductor 616b, the description of the conductor 416a and the conductor 416b is referred to. For the insulator 618, the description of the insulator 402 is referred to.

Over the insulator 618, a display element may be provided. For example, a pixel electrode, a liquid crystal layer, a common electrode, a light-emitting layer, an organic EL layer, an anode electrode, a cathode electrode, or the like may be provided. The display element is connected to the conductor 616a or the like, for example.

Figure 39A:
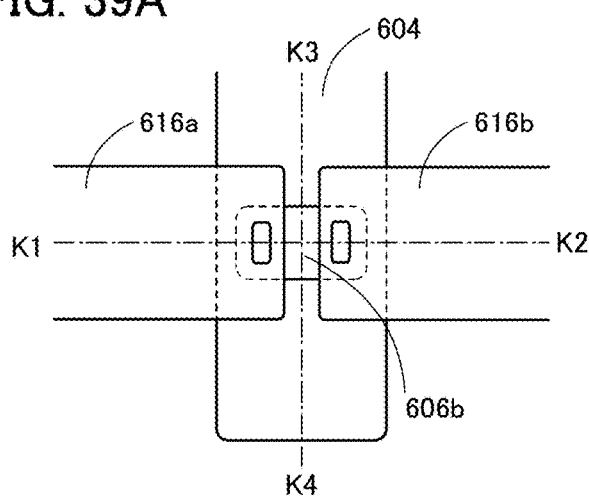
FIGS. 39A and 39B are a top view and a cross-sectional view illustrating a transistor according to one embodiment of the present invention.
Figure 39B:
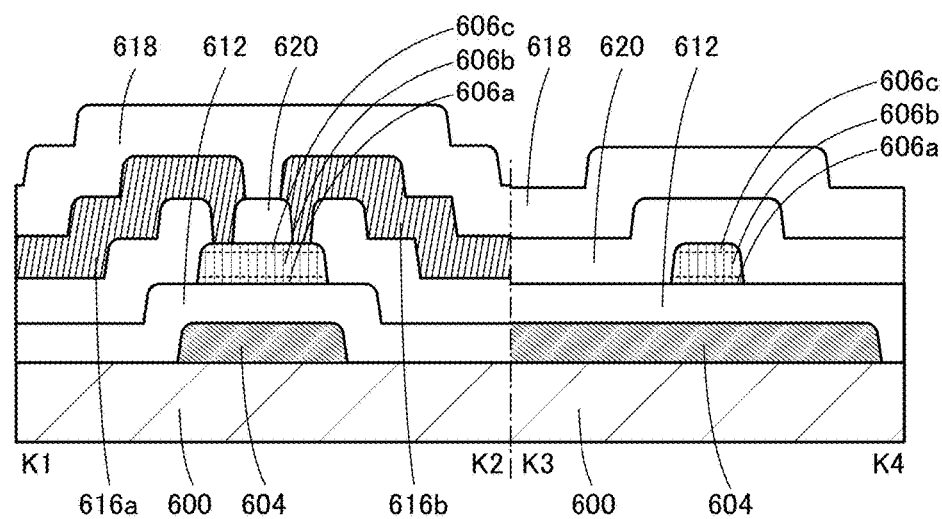

FIG. 39A is an example of a top view of a transistor. FIG. 39B is an example of a cross-sectional view taken along dashed-dotted line K1-K2 and dashed-dotted line K3-K4 in FIG. 39A. Note that some components such as an insulator are omitted in FIG. 39A for easy understanding.

Over the semiconductor, an insulator that can function as a channel protective film may be provided. For example, as illustrated in FIGS. 39A and 39B, an insulator 620 may be provided between the semiconductor 606c and the conductors 616a and 616b. In that case, the conductor 616a (conductor 616b) and the semiconductor 606c are connected to each other through an opening in the insulator 620. For the insulator 620, the description of the insulator 618 may be referred to.

Figure 40A:
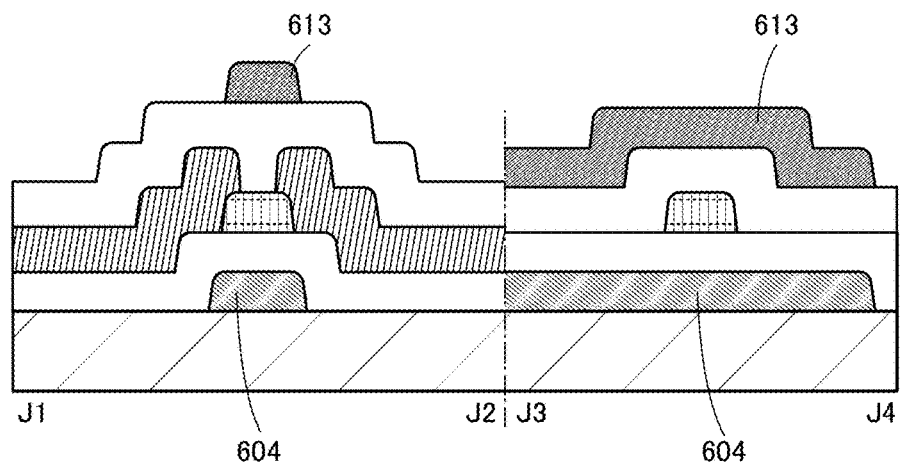
FIGS. 40A and 40B are cross-sectional views illustrating transistors according to one embodiment of the present invention.
Figure 40B:
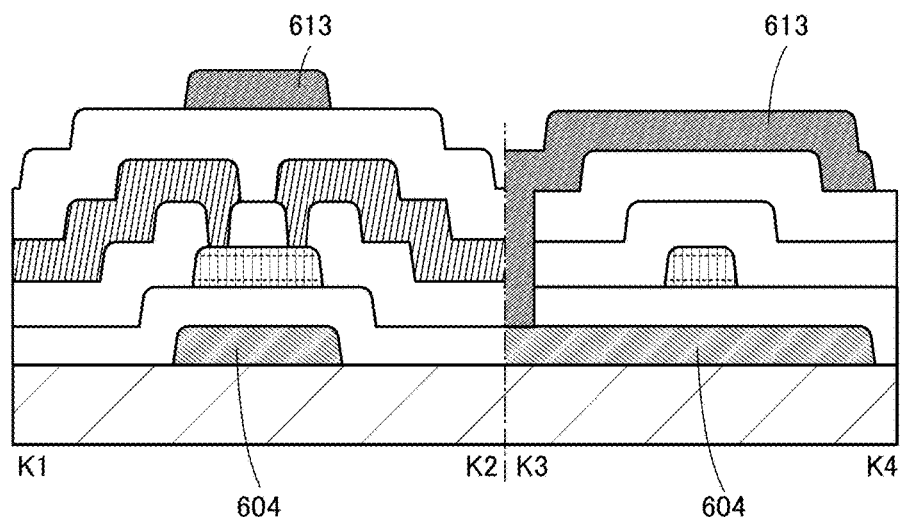

In FIG. 38B and FIG. 39B, a conductor 613 may be provided over the insulator 618. Examples in that case are shown in FIGS. 40A and 40B. For the conductor 613, the description of the conductor 413 is referred to. A potential or signal which is the same as that supplied to the conductor 604 or a potential or signal which is different from that supplied to the conductor 604 may be supplied to the conductor 613. For example, by supplying a constant potential to the conductor 613, the threshold voltage of a transistor may be controlled. In other words, the conductor 613 can function as a second gate electrode. Furthermore, an s-channel structure may be formed using the conductor 613 and the like.

<Semiconductor Device>

An example of a semiconductor device of one embodiment of the present invention is shown below.

<Circuit>

An example of a circuit including a transistor of one embodiment of the present invention is shown below.

[CMOS Inverter]

Figure 41A:
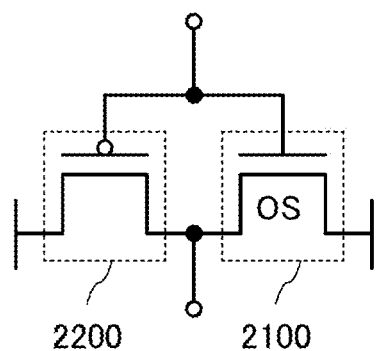
FIGS. 41A and 41B are each a circuit diagram of a semiconductor device according to one embodiment of the present invention.

A circuit diagram in FIG. 41A shows a configuration of a so-called CMOS inverter in which a p-channel transistor 2200 and an n-channel transistor 2100 are connected to each other in series and in which gates of them are connected to each other.

[CMOS Analog Switch]

Figure 41B:
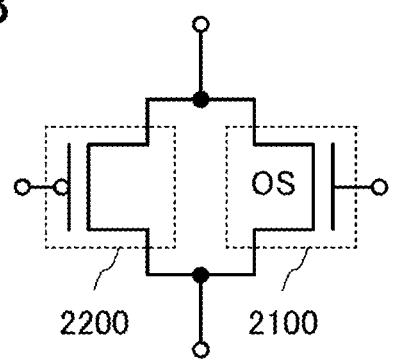

A circuit diagram in FIG. 41B shows a configuration in which sources of the transistors 2100 and 2200 are connected to each other and drains of the transistors 2100 and 2200 are connected to each other. With such a configuration, the transistors can function as a so-called CMOS analog switch.

[Memory Device Example]

Figure 42A:
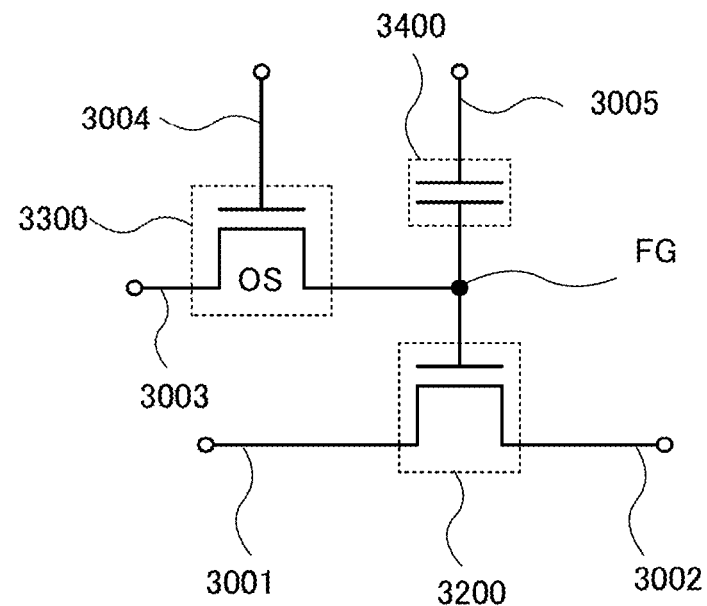
FIGS. 42A and 42B are each a circuit diagram of a memory device according to one embodiment of the present invention.
Figure 42B:
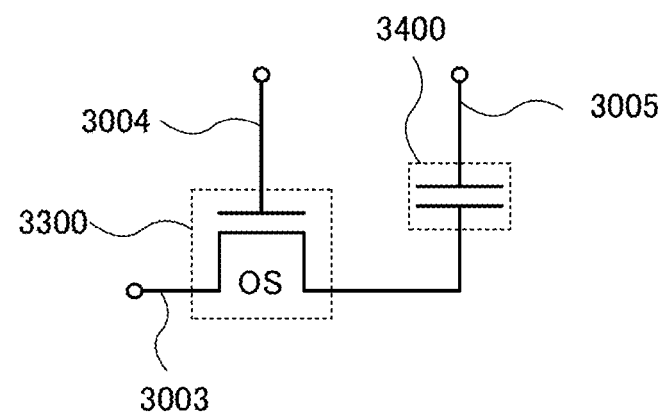

An example of a semiconductor device (memory device) which includes the transistor of one embodiment of the present invention, which can retain stored data even when not powered, and which has an unlimited number of write cycles is shown in FIGS. 42A and 42B.

The semiconductor device illustrated in FIG. 42A includes a transistor 3200 using a first semiconductor, a transistor 3300 using a second semiconductor, and a capacitor 3400. Note that any of the above-described transistors can be used as the transistor 3300.

The transistor 3300 is a transistor using an oxide semiconductor. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 42A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 42A has a feature that the potential of the gate of the transistor 3200 can be retained, and thus enables writing, retaining, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge is held at the node FG (retaining).

Since the off-state current of the transistor 3300 is extremely low, the charge of the node FG is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential Vo which is between $V_{th\_H}$ and $V_{th\_L}$, whereby charge supplied to the node FG can be determined. For example, in the case where the high-level charge is supplied to the node FG in writing and the potential of the fifth wiring 3005 is Vo ($>V_{th\_H}$), the transistor 3200 is turned on. On the other hand, in the case where the low-level charge is supplied to the node FG in writing, even when the potential of the fifth wiring 3005 is Vo ($<V_{th\_L}$), the transistor 3200 remains off. Thus, the data retained in the node FG can be read by determining the potential of the second wiring 3002.

Note that in the case where memory cells are arrayed, it is necessary that data of a desired memory cell is read in read operation. In the case where data of the other memory cells is not read, the fifth wiring 3005 may be supplied with a potential at which the transistor 3200 is turned off regardless of the charge supplied to the node FG, that is, a potential lower than $V_{th\_H}$. Alternatively, the fifth wiring 3005 may be supplied with a potential at which the transistor 3200 is turned on regardless of the charge supplied to the node FG, that is, a potential higher than $V_{th\_L}$.

The semiconductor device in FIG. 42B is different from the semiconductor device in FIG. 42A in that the transistor 3200 is not provided. Also in this case, writing and retaining operation of data can be performed in a manner similar to the semiconductor device in FIG. 42A.

Reading of data in the semiconductor device in FIG. 42B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0}+C\times V)/(C_B+C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0}+C\times V_1)/(C_B+C)$) is higher than the potential of the third wiring 3003 in the case of retaining the potential $V_0$ ($=(C_B \times V_{B0}+C\times V_0)/(C_B+C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having an extremely low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

<Imaging Device>

An imaging device of one embodiment of the present invention is described below.

Figure 43A:
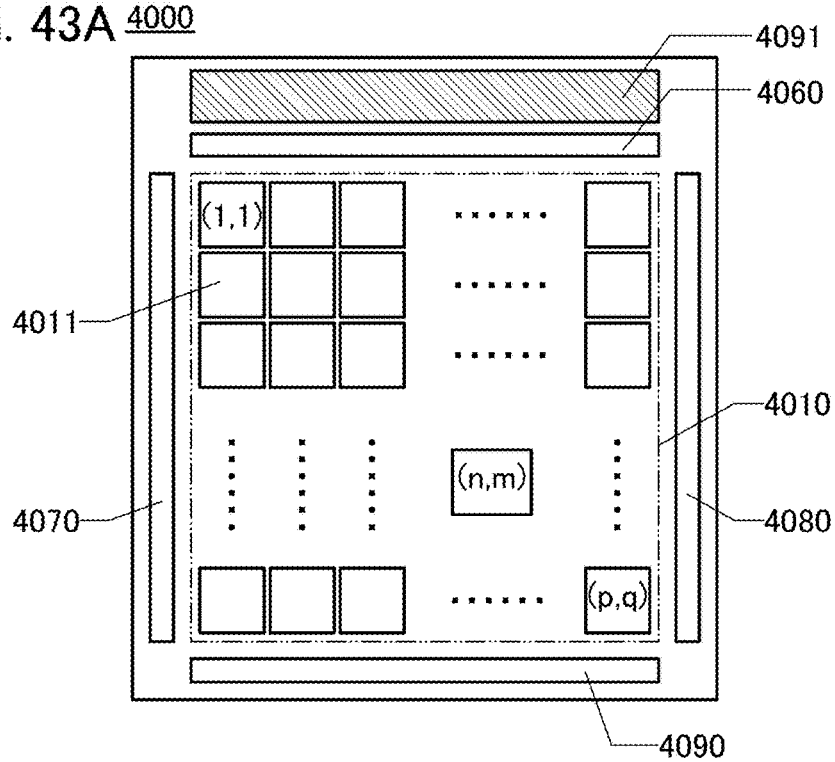
FIGS. 43A and 43B are each a top view of a semiconductor device according to one embodiment of the present invention.

FIG. 43A is a plan view illustrating a structure example of an imaging device 4000 of one embodiment of the present invention. The imaging device 4000 includes a pixel portion 4010 and a peripheral circuit for driving the pixel portion 4010 (a peripheral circuit 4060, a peripheral circuit 4070, a peripheral circuit 4080, and a peripheral circuit 4090). The pixel portion 4010 includes a plurality of pixels 4011 arranged in matrix with p rows and q columns (p and q are each a natural number greater than or equal to 2). The peripheral circuit 4060, the peripheral circuit 4070, the peripheral circuit 4080, and the peripheral circuit 4090 are each connected to a plurality of pixels 4011, and a signal for driving the plurality of pixels 4011 is supplied. In this specification and the like, all of the peripheral circuit 4060, the peripheral circuit 4070, the peripheral circuit 4080, and the peripheral circuit 4090 indicate "peripheral circuit" or "driver circuit" in some cases. For example, the peripheral circuit 4060 can be regarded as part of the peripheral circuit.

The imaging device 4000 preferably includes a light source 4091. The light source 4091 can emit detection light P1.

The peripheral circuit includes at least one of a logic circuit, a switch, a buffer, an amplifier circuit, and a converter circuit. The peripheral circuit may be provided over a substrate where the pixel portion 4010 is formed. Part or the whole of the peripheral circuit may be mounted over a semiconductor device such as an IC. Note that as the peripheral circuit, one or more of the peripheral circuit 4060, the peripheral circuit 4070, the peripheral circuit 4080, and the peripheral circuit 4090 may be omitted.

Figure 43B:
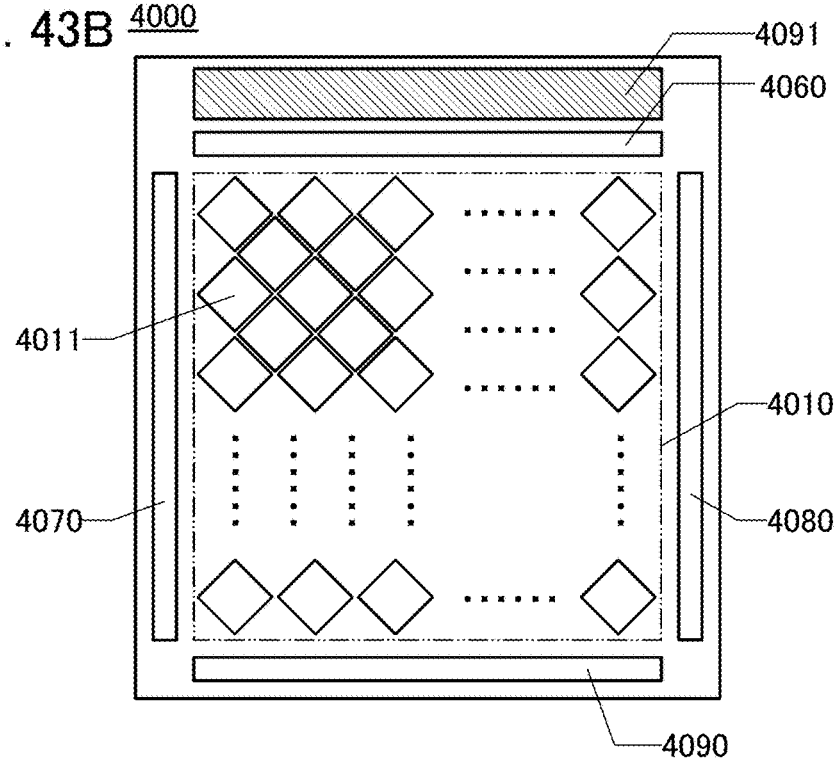

As illustrated in FIG. 43B, the pixels 4011 may be provided to be inclined in the pixel portion 4010 included in the imaging device 4000. When the pixels 4011 are obliquely arranged, the distance between pixels (pitch) can be shortened in the row direction and the column direction. Accordingly, the quality of an image taken with the imaging device 4000 can be improved.

<Configuration Example 1 of Pixel>

The pixel 4011 included in the imaging device 4000 is formed with a plurality of subpixels 4012, and each subpixel 4012 is combined with a filter which transmits light with a specific wavelength band (color filter), whereby data for achieving color image display can be obtained.

Figure 44A:
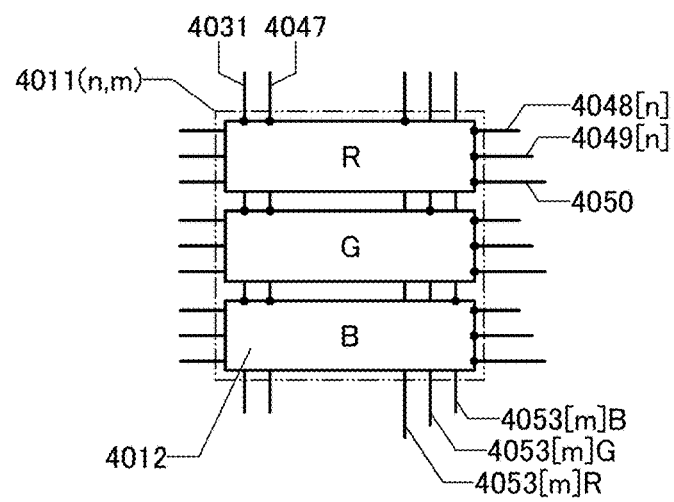
FIGS. 44A and 44B are block diagrams illustrating a semiconductor device according to one embodiment of the present invention.

FIG. 44A is a plan view showing an example of the pixel 4011 with which a color image is obtained. The pixel 4011 illustrated in FIG. 44A includes a subpixel 4012 provided with a color filter transmitting light with a red (R) wavelength band (also referred to "subpixel 4012R"), a subpixel 4012 provided with a color filter transmitting light with a green (G) wavelength band (also referred to "subpixel 4012G"), and a subpixel 4012 provided with a color filter transmitting light with a blue (B) wavelength band (also referred to "subpixel 4012B").

The subpixel 4012 (the subpixel 4012R, the subpixel 4012G, and the subpixel 4012B) is electrically connected to a wiring 4031, a wiring 4047, a wiring 4048, a wiring 4049, and a wiring 4050. In addition, the subpixel 4012R, the subpixel 4012G, and the subpixel 4012B are connected to respective wirings 4053 which are independently provided. In this specification and the like, for example, the wiring 4048 and the wiring 4049 that are connected to the pixel 4011 in the n-th row are referred to as a wiring 4048[n] and a wiring 4049[n]. For example, the wiring 4053 connected to the pixel 4011 in the m-th column is referred to as a wiring 4053[m]. Note that in FIG. 44A, the wirings 4053 connected to the subpixel 4012R, the subpixel 4012G, and the subpixel 4012B in the pixel 4011 in the m-th column are referred to as a wiring 4053[m]R, a wiring 4053[m]G, and a wiring 4053[m]B. The subpixels 4012 are electrically connected to the peripheral circuit through the above wirings.

Figure 44B:
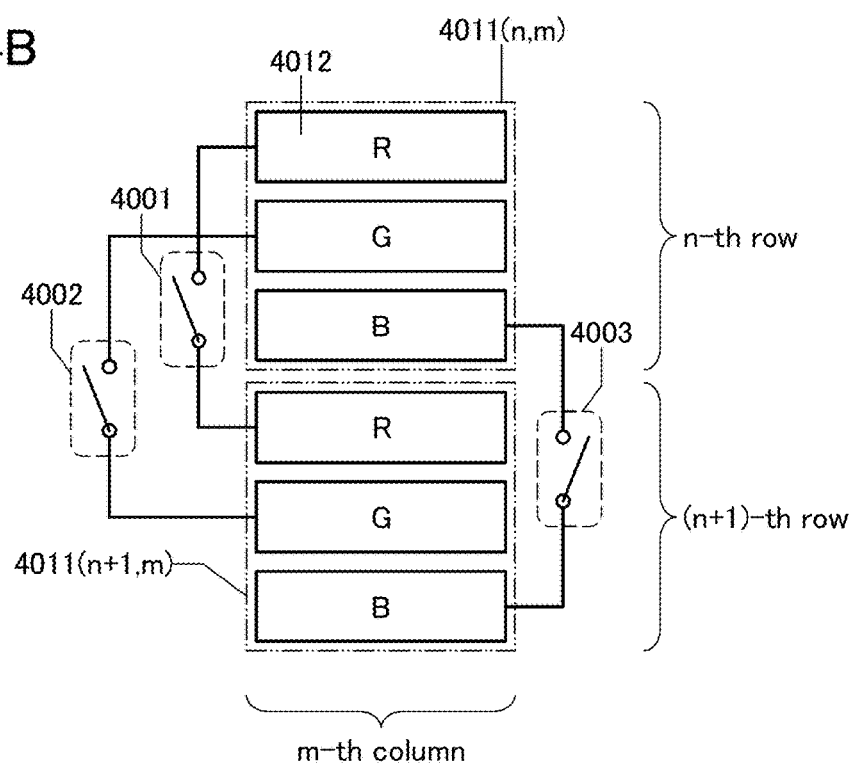

The imaging device 4000 has a structure in which the subpixel 4012 is connected to the subpixel 4012 in an adjacent pixel 4011, via a switch. In the structure, the color filters provided for the subpixels 4012 transmit light with the same wavelength band. FIG. 44B shows a connection example of the subpixels 4012: the subpixel 4012 in the pixel 4011 arranged in an n-th (n is a natural number greater than or equal to 1 and less than or equal top) row and an m-th (m is a natural number greater than or equal to 1 and less than or equal to q) column and the subpixel 4012 in the adjacent pixel 4011 arranged in an (n+1)-th row and the m-th column. In FIG. 44B, the subpixel 4012R arranged in the n-th row and the m-th column and the subpixel 4012R arranged in the (n+1)-th row and the m-th column are connected to each other via a switch 4001. The subpixel 4012G arranged in the n-th row and the m-th column and the subpixel 4012G arranged in the (n+1)-th row and the m-th column are connected to each other via a switch 4002. The subpixel 4012B arranged in the n-th row and the m-th column and the subpixel 4012B arranged in the (n+1)-th row and the m-th column are connected to each other via a switch 4003.

The color filter used in the subpixel 4012 is not limited to red (R), green (G), and blue (B) color filters, and color filters that transmit light of cyan (C), yellow (Y), and magenta (M) may be used. The subpixels 4012 that sense light with three different wavelength bands are provided in one pixel 4011, whereby a full-color image can be obtained.

The pixel 4011 including the subpixel 4012 provided with a color filter transmitting yellow (Y) light may be provided, in addition to the subpixels 4012 provided with the color filters transmitting red (R), green (G), and blue (B) light. The pixel 4011 including the subpixel 4012 provided with a color filter transmitting blue (B) light may be provided, in addition to the subpixels 4012 provided with the color filters transmitting cyan (C), yellow (Y), and magenta (M) light. When the subpixels 4012 sensing light with four different wavelength bands are provided in one pixel 4011, the reproducibility of colors of an obtained image can be increased.

For example, in FIG. 44A, in regard to the subpixel 4012 sensing a red wavelength band, the subpixel 4012 sensing a green wavelength band, and the subpixel 4012 sensing a blue wavelength band, the pixel number ratio (or the ratio of light receiving area) thereof is not necessarily 1:1:1. For example, it is possible to employ the Bayer arrangement, in which the ratio of the number of pixels (the ratio of light-receiving areas) is set to red:green:blue=1:2:1. Alternatively, the pixel number ratio (the ratio of light receiving area) of red and green to blue may be 1:6:1.

Although the number of subpixels 4012 provided in the pixel 4011 may be one, two or more subpixels are preferably provided. For example, when two or more subpixels 4012 sensing the same wavelength band are provided, the redundancy is increased, and the reliability of the imaging device 4000 can be increased.

When an infrared (IR) filter that transmits infrared light and absorbs or reflects light with wavelength shorter than or equal to that of visible light is used as the filter, the imaging device 4000 that senses infrared light can be achieved.

Furthermore, when a neutral density (ND) filter (dark filter) is used, output saturation which occurs when a large amount of light is incident on a photoelectric conversion element (light-receiving element) can be prevented. With a combination of ND filters with different dimming capabilities, the dynamic range of the imaging device can be increased.

Besides the above-described filter, the pixel 4011 may be provided with a lens. An arrangement example of the pixel 4011, a filter 4054, and a lens 4055 is described with cross-sectional views in FIGS. 45A and 45B. With the lens 4055, the photoelectric conversion element can receive incident light efficiently. Specifically, as illustrated in FIG. 45A, light 4056 enters a photoelectric conversion element 4020 through the lens 4055, the filter 4054 (a filter 4054R, a filter 4054G, and a filter 4054B), a pixel circuit 4030, and the like.

As indicated by a region surrounded with dashed-two dotted lines; however, part of the light 4056 indicated by arrows might be blocked by some wirings 4057. Thus, a preferable structure is that the lens 4055 and the filter 4054 are provided on the photoelectric conversion element 4020 side, so that the photoelectric conversion element 4020 efficiently receives the light 4056 as illustrated in FIG. 45B. When the light 4056 is incident on the photoelectric conversion element 4020 side, the imaging device 4000 with high sensitivity can be provided.

Figure 45A:
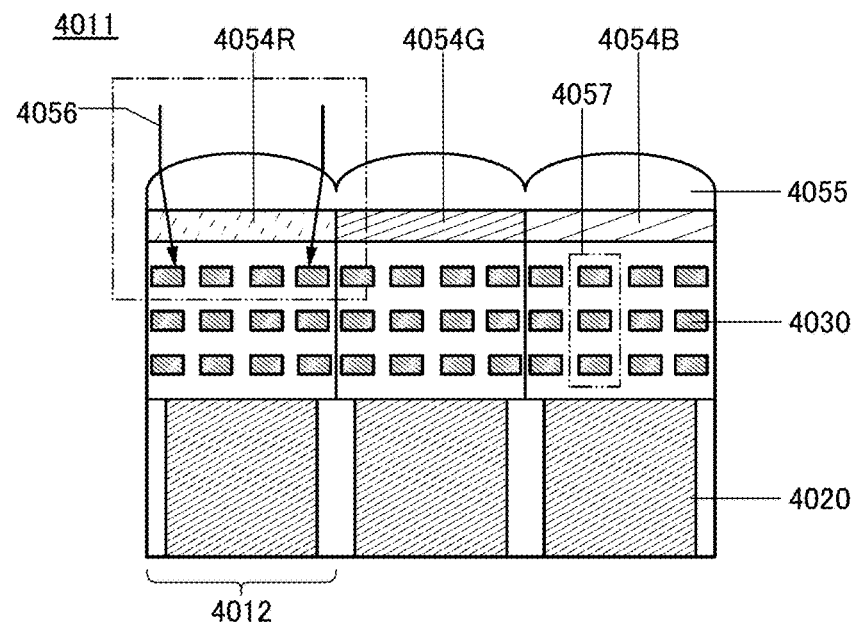
FIGS. 45A and 45B are each a cross-sectional view illustrating a semiconductor device according to one embodiment of the present invention.
Figure 45B:
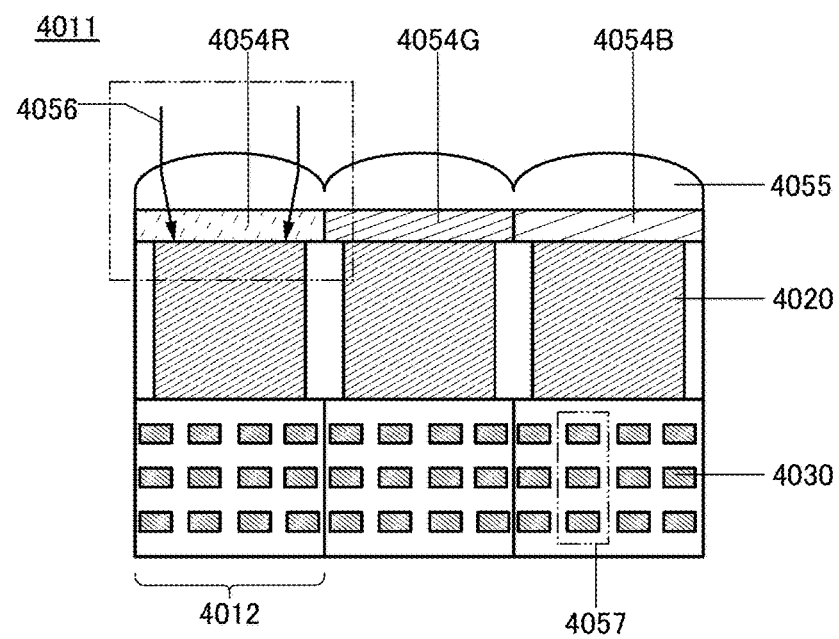

As the photoelectric conversion element 4020 illustrated in FIGS. 45A and 45B, a photoelectric conversion element in which a p-n junction or a p-i-n junction is formed may be used.

The photoelectric conversion element 4020 may be formed using a substance that has a function of absorbing a radiation and generating electric charges. Examples of the substance that has a function of absorbing a radiation and generating electric charges include selenium, lead iodide, mercury iodine, gallium arsenide, cadmium telluride, and cadmium zinc alloy.

For example, when selenium is used for the photoelectric conversion element 4020, the photoelectric conversion element 4020 can have a light absorption coefficient in a wide wavelength range, such as visible light, ultraviolet light, infrared light, X-rays, and gamma rays.

One pixel 4011 included in the imaging device 4000 may include the subpixel 4012 with a first filter in addition to the subpixel 4012 illustrated in FIGS. 44A and 44B.

<Configuration Example 2 of Pixel>

An example of a pixel including a transistor using silicon and a transistor using an oxide semiconductor is described below.

Figure 46A:
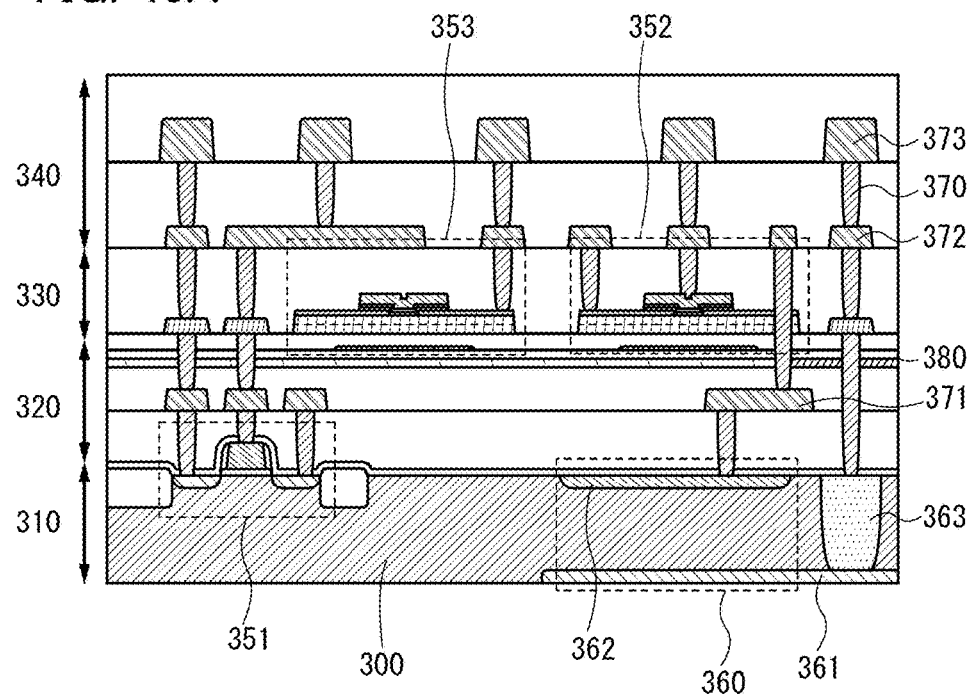
FIGS. 46A and 46B are each a cross-sectional view illustrating a semiconductor device according to one embodiment of the present invention.
Figure 46B:
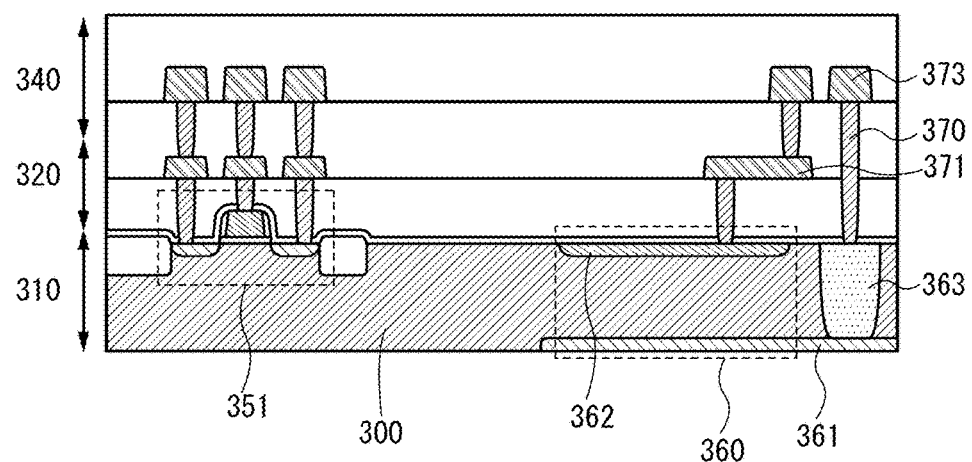

FIGS. 46A and 46B are each a cross-sectional view of an element included in an imaging device. The imaging device illustrated in FIG. 46A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 46A, a light-receiving surface of the photodiode 360 is provided on the side opposite to a surface of the silicon substrate 300 where the transistor 351 is formed. With the above structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case of forming a pixel with use of transistors using an oxide semiconductor, the layer 310 may include the transistor using an oxide semiconductor. Alternatively, the layer 310 may be omitted, and the pixel may include only transistors using an oxide semiconductor.

In the case of forming a pixel with use of transistors using silicon, the layer 330 may be omitted. An example of a cross-sectional view in which the layer 330 is not provided is shown in FIG. 46B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

An insulator 380 is provided between the layer 310 including the transistor 351 and the photodiode 360 and the layer 330 including the transistors 352 and 353 although there is no limitation on its specific position.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352 and the transistor 353 becomes one of factors generating a carrier in the oxide semiconductor. Thus, the hydrogen may cause a reduction of the reliability of the transistor 352 and the transistor 353. Therefore, in the case where the transistor using an oxide semiconductor is provided over the transistor using a silicon-based semiconductor material, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352 and the transistor 353 can be increased.

As the insulator 380, an insulator having a function of blocking oxygen or hydrogen is used, for example.

In the cross-sectional view in FIG. 46A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 47A1 and FIG. 47B1, part or the whole of the imaging device can be bent. FIG. 47A1 illustrates a state in which the imaging device is bent in the direction of dashed-dotted line X1-X2. FIG. 47A2 is a cross-sectional view illustrating a portion indicated by dashed-dotted line X1-X2 in FIG. 47A1. FIG. 47A3 is a cross-sectional view illustrating a portion indicated by dashed-dotted line Y1-Y2 in FIG. 47A1.

FIG. 47B1 illustrates a state where the imaging device is bent in the direction of dashed-dotted line X3-X4 and the direction of dashed-dotted line Y3-Y4. FIG. 47B2 is a cross-sectional view illustrating a portion indicated by dashed-dotted line X3-X4 in FIG. 47B1. FIG. 47B3 is a cross-sectional view illustrating a portion indicated by dashed-dotted line Y3-Y4 in FIG. 47B1.

The bent imaging device enables the curved field and astigmatism to be reduced. Thus, the optical design of lens and the like, which is used in combination of the imaging device, can be facilitated. For example, the number of lens used for aberration correction can be reduced; accordingly, a reduction of size or weight of electronic devices using the imaging device, and the like, can be achieved. In addition, the quality of a captured image can be improved.

<CPU>

A CPU including a semiconductor device such as any of the above-described transistors or the above-described memory device is described below.

Figure 48:
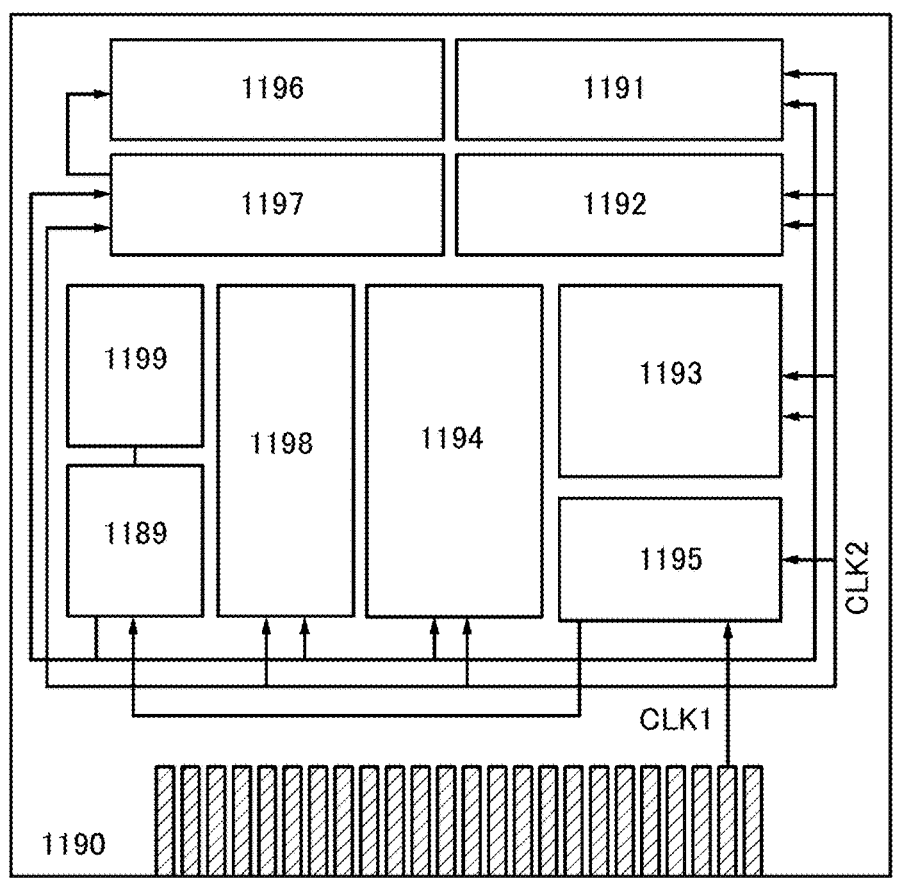
FIG. 48 is a block diagram illustrating a CPU according to one embodiment of the present invention.

FIG. 48 is a block diagram illustrating a configuration example of a CPU including any of the above-described transistors as a component.

The CPU illustrated in FIG. 48 includes an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 48 is just an example in which the configuration has been simplified, and an actual CPU may have various configurations depending on the application. For example, the CPU may have the following configuration: a structure including the CPU illustrated in FIG. 48 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 48, a memory cell is provided in the register 1196. For the memory cell of the register 1196, any of the above-described transistors, the above-described memory device, or the like can be used.

In the CPU illustrated in FIG. 48, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When holding data by the flip-flop is selected, a power supply voltage is supplied to the memory cell in the register 1196. When holding data by the capacitor is selected, the data is rewritten in the capacitor, and supply of power supply voltage to the memory cell in the register 1196 can be stopped.

Figure 49:
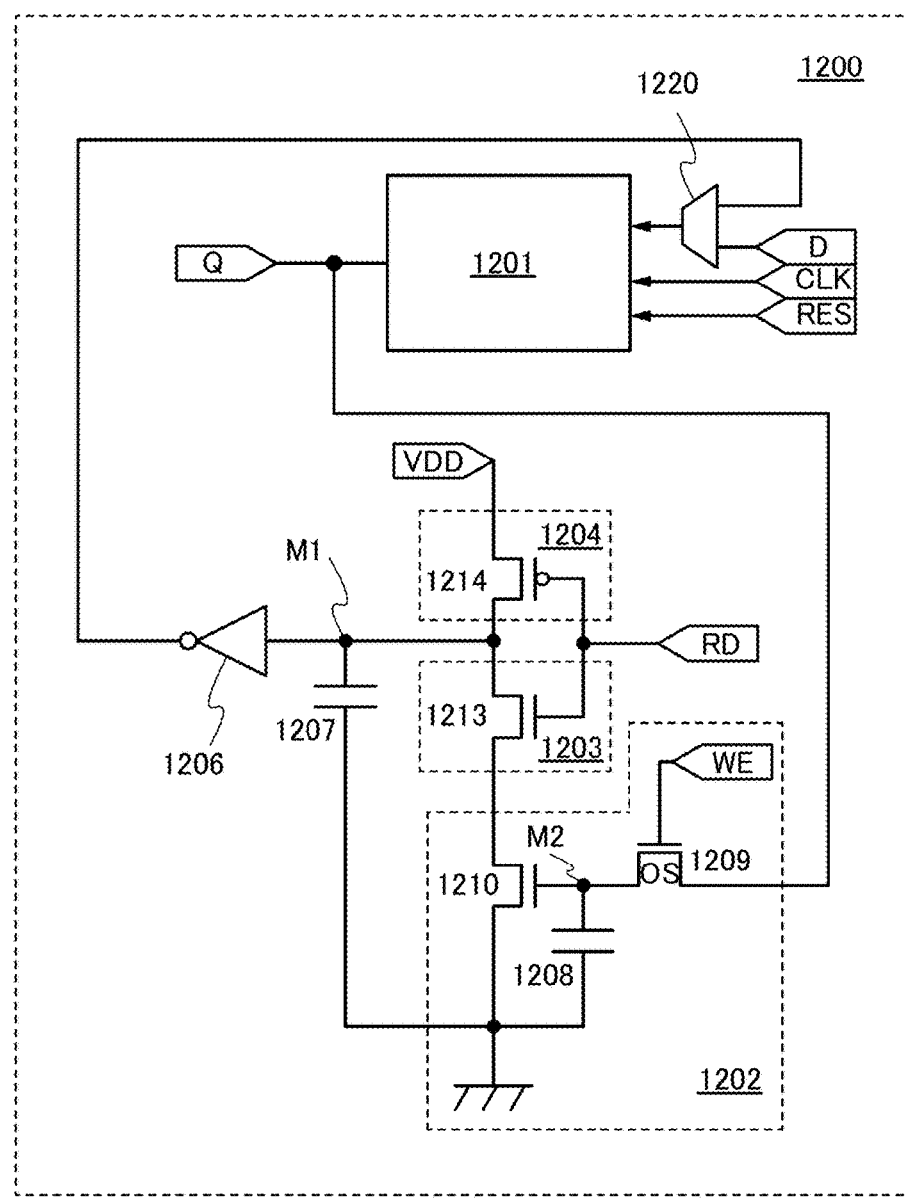
FIG. 49 is a circuit diagram illustrating a memory element according to one embodiment of the present invention.

FIG. 49 is an example of a circuit diagram of a memory element 1200 that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 49 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 49, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 49, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer including a semiconductor other than an oxide semiconductor or in the substrate 1190 can be used for the rest of the transistors.

As the circuit 1201 in FIG. 49, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU, the memory element 1200 can also be used in an LSI such as a digital signal processor (DSP), a custom LSI, or a programmable logic device (PLD), and a radio frequency identification (RF-ID).

<Display Device>

The following shows configuration examples of a display device of one embodiment of the present invention.

[Structural Example]

Figure 50A:
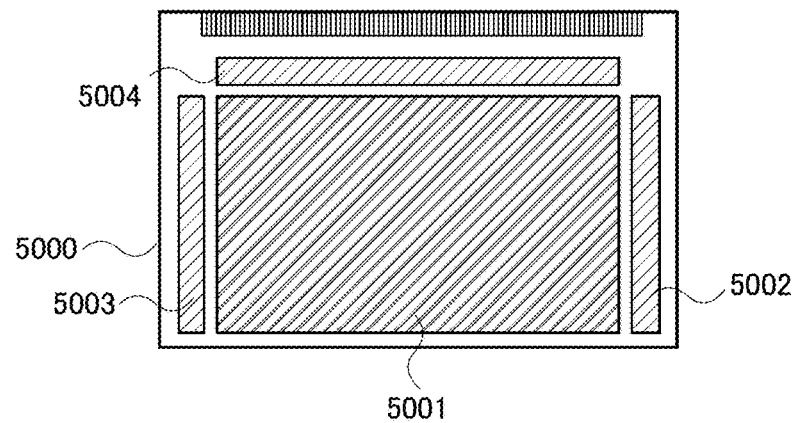
FIGS. 50A to 50C are circuit diagrams of a display device according to one embodiment of the present invention.
Figure 50B:
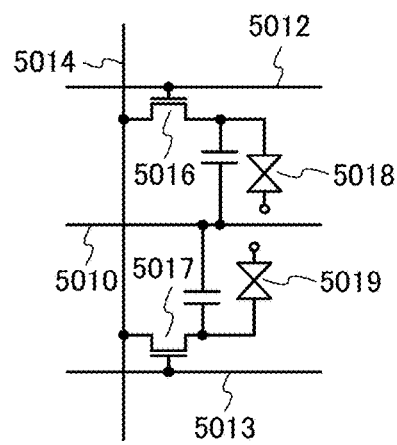
Figure 50C:
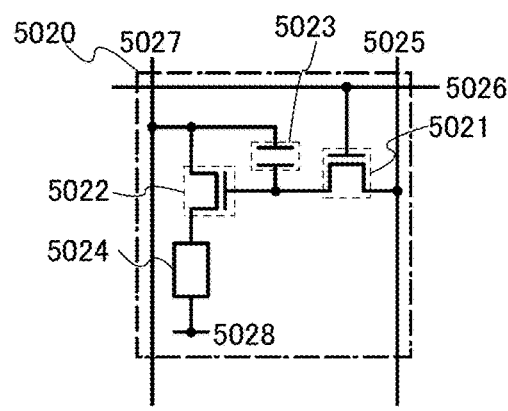

FIG. 50A is a top view of a display device of one embodiment of the present invention. FIG. 50B illustrates a pixel circuit where a liquid crystal element is used for a pixel of a display device of one embodiment of the present invention. FIG. 50C illustrates a pixel circuit where an organic EL element is used for a pixel of a display device of one embodiment of the present invention.

Any of the above-described transistors can be used as a transistor used for the pixel. Here, an example in which an n-channel transistor is used is shown. Note that a transistor manufactured through the same steps as the transistor used for the pixel may be used for a driver circuit. Thus, by using any of the above-described transistors for a pixel or a driver circuit, the display device can have high display quality and/or high reliability.

FIG. 50A illustrates an example of a block diagram of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, a display device can be manufactured at cost lower than that in the case where a driver circuit is separately formed. Further, in the case where a driver circuit is separately formed, the number of wiring connections is increased. By providing the driver circuit over the substrate 5000, the number of wiring connections can be reduced. Accordingly, the reliability and/or yield can be improved.

[Liquid Crystal Display Device]

FIG. 50B illustrates an example of a circuit configuration of the pixel. Here, a pixel circuit which is applicable to a pixel of a VA liquid crystal display device, or the like is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 5012 of a transistor 5016 and a gate wiring 5013 of a transistor 5017 are separated so that different gate signals can be supplied thereto. In contrast, a source or drain electrode 5014 functioning as a data line is shared by the transistors 5016 and 5017. Any of the above-described transistors can be used as appropriate as each of the transistors 5016 and 5017. Thus, the liquid crystal display device can have high display quality and/or high reliability.

The shapes of a first pixel electrode electrically connected to the transistor 5016 and a second pixel electrode electrically connected to the transistor 5017 are described. The first pixel electrode and the second pixel electrode are separated by a slit. The first pixel electrode has a V shape and the second pixel electrode is provided so as to surround the first pixel electrode.

A gate electrode of the transistor 5016 is electrically connected to the gate wiring 5012, and a gate electrode of the transistor 5017 is electrically connected to the gate wiring 5013. When different gate signals are supplied to the gate wiring 5012 and the gate wiring 5013, operation timings of the transistor 5016 and the transistor 5017 can be varied. As a result, alignment of liquid crystals can be controlled.

Furthermore, a capacitor may be formed using a capacitor wiring 5010, a gate insulator functioning as a dielectric, and a capacitor electrode electrically connected to the first pixel electrode or the second pixel electrode.

The multi-domain pixel includes a first liquid crystal element 5018 and a second liquid crystal element 5019. The first liquid crystal element 5018 includes the first pixel electrode, a counter electrode, and a liquid crystal layer therebetween. The second liquid crystal element 5019 includes the second pixel electrode, a counter electrode, and a liquid crystal layer therebetween.

Note that a pixel circuit in the display device of one embodiment of the present invention is not limited to that shown in FIG. 50B. For example, a switch, a resistor, a capacitor, a transistor, a sensor, a logic circuit, or the like may be added to the pixel circuit shown in FIG. 50B.

[Organic EL Panel]

FIG. 50C illustrates another example of a circuit configuration of the pixel. Here, a pixel structure of a display device using an organic EL element is shown.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 50C shows an example of a pixel circuit. Here, one pixel includes two n-channel transistors. Note that any of the above-described transistors can be used as the n-channel transistors. Further, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, any of the above-described transistors can be used as appropriate. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to voltage which is the sum of power supply line voltage and the threshold voltage $V_{th}$ of the driver transistor 5022 is applied to the signal line 5025.

In the case of performing analog grayscale driving, a voltage higher than or equal to a voltage which is the sum of the forward voltage of the light-emitting element 5024 and the threshold voltage $V_{th}$ of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that shown in FIG. 50C. For example, a switch, a resistor, a capacitor, a sensor, a transistor, a logic circuit, or the like may be added to the pixel circuit shown in FIG. 50C.

In the case where any of the above-described transistors is used for the circuit illustrated in FIGS. 50A to 50C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode.

<Electronic Device>

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 51A to 51F illustrate specific examples of these electronic devices.

Figure 51A:
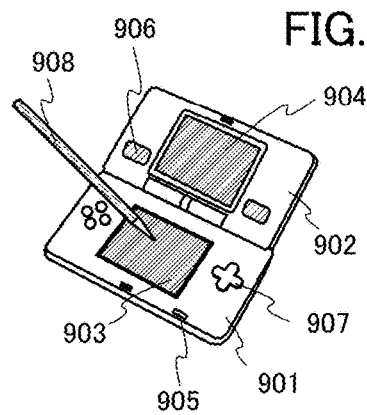
FIGS. 51A to 51F each illustrate an electronic device according to an embodiment of the present invention.

FIG. 51A illustrates a portable game console including a housing 901, a housing 902, a display portion 903, a display portion 904, a microphone 905, a speaker 906, an operation key 907, a stylus 908, and the like. Although the portable game machine in FIG. 51A has the two display portions 903 and 904, the number of display portions included in a portable game machine is not limited to this.

Figure 51B:
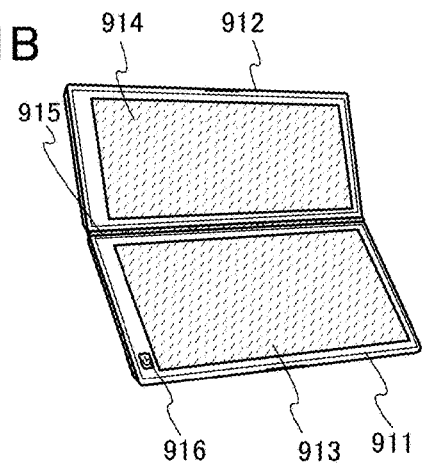

FIG. 51B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel portion of a display device.

Figure 51C:
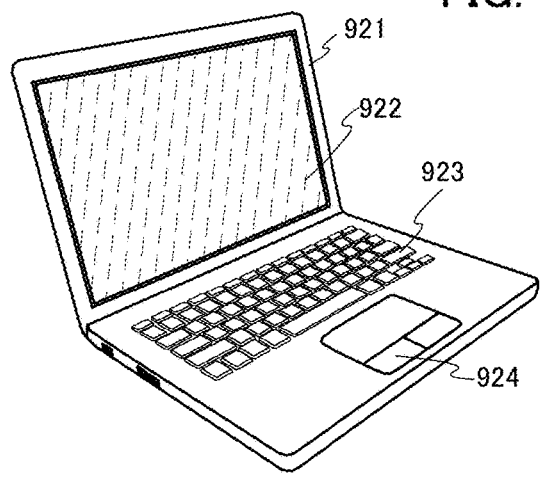

FIG. 51C illustrates a laptop personal computer, which includes a housing 921, a display portion 922, a keyboard 923, a pointing device 924, and the like.

Figure 51D:
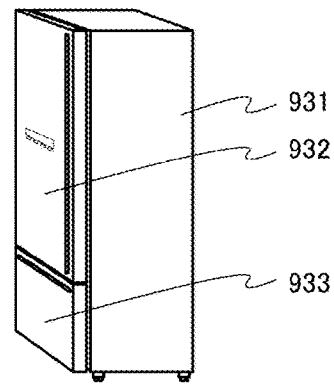

FIG. 51D illustrates an electric refrigerator-freezer including a housing 931, a door for a refrigerator 932, a door for a freezer 933, and the like.

Figure 51E:
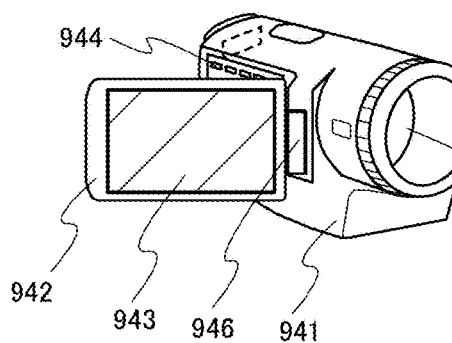

FIG. 51E illustrates a video camera including a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 51F:
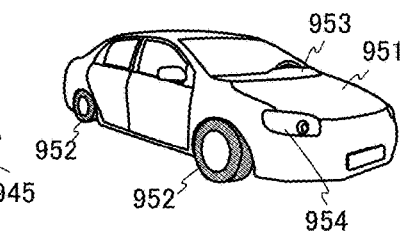

FIG. 51F illustrates an ordinary vehicle including a car body 951, wheels 952, a dashboard 953, lights 954, and the like.

EXPLANATION OF REFERENCE

100: target, 100*a*: target, 100*b*: target, 101: deposition chamber, 103*b*: magnet unit, 110: backing plate, 110*a*: backing plate, 110*b*: backing plate, 120: target holder, 120*a*: target holder, 120*b*: target holder, 130: magnet unit, 130*a*: magnet unit, 130*b*: magnet unit, 130N: magnet, 130N1: magnet, 130N2: magnet, 130S: magnet, 132: magnet holder, 140: member, 160: substrate, 170: substrate holder, 180*a*: magnetic force line, 180*b*: magnetic force line, 200: pellet, 201: ion, 203: particle, 206: oxide thin film, 220: substrate, 230: target, 240: plasma, 250: magnet, 260: heating mechanism, 300: silicon substrate, 310: layer, 320: layer, 330: layer, 340: layer, 351: transistor, 352: transistor, 353: transistor, 360: photodiode, 361: anode, 363: low-resistance region, 370: plug, 371: wiring, 372: wiring, 373: wiring, 380: insulator, 400: substrate, 402: insulator, 404: conductor, 406*a*: semiconductor, 406*b*: semiconductor, 406*c*: semiconductor, 408: insulator, 412: insulator, 413: conductor, 416*a*: conductor, 416*b*: conductor, 418: insulator, 423*a*: low-resistance region, 423*b*: low-resistance region, 424*a*: conductor, 424*b*: conductor, 426*a*: conductor, 426*b*: conductor, 428: insulator, 600: substrate, 604: conductor, 606*a*: semiconductor, 606*b*: semiconductor, 606*c*: semiconductor, 612: insulator, 613: conductor, 616*a*: conductor, 616*b*: conductor, 618: insulator, 620: insulator, 700: deposition apparatus, 701: atmosphere-side substrate supply chamber, 702: atmosphere-side substrate transfer chamber, 703*a*: load lock chamber, 703*b*: unload lock chamber, 704: transfer chamber, 705: substrate heating chamber, 706*a*: deposition chamber, 706*b*: deposition chamber, 706*c*: deposition chamber, 751: cryotrap, 752: stage, 761: cassette port, 762: alignment port, 763: transfer robot, 764: gate valve, 765: heating stage, 766: target, 767: attachment protection plate, 768: substrate stage, 769: substrate, 770: vacuum pump, 771: cryopump, 772: turbo molecular pump, 780: mass flow controller, 781: refiner, 782: gas heating system, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for refrigerator, 933: door for freezer, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2100: transistor, 2200: transistor, 3001: wiring, 3002: wiring, 3003: wiring, 3004: wiring, 3005: wiring, 3200: transistor, 3300: transistor, 3400: capacitor, 4000: imaging device, 4001: switch, 4002: switch, 4003: switch, 4010: pixel portion, 4011: pixel, 4012: subpixel, 4012B: subpixel, 4012G: subpixel, 4012R: subpixel, 4020: photoelectric conversion element, 4030: pixel circuit, 4031: wiring, 4047: wiring, 4048: wiring, 4049: wiring, 4050: wiring, 4053: wiring, 4054: filter, 4054B: filter, 4054G: filter, 4054R: filter, 4055: lens, 4056: light, 4057: wiring, 4060: peripheral circuit, 4070: peripheral circuit, 4080: peripheral circuit, 4090: peripheral circuit, 4091: light source, 5000: substrate, 5001: pixel portion, 5002: scan line driver circuit, 5003: scan line driver circuit, 5004: signal line driver circuit, 5010: capacitor wiring, 5012: gate wiring, 5013: gate wiring, 5014: drain electrode, 5016: transistor, 5017: transistor, 5018: liquid crystal element, 5019: liquid crystal element, 5020: pixel, 5021: switching transistor, 5022: driver transistor, 5023: capacitor, 5024: light-emitting element, 5025: signal line, 5026: scan line, 5027: power supply line, 5028: common electrode This application is based on Japanese Patent Application serial no. 2014-218907 filed with Japan Patent Office on Oct. 28, 2014, Japanese Patent Application serial no. 2014-218908 filed with Japan Patent Office on Oct. 28, 2014, and Japanese Patent Application serial no. 2014-250574 filed with Japan Patent Office on Dec. 11, 2014, the entire contents of which are hereby incorporated by reference.

The invention claimed is:

1. A method for forming an oxide with a sputtering method with use of a deposition chamber, a target in the deposition chamber, and a substrate, comprising the steps of:

generating a potential difference between the target and the substrate after supplying a sputtering gas containing oxygen and a rare gas into the deposition chamber, thereby generating a plasma including ions of the sputtering gas, wherein the ions of the sputtering gas include oxygen ions;

accelerating the ions of the sputtering gas moving toward the target by the potential difference;

separating flat-plate particles of a compound containing elements, an atom included in the target, and an aggregate of the atoms included in the target from the target by collision of the accelerated ions of the sputtering gas with the target;

negatively charging surfaces of the flat-plate particles that receive negative charge from the oxygen ions while flying in the plasma;

depositing one of the negatively-charged flat-plate particles with a surface facing the substrate;

depositing another negatively-charged flat-plate particle in a region apart from the one negatively-charged flat-plate particle over the substrate while repelling the one negatively-charged flat-plate particle;

inserting the atom and the aggregate of the atoms between a gap between the one negatively-charged flat-plate particle and the another negatively-charged flat-plate particle; and growing the atom and the aggregate of the atoms in a lateral direction between the flat-plate particles, so that the gap between the one negatively-charged flat-plate particle and the another negatively-charged flat-plate particle is filled with the atom and the aggregate of the atoms.

2. The method for forming an oxide according to claim 1, wherein the growth of the atoms and the aggregate of the atoms having the same composition with the flat-plate particle in the lateral direction starts from the flat-plate particle, so that the gap between the flat-plate particles is filled.

3. The method for forming an oxide according to claim 1, wherein the flat-plate particles are stacked to form a thin film structure.

4. The method for forming an oxide according to claim 1, wherein after formation of the oxide, thermal annealing or rapid thermal annealing is performed at a temperature that is higher than a temperature at which the oxide is formed and that is lower than a temperature at which the oxide is turned into a different material, so that the oxide is made to have a high density or to be a single crystal.

5. The method for forming an oxide according to claim 4, wherein the temperature of thermal annealing or rapid thermal annealing is higher than 300° C. and lower than 1500° C.

6. The method for forming an oxide according to claim 1, wherein the oxide is formed on a surface having an amorphous structure.

7. The method for forming an oxide according to claim 1, wherein the target includes indium, zinc, an element M, and an oxygen,
wherein the element M is one of aluminum, gallium, yttrium, and tin, and
wherein the target includes a region having a polycrystalline structure.

8. A method for forming an oxide with a sputtering method with use of a deposition chamber, a target in the deposition chamber, and a substrate, comprising the steps of:

generating a potential difference between the target and the substrate after supplying a sputtering gas containing oxygen into the deposition chamber, thereby generating a plasma including ions of the sputtering gas, wherein the ions of the sputtering gas include oxygen ions;

accelerating the ions of the sputtering gas moving toward the target by the potential difference;

separating flat-plate particles of a compound containing elements, an atom included in the target, and an aggregate of the atoms included in the target from the target by collision of the accelerated ions of the sputtering gas with the target;

negatively charging surfaces of the flat-plate particles that receive negative charge from the oxygen ions while flying in the plasma;

depositing one of the negatively-charged flat-plate particles with a surface facing the substrate;

depositing another negatively-charged flat-plate particle in a region apart from the one negatively-charged flat-plate particle over the substrate while repelling the one negatively-charged flat-plate particle;

inserting the atom and the aggregate of the atoms between a gap between the one negatively-charged flat-plate particle and the another negatively-charged flat-plate particle; and growing the atom and the aggregate of the atoms in a lateral direction between the flat-plate particles, so that the gap between the one negatively-charged flat-plate particle and the another negatively-charged flat-plate particle is filled with the atom and the aggregate of the atoms.

9. The method for forming an oxide according to claim 8, wherein the grow of the atoms and the aggregate of the atoms having the same composition with the flat-plate particle in the lateral direction starts from the flat-plate particle, so that the gap between the flat-plate particles is filled.

10. The method for forming an oxide according to claim 8, wherein the flat-plate particles are stacked to form a thin film structure.

11. The method for forming an oxide according to claim 8, wherein after formation of the oxide, thermal annealing or rapid thermal annealing is performed at a temperature that is higher than a temperature at which the oxide is formed and that is lower than a temperature at which the oxide is turned into a different material, so that the oxide is made to have a high density or to be a single crystal.

12. The method for forming an oxide according to claim 11, wherein the temperature of thermal annealing or rapid thermal annealing is higher than 300° C. and lower than 1500° C.

13. The method for forming an oxide according to claim 8, wherein the oxide is formed on a surface having an amorphous structure.

14. The method for forming an oxide according to claim 8,
wherein the target includes indium, zinc, an element M, and an oxygen,
wherein the element M is one of aluminum, gallium, yttrium, and tin, and
wherein the target includes a region having a polycrystalline structure.

15. A method for forming an oxide with a sputtering method with use of a deposition chamber, a target in the deposition chamber, and a substrate, comprising the steps of:
generating a potential difference between the target and the substrate after supplying a sputtering gas containing a rare gas into the deposition chamber, thereby generating a plasma including an ion of the sputtering gas;
accelerating the ion of the sputtering gas moving toward the target by the potential difference;
separating flat-plate particles of a compound containing elements, an atom included in the target, and an aggregate of the atoms included in the target from the target by collision of the accelerated ion of the sputtering gas with the target;
negatively charging surfaces of the flat-plate particles while flying in the plasma;
depositing one of the negatively-charged flat-plate particles with a surface facing the substrate;
depositing another negatively-charged flat-plate particle in a region apart from the one negatively-charged flat-plate particle over the substrate while repelling the one negatively-charged flat-plate particle;
inserting the atom and the aggregate of the atoms between a gap between the one negatively-charged flat-plate particle and the another negatively-charged flat-plate particle; and
growing the atom and the aggregate of the atoms in a lateral direction between the flat-plate particles, so that the gap between the one negatively-charged flat-plate particle and the another negatively-charged flat-plate particle is filled with the atom and the aggregate of the atoms.

16. The method for forming an oxide according to claim 15, wherein the grow of the atoms and the aggregate of the atoms having the same composition with the flat-plate particle in the lateral direction starts from the flat-plate particle, so that the gap between the flat-plate particles is filled.

17. The method for forming an oxide according to claim 15, wherein the flat-plate particles are stacked to form a thin film structure.

18. The method for forming an oxide according to claim 15, wherein after formation of the oxide, thermal annealing or rapid thermal annealing is performed at a temperature that is higher than a temperature at which the oxide is formed and that is lower than a temperature at which the oxide is turned into a different material, so that the oxide is made to have a high density or to be a single crystal.

19. The method for forming an oxide according to claim 18, wherein the temperature of thermal annealing or rapid thermal annealing is higher than 300° C. and lower than 1500° C.

20. The method for forming an oxide according to claim 15, wherein the oxide is formed on a surface having an amorphous structure.

21. The method for forming an oxide according to claim 15,
wherein the target includes indium, zinc, an element M, and an oxygen,
wherein the element M is one of aluminum, gallium, yttrium, and tin, and
wherein the target includes a region having a polycrystalline structure.

* * * * *